(12) United States Patent
Isobe et al.

(10) Patent No.: US 7,737,506 B2
(45) Date of Patent: Jun. 15, 2010

(54) SEMICONDUCTOR DEVICE AND METHOD OF MANUFACTURING THE SAME

(75) Inventors: Atsuo Isobe, Atsugi (JP); Shunpei Yamazaki, Setagaya (JP); Chiho Kokubo, Tochigi (JP); Koichiro Tanaka, Atsugi (JP); Akihisa Shimomura, Atsugi (JP); Tatsuya Arao, Kanagawa (JP); Hidekazu Miyairi, Atsugi (JP); Mai Akiba, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/513,054

(22) Filed: Aug. 31, 2006

(65) Prior Publication Data

US 2007/0015323 A1   Jan. 18, 2007

Related U.S. Application Data

(62) Division of application No. 10/352,240, filed on Jan. 28, 2003, now Pat. No. 7,105,392.

(30) Foreign Application Priority Data

Jan. 28, 2002   (JP)   ............................. 2002-019286
Feb. 4, 2002   (JP)   ............................. 2002-027381

(51) Int. Cl.
  *H01L 29/76* (2006.01)
  *H01L 29/778* (2006.01)
  *H01L 27/01* (2006.01)

(52) U.S. Cl. ....................... 257/391; 257/347; 257/353; 257/390; 257/392; 257/E21.415; 257/E21.442; 257/E21.444; 257/E21.648; 438/150; 438/151; 438/157

(58) Field of Classification Search ................. 257/347, 257/353, 390, 391, 392; 438/150, 151, 157
See application file for complete search history.

(56) References Cited

U.S. PATENT DOCUMENTS 4,330,363 A   5/1982   Biegesen et al.

(Continued)

FOREIGN PATENT DOCUMENTS

EP   1 049 144   11/2000

(Continued)

OTHER PUBLICATIONS

Smith et al., *Oriented Crystal Growth on Amorphous Substrates Using Artificial Surface-Relief Gratings*, Applied Physics Letters, vol. 32, No. 6, pp. 349-350, Mar. 15, 1978.

(Continued)

*Primary Examiner*—Dao H Nguyen
(74) *Attorney, Agent, or Firm*—Eric J. Robinson; Robinson Law Office, P.C.

(57) ABSTRACT

An objective is to provide a method of manufacturing a semiconductor device, and a semiconductor device manufactured by using the manufacturing method, in which a laser crystallization method is used that is capable of preventing the formation of grain boundaries in TFT channel formation regions, and is capable of preventing conspicuous drops in TFT mobility, reduction in the ON current, and increases in the OFF current, all due to grain boundaries. Depressions and projections with stripe shape or rectangular shape are formed. Continuous wave laser light is then irradiated to a semiconductor film formed on an insulating film along the depressions and projections with stripe shape of the insulating film, or along a longitudinal axis direction or a transverse axis direction of the rectangular shape. Note that although it is most preferable to use continuous wave laser light at this point, pulse wave laser light may also be used.

15 Claims, 46 Drawing Sheets

U.S. PATENT DOCUMENTS

| | | | |
|---|---|---|---|
| 4,385,937 A | 5/1983 | Ohmura | |
| 4,565,584 A | 1/1986 | Tamura et al. | |
| 4,597,060 A * | 6/1986 | Mitchell et al. | 365/185.16 |
| 4,933,298 A | 6/1990 | Hasegawa | |
| 5,011,787 A * | 4/1991 | Jeuch | 438/257 |
| 5,338,959 A | 8/1994 | Kim et al. | |
| 5,397,908 A * | 3/1995 | Dennison et al. | 257/306 |
| 5,432,122 A | 7/1995 | Chae | |
| 5,568,288 A | 10/1996 | Yamazaki et al. | |
| 5,643,826 A | 7/1997 | Ohtani et al. | |
| 5,696,003 A | 12/1997 | Makita et al. | |
| 5,759,879 A | 6/1998 | Iwasaki | |
| 5,770,486 A | 6/1998 | Zhang et al. | |
| 5,808,321 A | 9/1998 | Mitanaga et al. | |
| 5,821,562 A | 10/1998 | Makita et al. | |
| 5,851,862 A | 12/1998 | Ohtani et al. | |
| 5,854,803 A | 12/1998 | Yamazaki et al. | |
| 5,893,990 A | 4/1999 | Tanaka | |
| 5,894,137 A | 4/1999 | Yamazaki et al. | |
| 5,894,151 A | 4/1999 | Yamazaki et al. | |
| 5,937,282 A | 8/1999 | Nakajima et al. | |
| 5,942,768 A * | 8/1999 | Zhang | 257/72 |
| 5,986,306 A | 11/1999 | Nakajima et al. | |
| 5,990,527 A * | 11/1999 | Wen | 257/391 |
| 6,029,680 A | 2/2000 | Hawthorne et al. | |
| 6,127,702 A * | 10/2000 | Yamazaki et al. | 257/347 |
| 6,133,583 A | 10/2000 | Ohtani et al. | |
| 6,160,269 A | 12/2000 | Takemura et al. | |
| 6,171,890 B1 | 1/2001 | Adachi et al. | |
| 6,365,933 B1 | 4/2002 | Yamazaki et al. | |
| 6,373,082 B1 * | 4/2002 | Ohno et al. | 257/287 |
| 6,410,368 B1 | 6/2002 | Kawasaki et al. | |
| 6,413,802 B1 | 7/2002 | Hu et al. | |
| 6,479,331 B1 | 11/2002 | Takemura | |
| 6,558,989 B1 | 5/2003 | Moon | |
| 6,599,783 B2 | 7/2003 | Takatoku | |
| 6,599,790 B1 | 7/2003 | Yamazaki et al. | |
| 6,600,197 B1 | 7/2003 | Nakajima et al. | |
| 6,617,226 B1 * | 9/2003 | Suguro et al. | 438/481 |
| 6,636,280 B1 | 10/2003 | Miyazawa et al. | |
| 6,677,191 B1 | 1/2004 | Battersby | |
| 6,700,133 B1 | 3/2004 | Ohtani et al. | |
| 6,746,901 B2 | 6/2004 | Kasahara et al. | |
| 6,780,687 B2 | 8/2004 | Nakajima et al. | |
| 6,841,797 B2 | 1/2005 | Isobe et al. | |
| 6,906,383 B1 | 6/2005 | Zhang et al. | |
| 6,933,527 B2 | 8/2005 | Isobe et al. | |
| 7,064,016 B2 | 6/2006 | Kasahara et al. | |
| 7,109,069 B2 | 9/2006 | Kokubo et al. | |
| 7,115,903 B2 | 10/2006 | Isobe et al. | |
| 7,129,522 B2 | 10/2006 | Nakajima et al. | |
| 7,297,585 B2 * | 11/2007 | Maeda et al. | 438/199 |
| 7,339,235 B1 | 3/2008 | Yamazaki et al. | |
| 2001/0000243 A1 | 4/2001 | Sugano et al. | |
| 2001/0002719 A1 * | 6/2001 | Shimizu et al. | 257/392 |
| 2001/0035526 A1 | 11/2001 | Yamazaki et al. | |
| 2001/0036755 A1 | 11/2001 | Tanaka | |
| 2001/0055830 A1 | 12/2001 | Yoshimoto | |
| 2002/0036290 A1 * | 3/2002 | Inaba et al. | 257/66 |
| 2002/0048864 A1 | 4/2002 | Yamazaki et al. | |
| 2002/0098628 A1 | 7/2002 | Hamada et al. | |
| 2002/0134981 A1 | 9/2002 | Nakamura et al. | |
| 2002/0192956 A1 | 12/2002 | Kizilyalli et al. | |
| 2003/0141505 A1 | 7/2003 | Isobe et al. | |
| 2003/0186490 A1 | 10/2003 | Kato et al. | |
| 2003/0218171 A1 | 11/2003 | Isobe et al. | |
| 2003/0230749 A1 | 12/2003 | Isobe et al. | |
| 2003/0234395 A1 | 12/2003 | Kokubo et al. | |
| 2004/0132236 A1 | 7/2004 | Doris et al. | |
| 2006/0246634 A1 | 11/2006 | Kasahara et al. | |
| 2007/0051957 A1 | 3/2007 | Nakajima et al. | |
| 2007/0085080 A1 | 4/2007 | Isobe et al. | |

FOREIGN PATENT DOCUMENTS

| | | |
|---|---|---|
| JP | 57-023217 | 2/1982 |
| JP | 58-015226 | 1/1983 |
| JP | 58-086717 | 5/1983 |
| JP | 58-151042 | 9/1983 |
| JP | 62-104117 | 5/1987 |
| JP | 02-143417 | 6/1990 |
| JP | 03-288475 | 12/1991 |
| JP | 04-180030 | 6/1992 |
| JP | 06-244208 | 9/1994 |
| JP | 07-130652 | 5/1995 |
| JP | 07-249779 | 9/1995 |
| JP | 08-078329 | 3/1996 |
| JP | 08-097431 | 4/1996 |
| JP | 08-195357 | 7/1996 |
| JP | 08-288515 | 11/1996 |
| JP | 10-064842 | 3/1998 |
| JP | 10-135468 | 5/1998 |
| JP | 10-135469 | 5/1998 |
| JP | 11-121753 | 4/1999 |
| JP | 11-177102 | 7/1999 |
| JP | 2000-068520 | 3/2000 |
| JP | 2000-183351 | 6/2000 |
| JP | 2001-011085 | 1/2001 |
| JP | 2001-091941 | 4/2001 |
| JP | 2001-144027 | 5/2001 |
| JP | 2001-144302 | 5/2001 |
| JP | 2001-274433 | 10/2001 |
| JP | 2001-284601 | 10/2001 |
| JP | 2001-324723 | 11/2001 |
| JP | 2002-009289 | 1/2002 |
| JP | 2002-014337 | 1/2002 |
| JP | 2002-033330 | 1/2002 |
| JP | 2002-313811 | 10/2002 |
| JP | 2002-324808 | 11/2002 |

OTHER PUBLICATIONS

Biegelsen et al., *Laser-Induced Crystallization of Silicon Islands on Amorphous Substrates: Multilayer Structures*, Applied Physics Letters, vol. 38, No. 3, pp. 150-152, Feb. 1, 1981.

Lam et al., *Characteristics of MOSFETS Fabricated in Laser-Recrystallized Polysilicon Islands with a Retaining Wall Structure on an Insulating Substrate*, IEEE Electron Device Letters, vol. EDL-1, No. 10, pp. 206-208, Oct. 1980.

Geis et al., "Grapho-epitaxy of Silicon on Fused Silica Using Surface Micropatterns and Laser Crystallization," J. Vac. Sci. Tech., 16(6), Nov./Dec. 1979, pp. 1640-1643.

Geis et al., Crystalline Silicon on Insulators by Graphoepitaxy, IEEE 1979, pp. 210-212.

Official Action dated Dec. 20, 2004 for U.S. Appl. No. 10/352,233, filed Jan. 28, 2003.

Official Action of Jun. 6, 2005 for U.S. Appl. No. 10/352,233 to Isobe.

Wolf.S, Silicon Processing for the VLSI Era vol. 2: Process Integration, 1990, vol. 2, pp. 194-199, Lattice Press.

Office Action (Application Serial No. 200710142234.X) dated Aug. 14, 2009.

Office Action (Application No. JP 2003-019447) dated Dec. 15, 2009.

* cited by examiner

Fig. 5A  $d < t_{02}$, $W_1, W_2 \leq 1 \mu m$
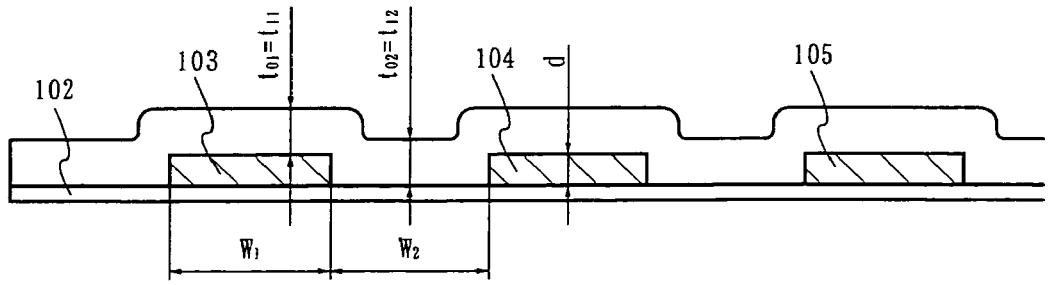
Fig. 5B  $d \geq t_{02}$, $W_1, W_2 \leq 1 \mu m$
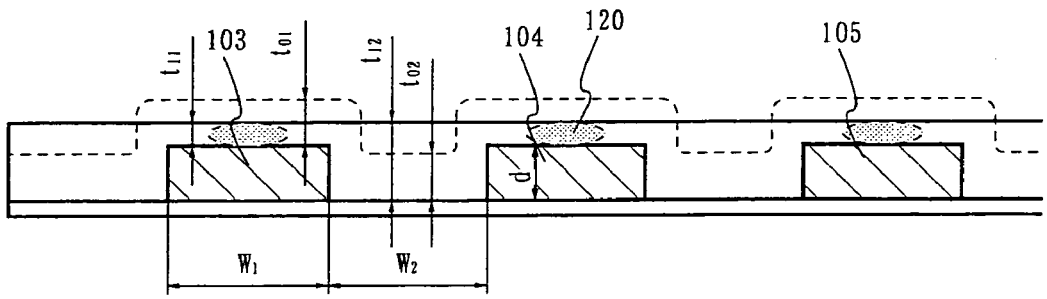
Fig. 5C  $d \gg t_{02}$, $W_1, W_2 > 1 \mu m$
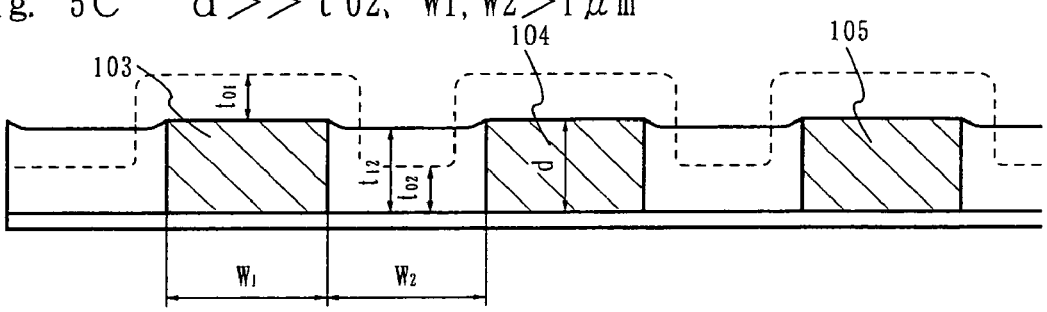
Fig. 5D  $d \geq t_{02}$, $W_1, W_2 > 1 \mu m$
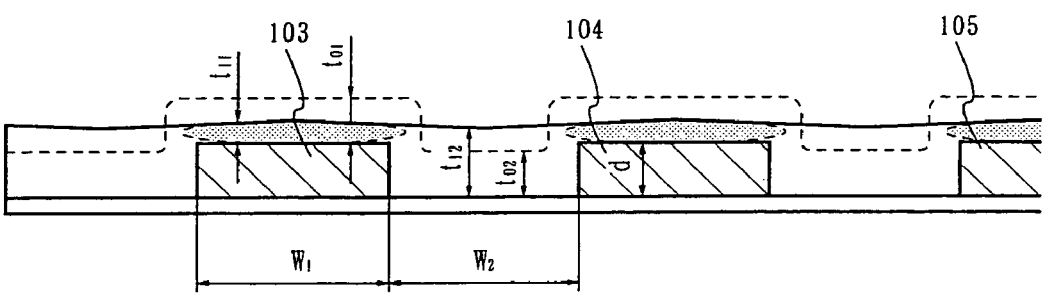
Fig. 5E  $d \geq t_{02}$, $W_1, W_2 \gg 1 \mu m$
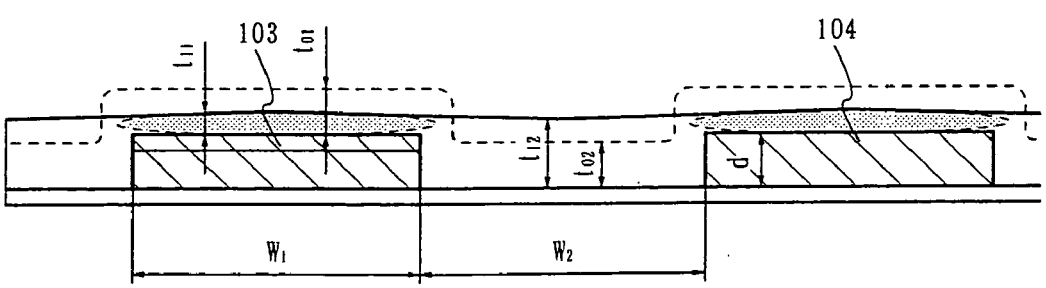

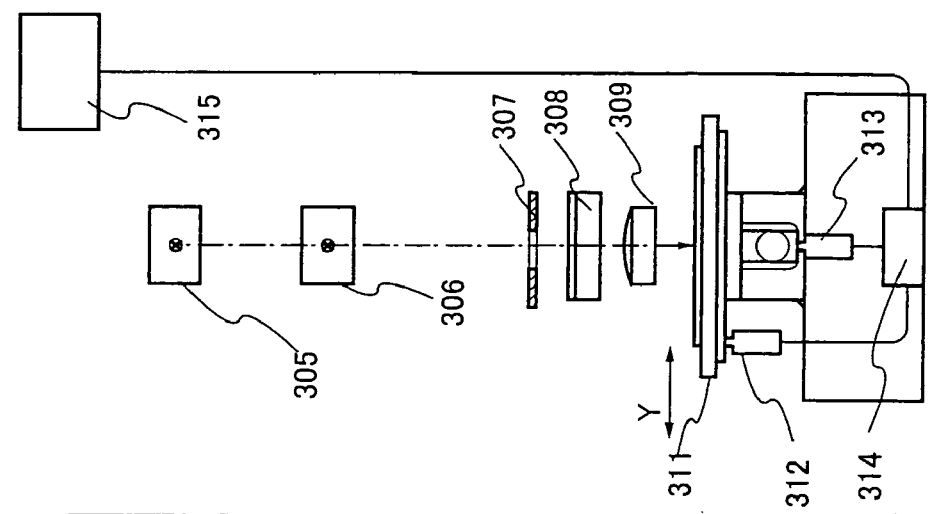
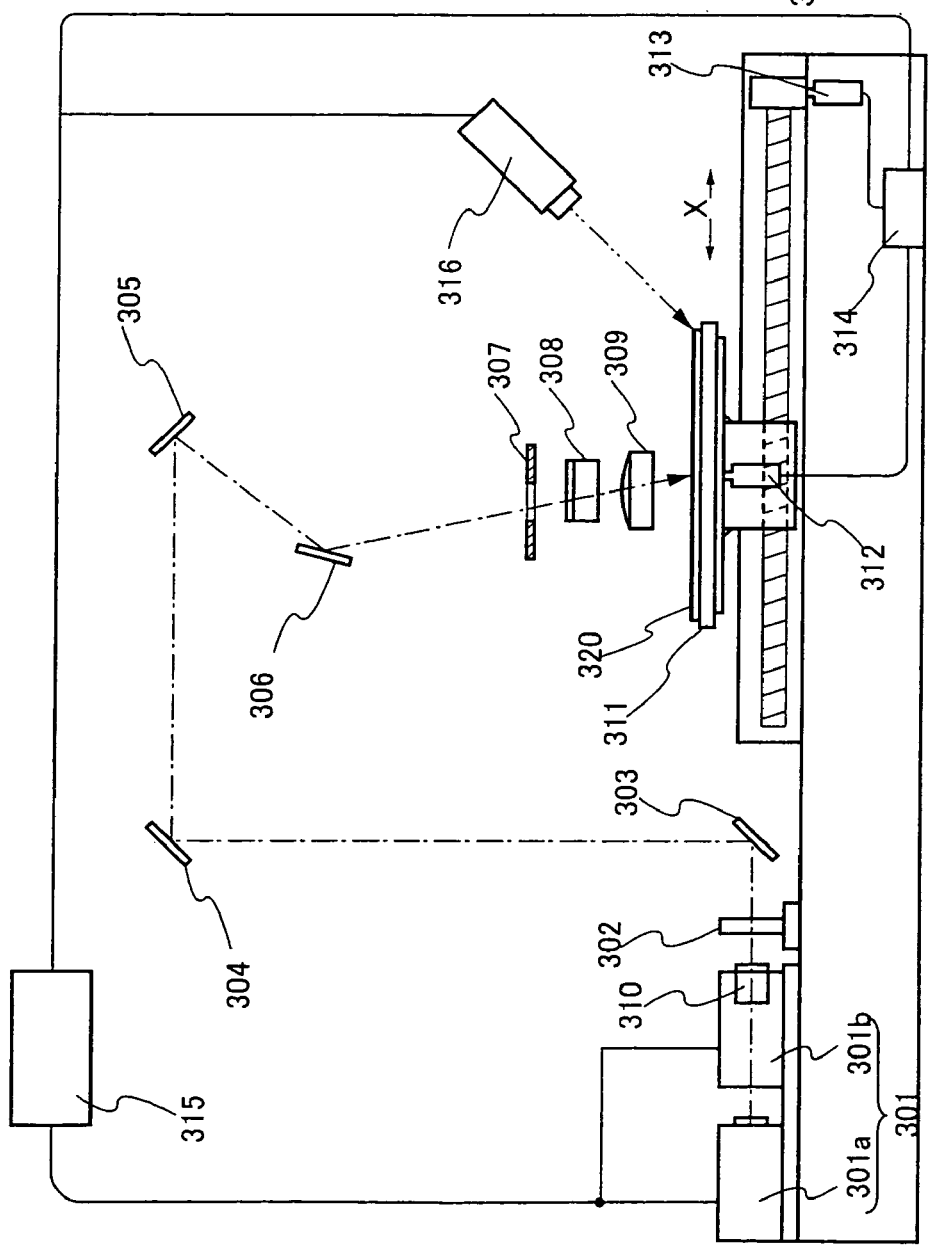
Fig. 6B
Fig. 6A

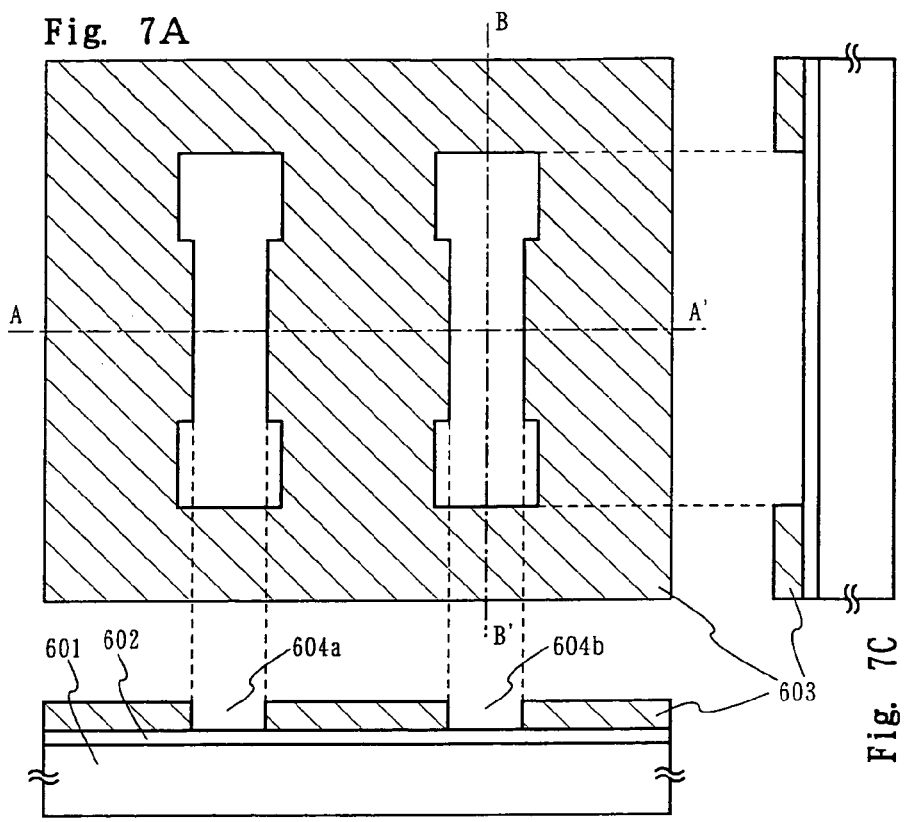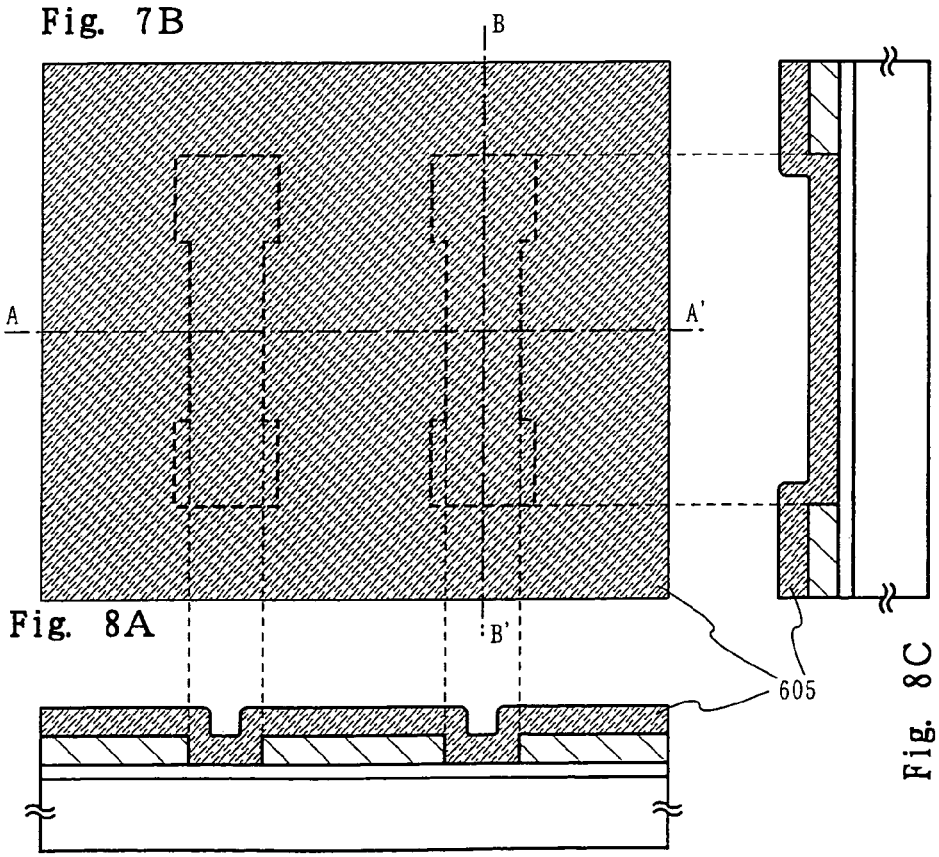

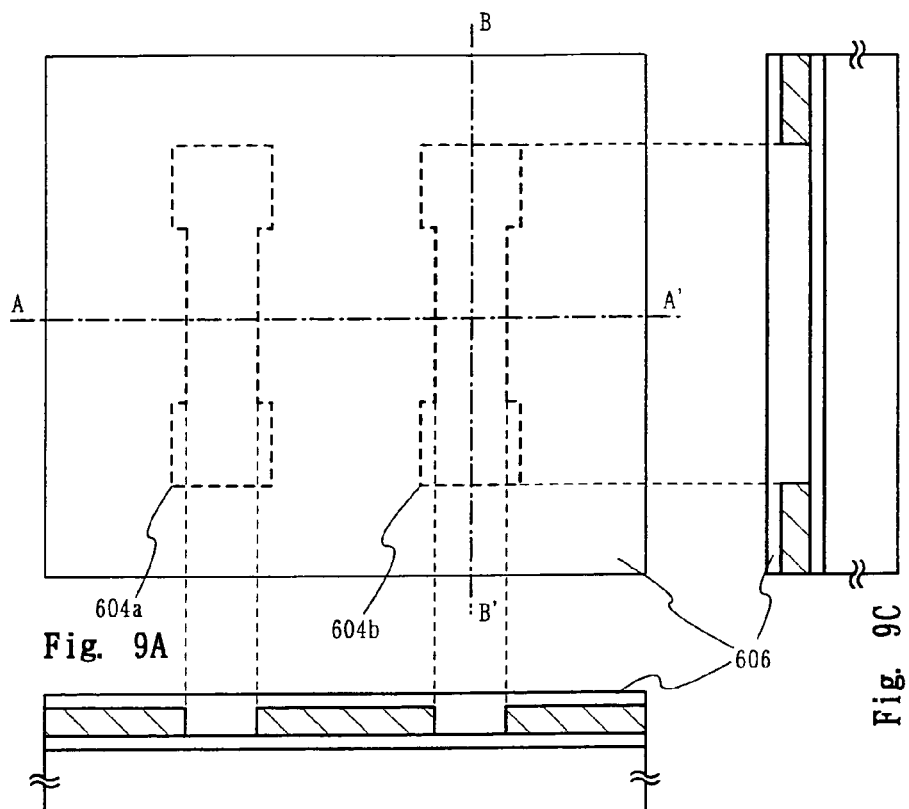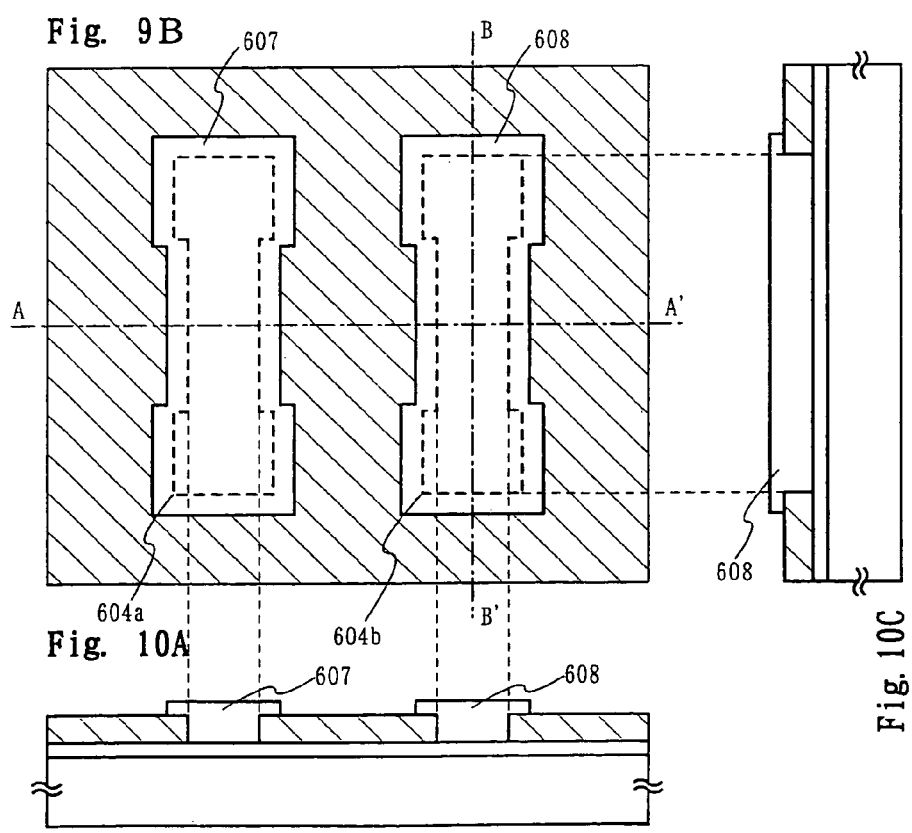

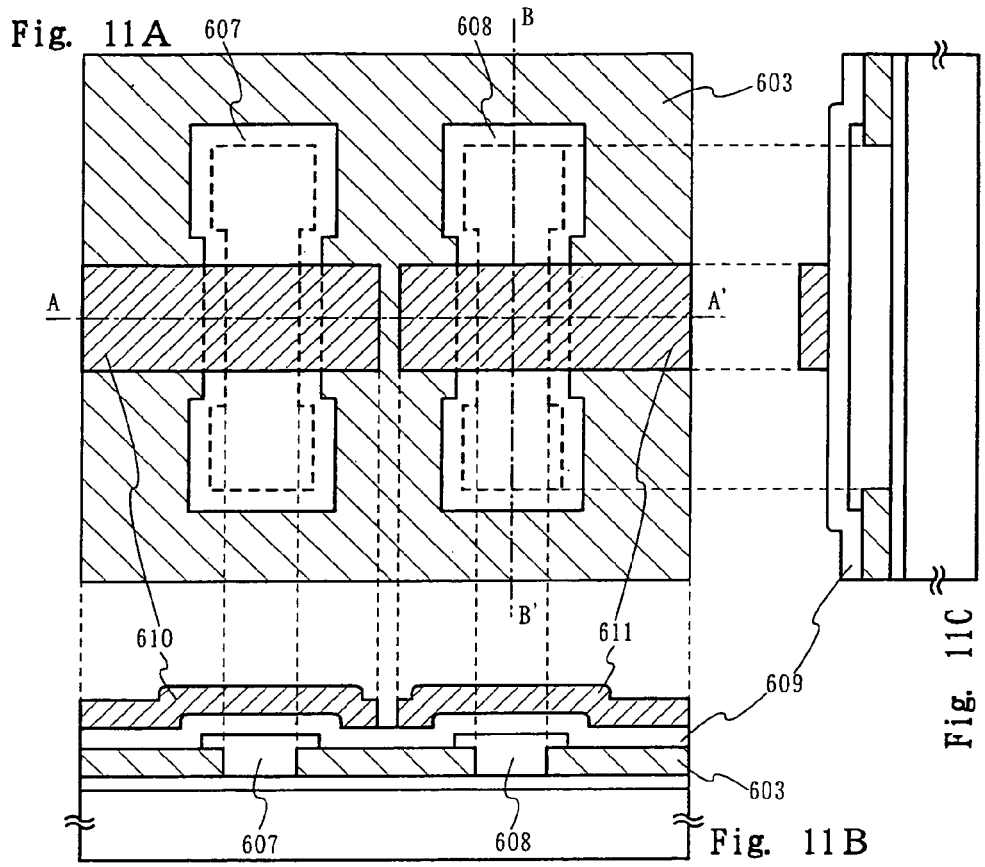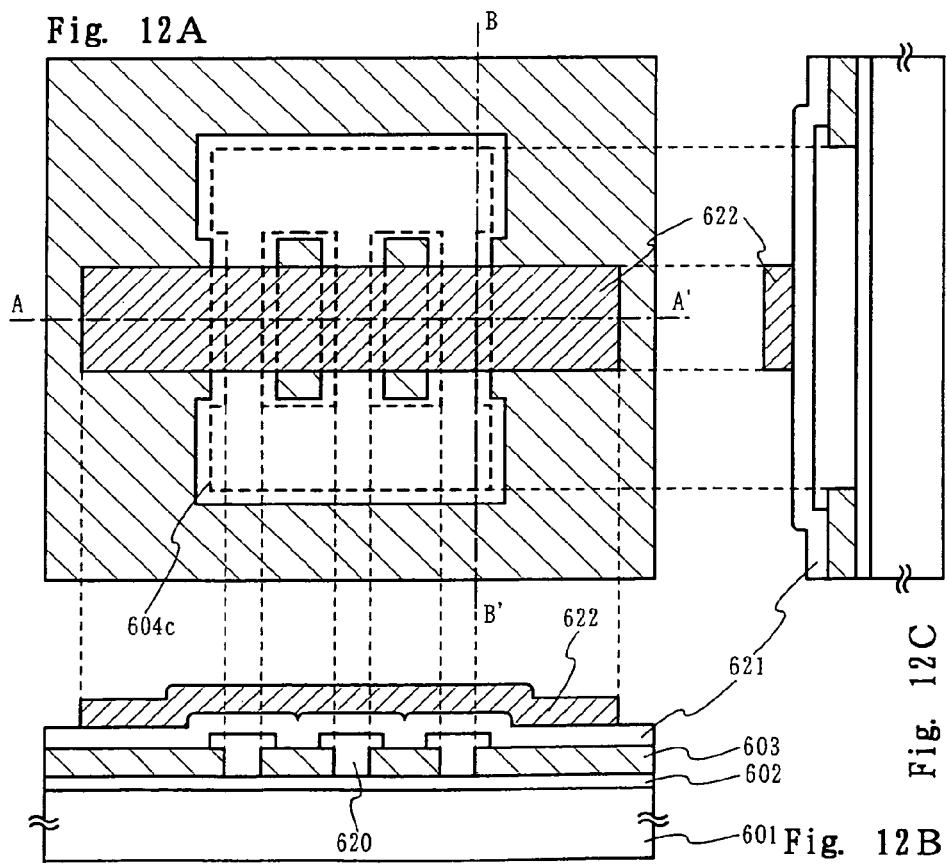

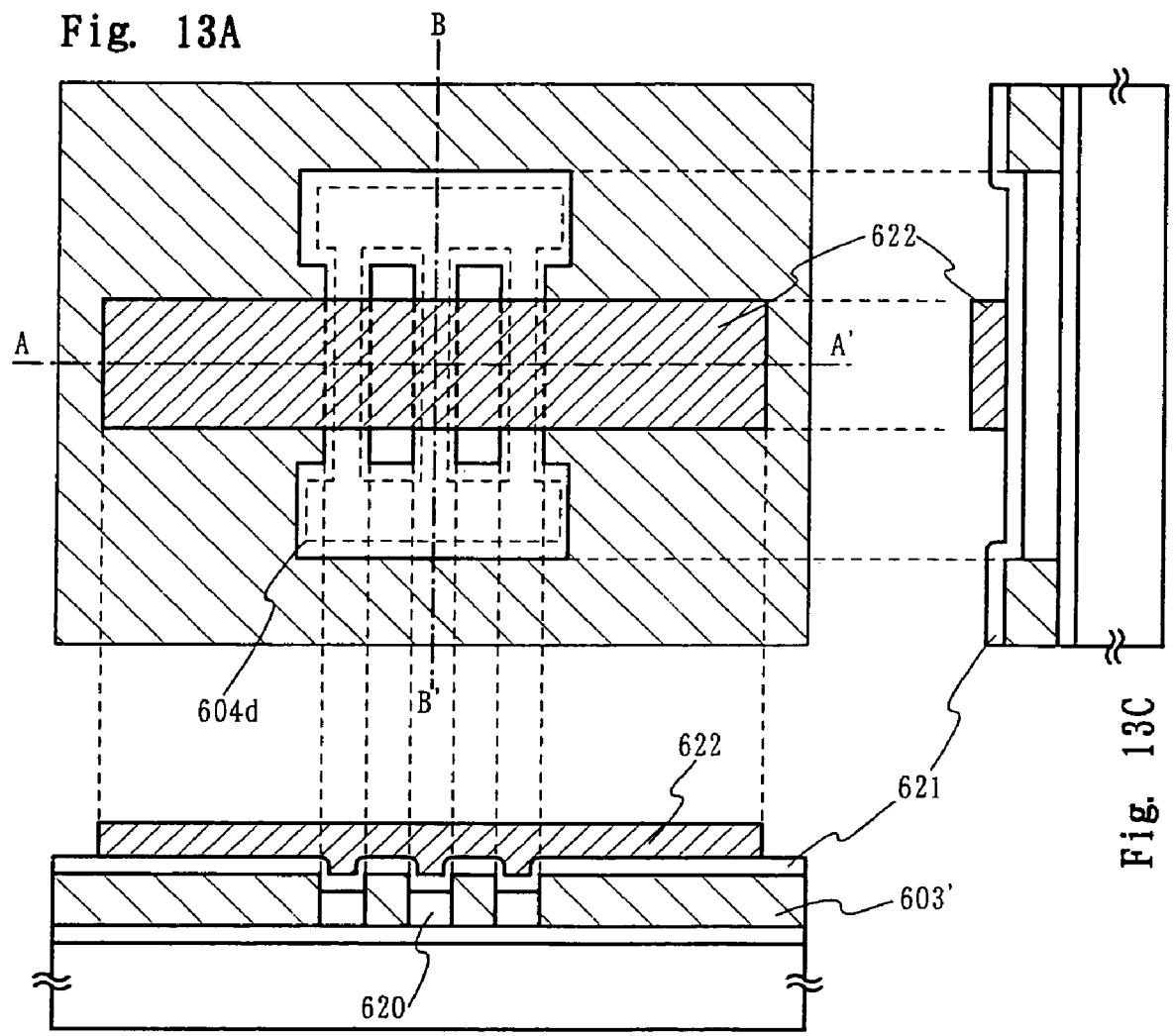

Fig. 14A
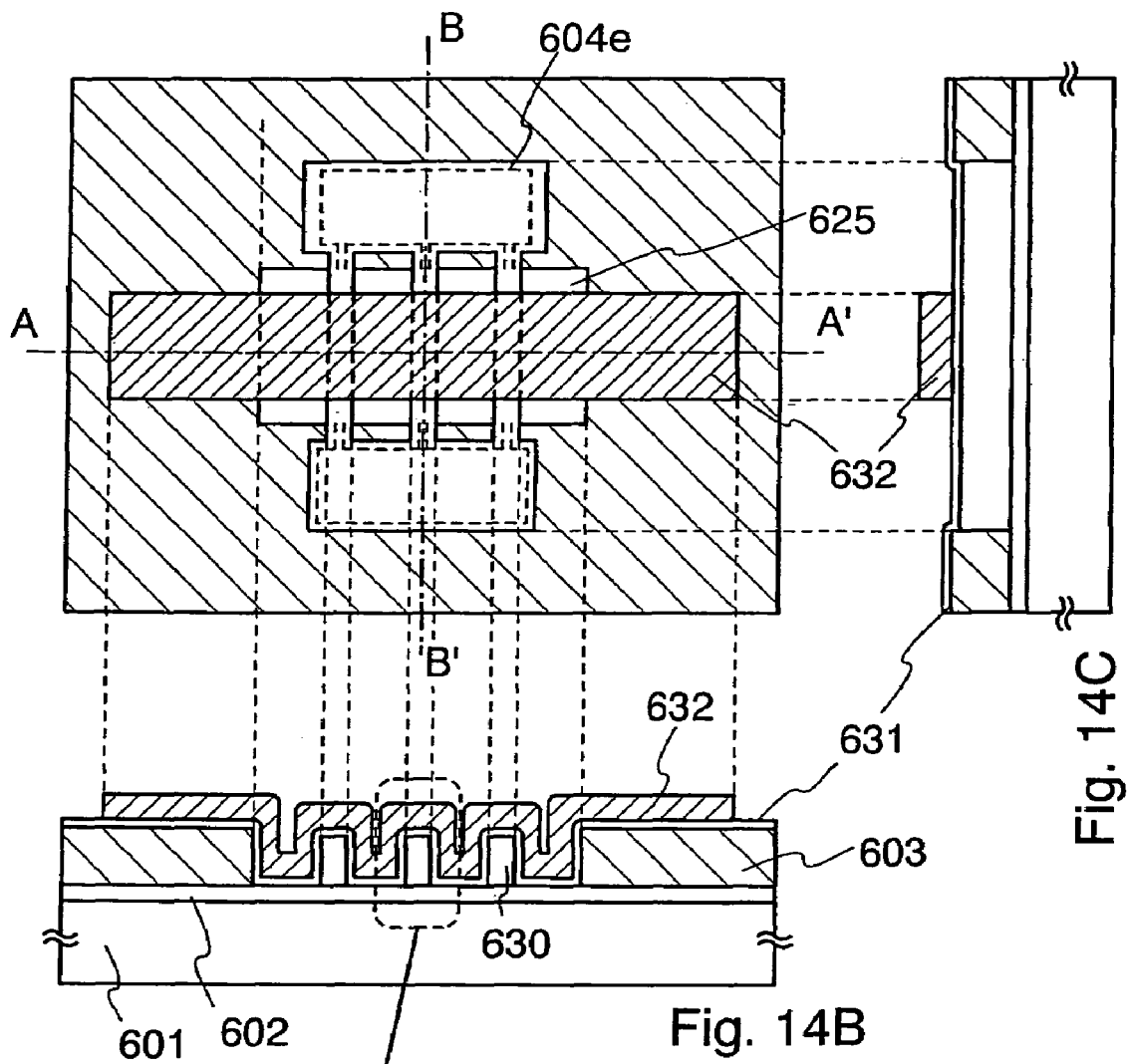
Fig. 14B
Fig. 14C
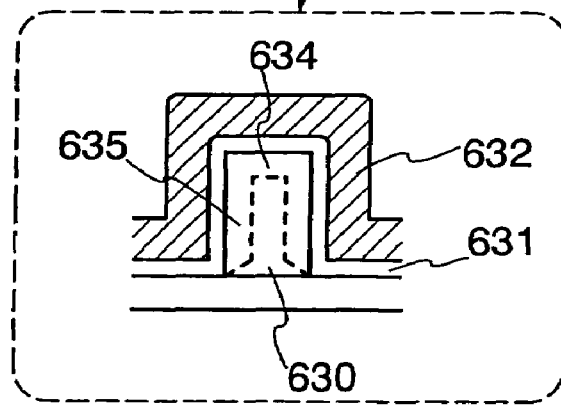
Fig. 14D

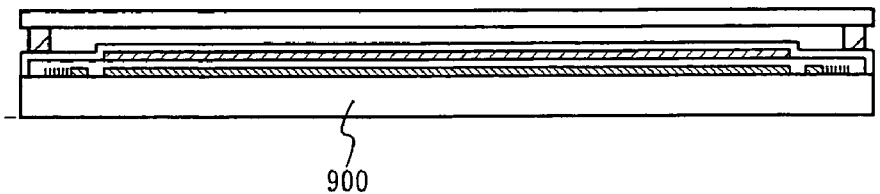
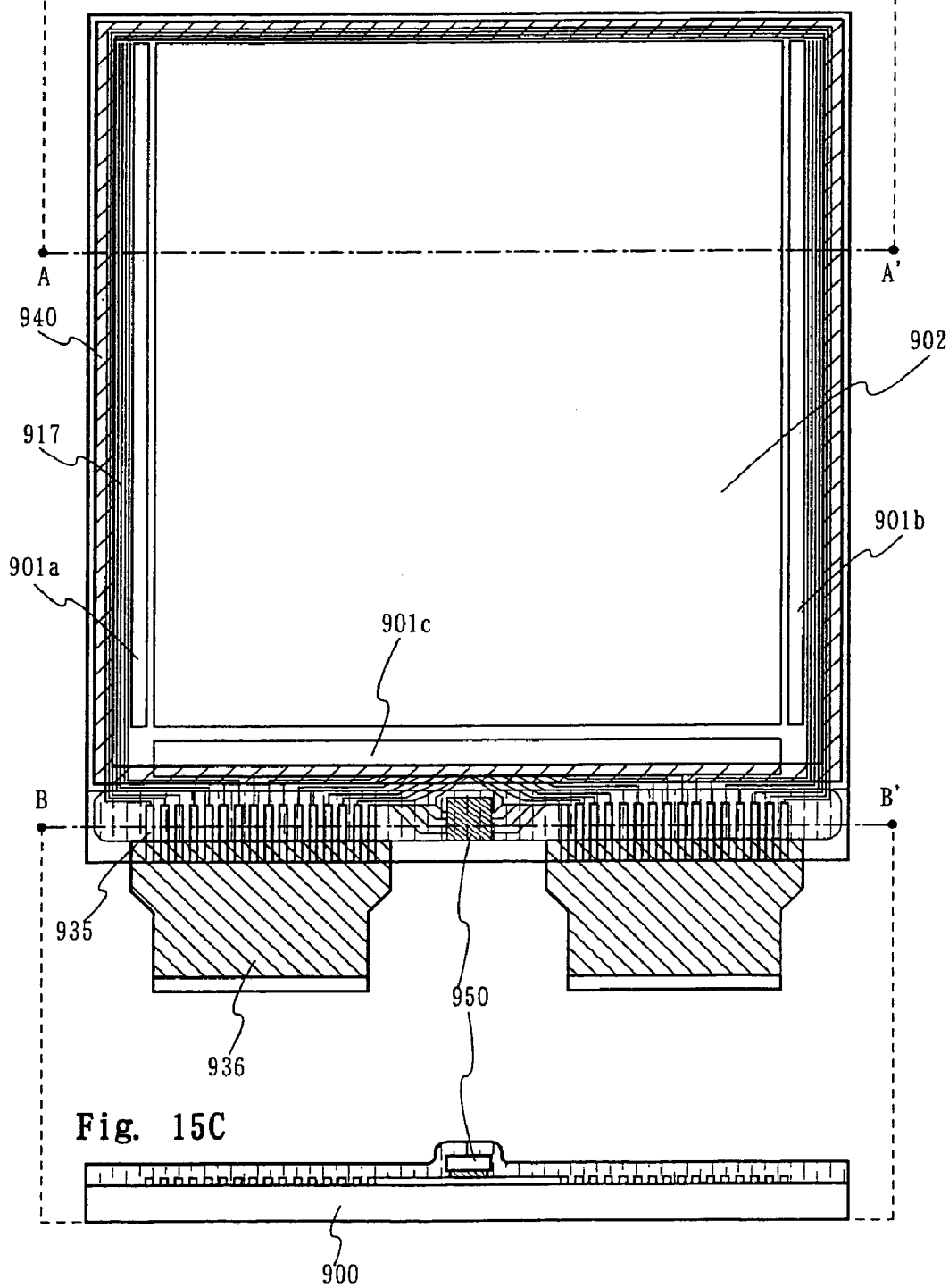

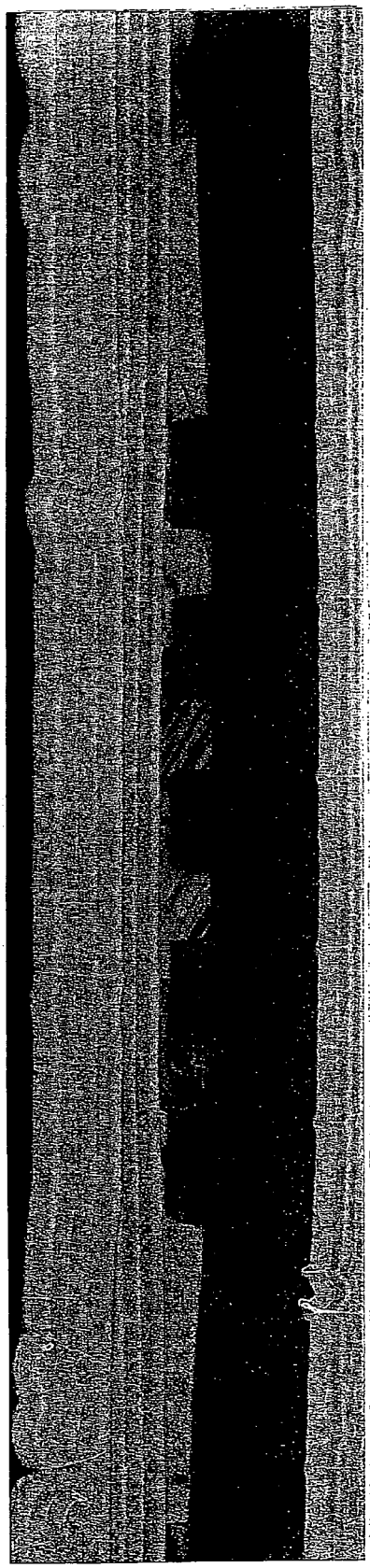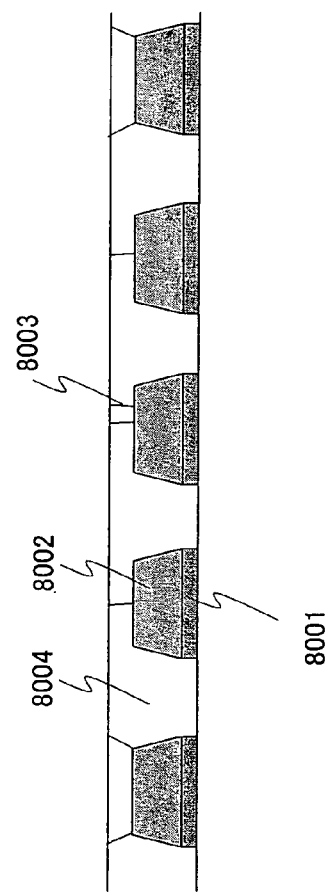
1 μm
Fig. 19A
Fig. 19B

Fig. 20A forming a non-single crystal semiconductor film
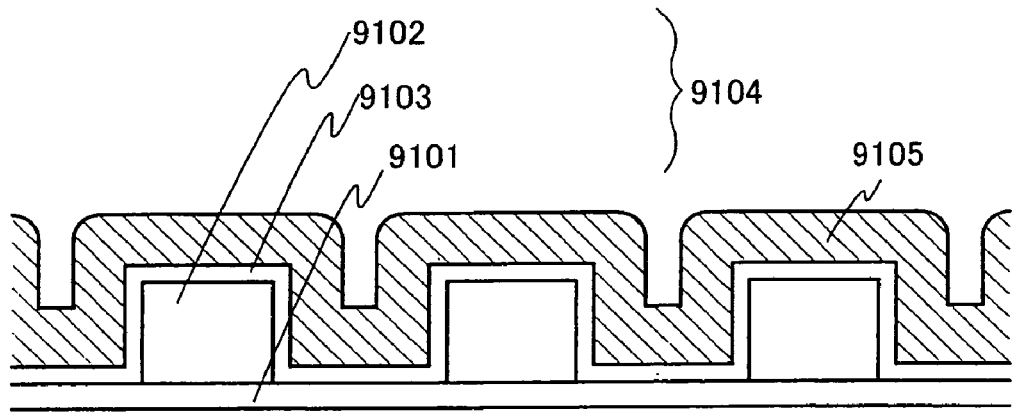
Fig. 20B irradiating laser light
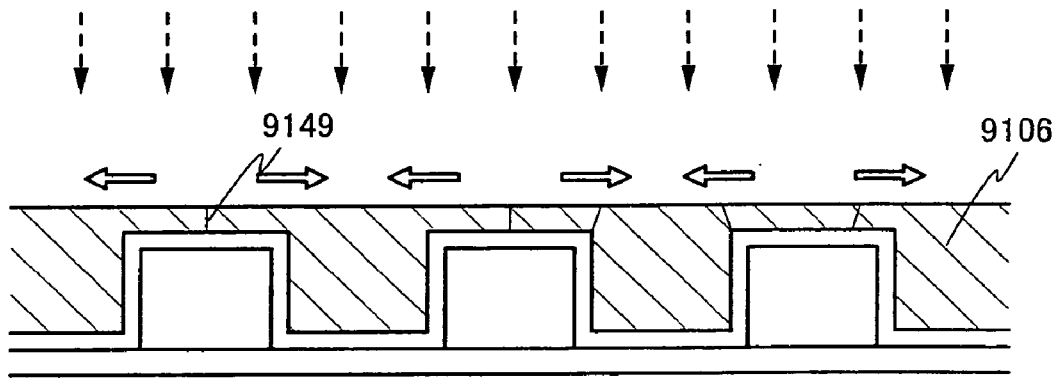
Fig. 20C etching
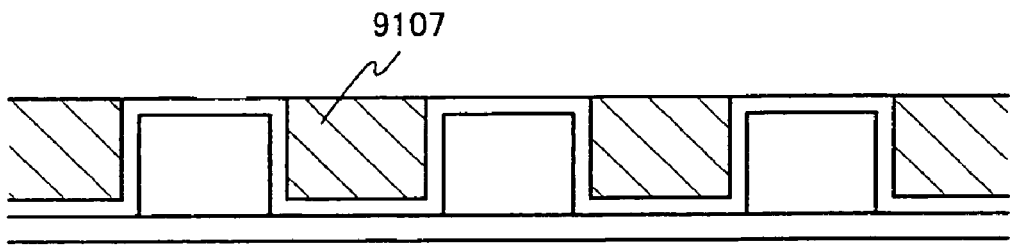

9124
9127

9127

Fig. 28A  forming a non-single crystal semiconductor film
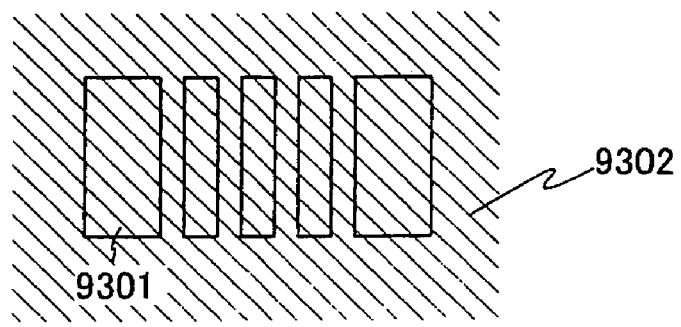
Fig. 28B  irradiating laser light
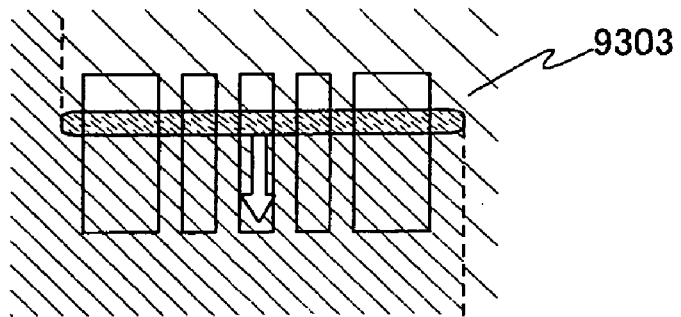
Fig. 28C  etching
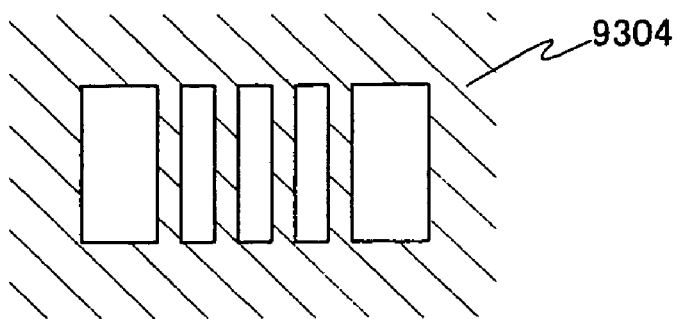
Fig. 28D  forming islands
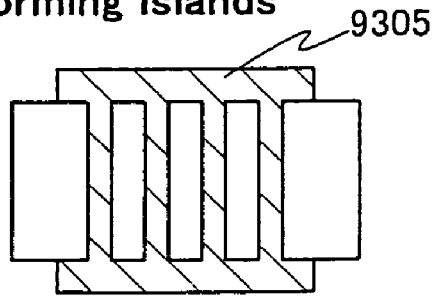

Fig. 29A  forming a non-single crystal semiconductor film
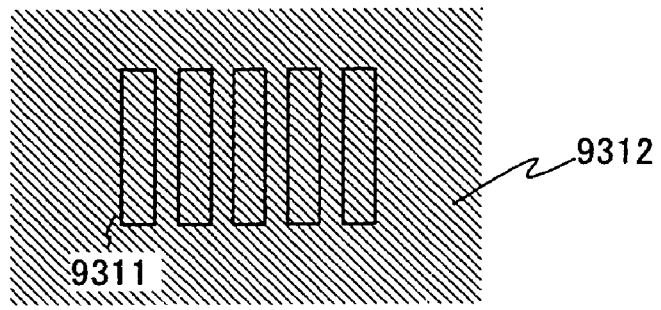
Fig. 29B  forming a sub-island
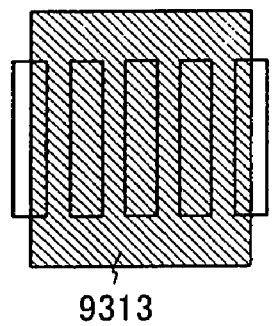
Fig. 29C  irradiating laser light
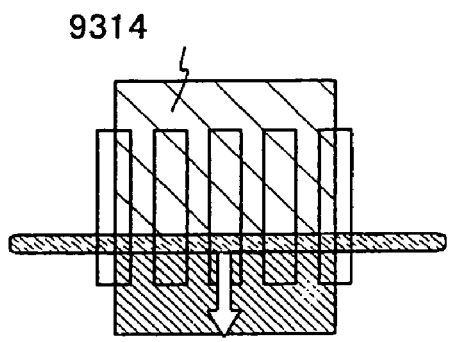
Fig. 29D  etching
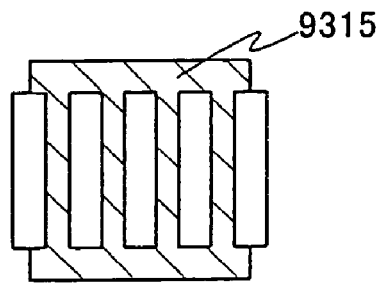

Fig. 31A  forming a non-single crystal semiconductor film
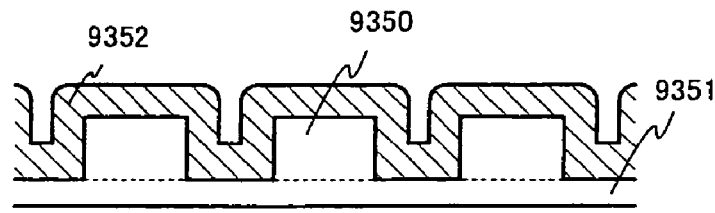
Fig. 31B  NiSPC
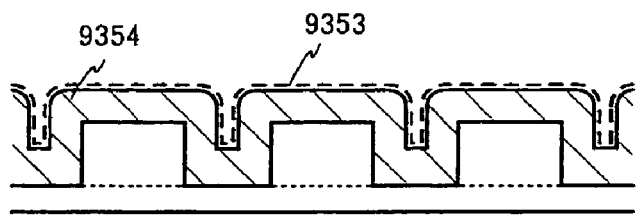
Fig. 31C  irradiating laser light
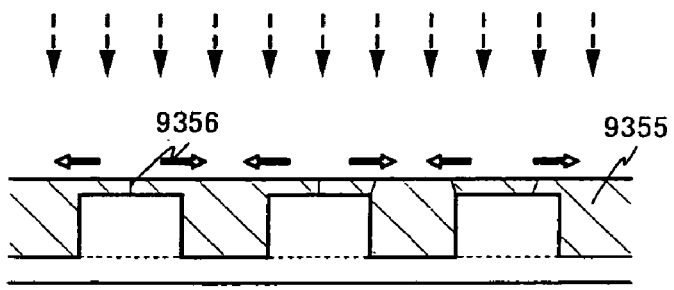
Fig. 31D  gettering
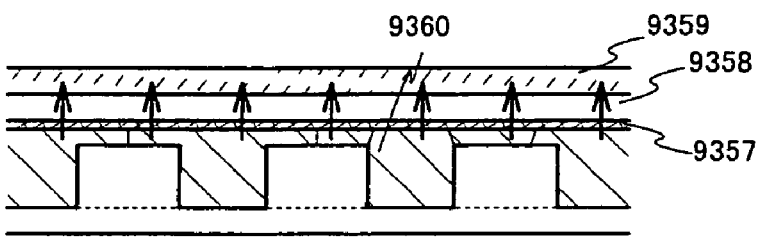
Fig. 31E  etching
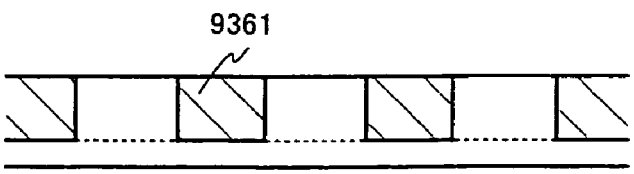

center O

Fig. 36D  energy density distribution between A—A'

Fig. 37A B—B'
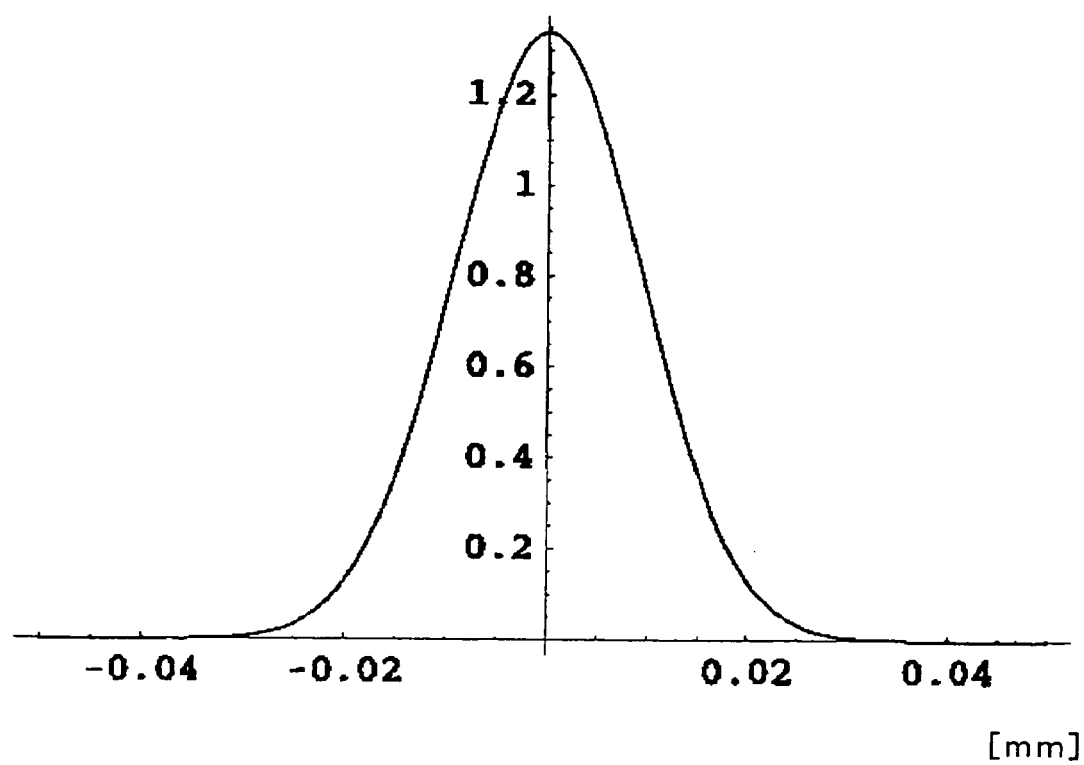
Fig. 37B C—C'
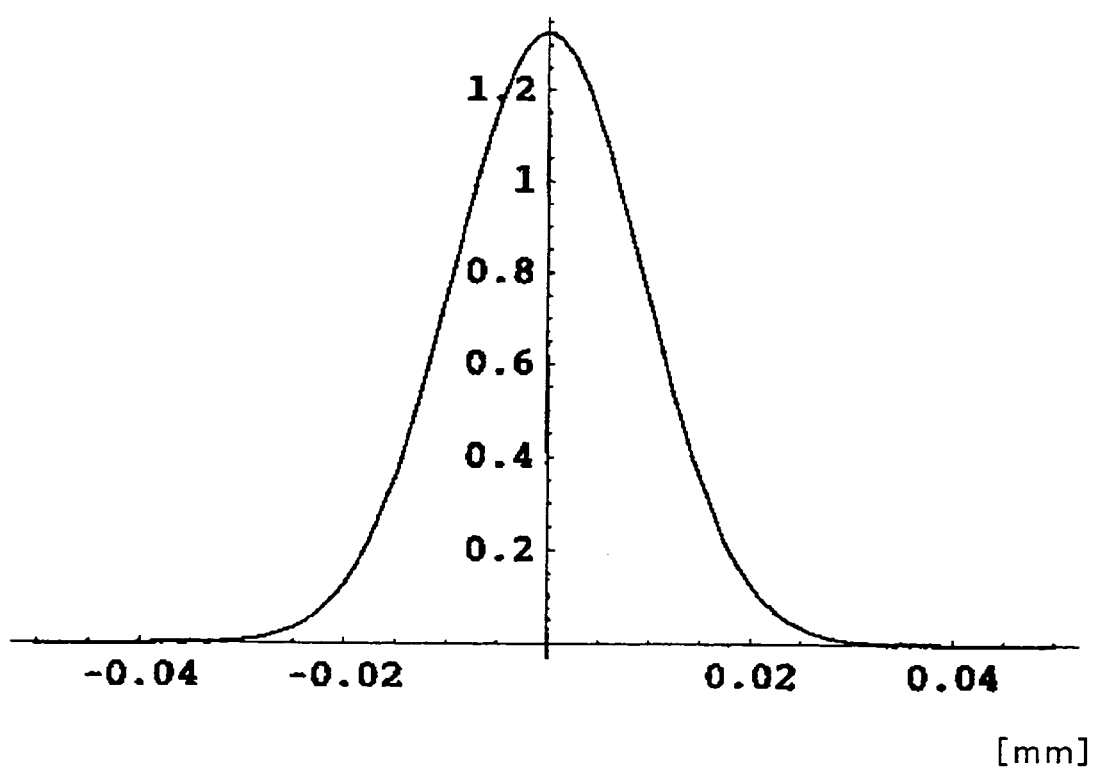

scanning direction

Fig. 51A
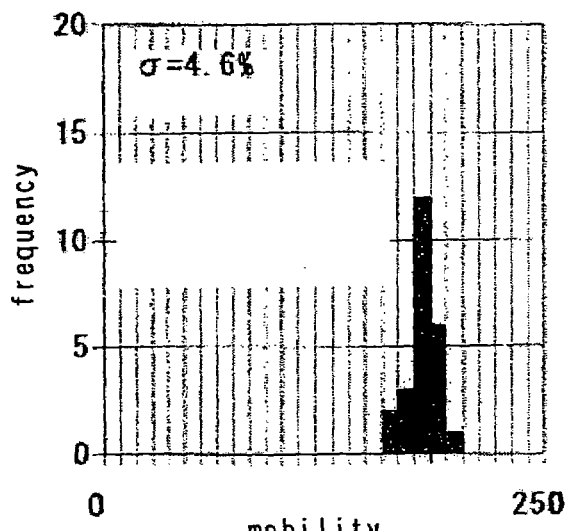
Fig. 51B
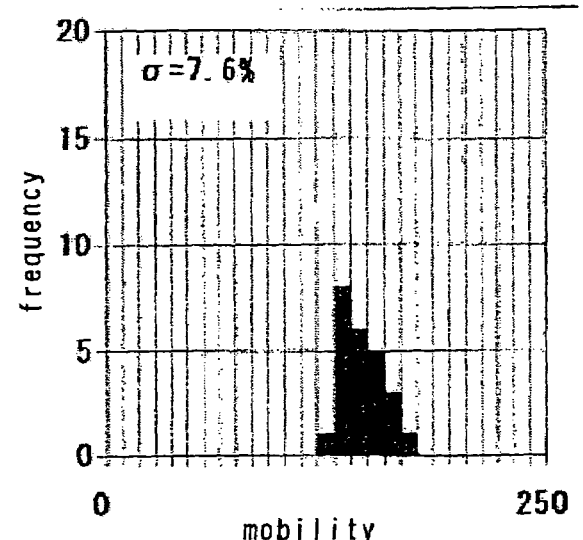
Fig. 51C

SEMICONDUCTOR DEVICE AND METHOD OF MANUFACTURING THE SAME

BACKGROUND OF THE INVENTION

1. Field of the Invention

The present invention relates to a semiconductor device formed by using a semiconductor film having a crystalline structure, and to a method of manufacturing the semiconductor device. The present invention also relates to a semiconductor device containing a field effect transistor, in particular, a thin film transistor, in which an island-like semiconductor region containing a channel formation region is formed by a crystalline semiconductor film formed on an insulating surface, and to a method of manufacturing the semiconductor device.

2. Description of the Related Art

In recent years, a technique of forming a TFT on a substrate has greatly progressed, and its application and development for active matrix semiconductor display devices have been advanced. In particular, since a TFT using a polycrystalline semiconductor film has higher field-effect mobility (also referred to as mobility) than a TFT using a conventional amorphous semiconductor film, it enables high-speed operation. It is therefore possible to control the pixel by the driver circuit formed on the same substrate where the pixel is formed, though the pixel is conventionally controlled by a driver circuit provided outside the substrate.

Incidentally, for substrates used in semiconductor devices, a glass substrate is regarded as promising in comparison with a single crystal silicon substrate in terms of the cost. Also, a technique of forming an amorphous silicon film on an insulating substrate made of glass or the like and using laser processing for crystallization is known. A glass substrate is inferior in heat resistance and is easily subjected to thermal deformation. Therefore, in the case where a polysilicon TFT is formed on the glass substrate, in order to avoid thermal deformation of the glass substrate, the use of laser annealing for crystallization of the semiconductor film is extremely effective. The thin film transistor (hereinafter referred to as TFT) formed with the crystallized silicon film is applied to, for example, a liquid crystal display device.

Laser annealing has characteristics such as remarkable reduction of processing time compared to an annealing method utilizing radiant heating or thermal conductive heating. In addition, a semiconductor or a semiconductor film is selectively and locally heated so that a substrate is scarcely thermally damaged.

Note that the term "laser annealing method" herein indicates a technique for re-crystallizing a damaged layer formed in a semiconductor substrate or in a semiconductor film, a technique for crystallizing a semiconductor film formed on a substrate, and a method of improving the crystallinity of a semiconductor film with a crystal structure (crystalline semiconductor film), for example. This also includes a technique that is applied to planarizing or improvement of a surface quality of the semiconductor substrate or the semiconductor film. Applicable laser oscillation apparatuses are: gas laser oscillation apparatuses represented by an excimer laser; and solid laser oscillation apparatuses represented by a YAG laser. It is known that such a device performs crystallization by heating a surface layer of the semiconductor by irradiation of the laser light in an extremely short period of time of about several tens of nanoseconds to several tens of microseconds.

One example of crystallizing an amorphous semiconductor film by using laser light irradiation is a technique, disclosed by Patent Document 1 shown below, in which laser light is scanned at a high speed, equal to or greater than the beam spot diameter×5000/sec, thus performing crystallization of the amorphous semiconductor film to prepare a polycrystalline semiconductor film without reaching a state wherein the amorphous semiconductor film is completely melted. A technique in which drawn out laser light is irradiated to a semiconductor film formed in an island-like, substantially forming a single crystal region is disclosed in Patent Document 2 listed below. Alternatively, a method is known in which a beam is processed into a linear shape by an optical system like a laser processing apparatus disclosed by Patent Document 3 listed below, and then irradiated.

In addition, a technique of manufacturing a TFT in which the second harmonic of laser light is irradiated to an amorphous semiconductor film using a solid state laser oscillation apparatus, such as an Nd:YVO$_4$ laser, thus forming a crystalline semiconductor film having a large crystal grain size compared to a conventionally formed crystalline semiconductor film, is disclosed in Patent Document 4 listed below.

[Patent Document 1]
  JP 62-104117 A (page 92)
[Patent Document 2]
  U.S. Pat. No. 4,330,363 (FIG. 4)
[Patent Document 3]
  JP 8-195357 A (pages 3-4, FIGS. 1-5)
[Patent Document 4]
  JP 2001-144027 A (page 4)

Attempts of forming a single crystal semiconductor film on an insulating surface have been carried out from long ago, and a technique referred to as graphoepitaxy has been proposed as a very progressive attempt. Graphoepitaxy is a technique in which a step is formed in the surface of a quartz substrate, an amorphous semiconductor film or a polycrystalline semiconductor film is formed on the quartz substrate, heat treatment is then performed by using a laser beam or a heater, thus forming an epitaxial growth layer with the step shape formed on the quartz substrate taken as a nucleus. This technique is disclosed by Non-Patent Document 1 and the like, for example.

[Non-Patent Document 1]
  "Grapho-Epitaxy of Silicon on Fused Silica Using Surface Micropatterns and Laser Crystallization", J. Vac. Sci. Technol., 16(6), 1979, pp. 1640-1643.

Further, a semiconductor film crystallization technique referred to as graphoepitaxy is also disclosed in Non-Patent Document 2, for example. This is a technique in which epitaxial growth of a semiconductor film by the introduction of an artificially formed surface relief grating on an amorphous substrate surface was attempted. The graphoepitaxy technique disclosed in Non-Patent Document 2 is one in which a step is formed in the surface of an insulating film, and epitaxial growth of a semiconductor film crystal is attained by conducting heat treatment, laser light irradiation, or other processing on a semiconductor film formed on the insulating film.

[Non-Patent Document 2]

M. W. Geis, et al., "CRYSTALLINE SILICON ON INSULATORS BY GRAPHOEPITAXY" Technical Digest of International Electron Devices Meeting, 1979, p. 210.

Laser beams are classified into two types: pulse oscillation and continuous oscillation, according to an oscillation method. In the pulse oscillation laser, an output energy is relatively high, so that mass productivity can be increased by setting the size of a beam spot to several cm$^2$ or more. In particular, when the shape of the beam spot is processed using an optical system and made to be a linear shape of 10 cm or more in length, it is possible to efficiently perform irradiation of the laser light to the substrate and further enhance the mass productivity. Thus, for crystallization of the semiconductor film, the use of a pulse oscillation laser is becoming mainstream.

In recent years, however, it has been found that the grain size of crystals formed in a semiconductor film is larger when a continuous wave laser is used to crystallize a semiconductor film than when a pulse oscillation laser is used. With crystals of larger grain size in a semiconductor film, the mobility of TFTs formed from this semiconductor film is increased. As a result, continuous wave laser beams are now suddenly attracting attention.

A crystalline semiconductor film manufactured by using a laser annealing method, which is roughly divided into pulse wave and continuous wave types, is generally formed with an aggregation of a plurality of crystal grains. The position and size of the crystal grains are random, and it is difficult to specify the crystal grain position and size when forming a crystalline semiconductor film. Crystal grain interfaces (grain boundaries) therefore exist within an active layer formed by patterning the aforementioned crystalline semiconductor film into an island-like.

In contrast with the crystal grains, countless recombination centers and capture centers exist in the grain boundaries due to an amorphous structure, crystal defects, and the like. It is known that a carrier is trapped in the capture centers, the potential of the grain boundaries rises, and the grain boundaries become barriers with respect to the carrier, and therefore the current transporting characteristics for the carrier are reduced. The existence of grain boundaries within the TFT active layer, in particular within a channel formation region, therefore exerts a great influence on the characteristics of the TFT in which a TFT mobility drops considerably, an ON current is reduced, and an OFF current is increased due to electric current flowing in the grain boundaries. Further, the characteristics of a plurality of TFTs, manufactured on the premise that the same characteristics can be obtained, may vary depending on the existence of grain boundaries within the active layers.

The position and size of the crystal grains obtained when irradiating laser light to a semiconductor film become random due to the following reasons. A certain amount of time is required until the generation of solid state nuclei within a liquid semiconductor film which is completely melted by the irradiation of laser light. Countless crystal nuclei are generated in completely melted regions along with the passage of time, and crystal grows from each of the crystal nuclei. The positions at which the crystal nuclei are generated are random, and therefore the crystal nuclei are distributed non-uniformly. Crystal grow stops at points where the crystal nuclei run into each other, and therefore the position and the size of the crystal grains become random.

It is ideal to form the channel formation region, which exerts a great influence on the TFT characteristics, by a single crystal grain, thus eliminating the influence of grain boundaries. However, it is nearly impossible to form an amorphous silicon film, in which grain boundaries do not exist, by using a laser annealing method. It has therefore not been possible to date to obtain characteristics equivalent to those of a MOS transistor, which is manufactured on a single crystal silicon substrate, in a TFT that uses a crystalline silicon film crystallized by employing laser annealing.

A method of recrystallization from a melted state by heating a semiconductor film on a single crystal substrate to a high temperature, known as zone melting and the like, is in the main stream in order to form a high quality crystalline semiconductor film on an insulating surface having aligned orientation, few defects, few crystal grain boundaries, and few subboundaries.

A step on the base like that of a known graphoepitaxy technique is utilized, and therefore crystals grow along the step, but the step which remains in the surface of the formed single crystal semiconductor film is considered to be a problem. In addition, a single crystal semiconductor film cannot be formed on a glass substrate having a relatively low distortion point by using graphoepitaxy.

In any case, it has not been possible to form a crystalline semiconductor film in which semiconductor volumetric contraction caused by crystallization, defects due to thermal stresses with the base, lattice mismatching, or the like, crystal grain boundaries, and subboundaries do not exist. Except a bonded SOI (silicon on insulator), it has not been possible to obtain quality equivalent to that of a MOS transistor formed on a single crystal substrate, in a crystalline semiconductor film that is formed on an insulating surface and then crystallized or recrystallized.

SUMMARY OF THE INVENTION

In view of the aforementioned problems, an object of the present invention is to provide a semiconductor device structured by a high speed semiconductor element having high current driver performance, in which a crystalline semiconductor film is formed on an insulating surface, and the crystalline semiconductor film has as few crystal grain boundaries and crystal subboundaries as possible intersecting at least with a channel length direction.

Further, another object is to provide a method of manufacturing a semiconductor device, and a semiconductor device manufactured by using the manufacturing method, in which a laser crystallization method is used that is capable of preventing the formation of grain boundaries in TFT channel formation regions, and is capable of preventing conspicuous drops in TFT mobility, reduction in the ON current, and increases in the OFF current, all due to grain boundaries.

The applicants of the present invention discovered that, if a semiconductor film is formed on an insulating film having depression and projection, and laser light is irradiated to the semiconductor film, grain boundaries will then be formed selectively in portions of a crystallized semiconductor film located on projections of the insulating film.

FIG. 19A shows a TEM cross sectional image in a direction orthogonal to a laser light scanning direction when continuous wave laser light is irradiated to a 200 nm thick non-single crystal semiconductor film formed on an insulating film having depressions and projections at a scanning speed of 5 cm/sec. Reference numerals 8001 and 8002 in FIG. 19B denote projections formed in the insulating film. A crystallized semiconductor film 8004 has grain boundaries 8003 in the portions on the projections 8001 and 8002.

The TEM cross sectional image shown in FIG. 19A is shown schematically in FIG. 19B. The grain boundaries 8003 are formed in the upper portions of the projections 8001 and 8002. The applicants of the present invention considered that the semiconductor film disposed on an upper portion of the insulating film is volumetrically transferred toward a bottom portion of a depression due to its temporary melting state caused by laser light irradiation, and therefore the semiconductor film disposed on the upper portion becomes thinner, to be unable to withstand stress, and grain boundaries develop therein. Although a semiconductor film thus crystallized has grain boundaries selectively formed in the upper portions of the projections, grain boundaries do not form easily in portions disposed in depressions (regions denoted by dotted lines). Note that the term depressions indicates sunken regions where the projections are not formed.

The applicants of the present invention then considered that the locations at which the grain boundaries are formed could be determined selectively by intentionally forming portions in the semiconductor film at which stress will concentrate. An insulating film having depressions and projections are formed on a substrate in the present invention, and a semiconductor film is formed on the insulating film. Portions at which stress is concentrated are thus formed selectively in the semiconductor film during crystallization performed by laser light. Specifically, depressions and projections are formed in the semiconductor film. Continuous wave laser light is then irradiated along the longitudinal direction of the depressions and projections formed in the semiconductor film. Note that, although it is most preferable that continuous wave laser light be used at this point, pulse wave laser light may also be used. Note also that the cross section of the projections in a direction orthogonal to the scanning direction of the laser light may be rectangular, triangular, or trapezoidal.

Grain boundaries are thus formed selectively on the projections of the semiconductor film during crystallization by laser light with this structure. Grain boundaries are relatively difficult to be formed in the semiconductor film disposed on the depressions of the insulating film. The semiconductor film disposed on the depressions of the insulating film has superior crystallinity, but does not always contain no grain boundaries. However, even if grain boundaries do exist, the crystal grains are larger, and the crystallinity is relatively superior, compared to those in the semiconductor film located on the projections of the semiconductor film. The locations at which grain boundaries are formed in the semiconductor film can therefore be forecast to a certain extent at the stage when the shape of the insulating film is designed. That is, the locations at which the grain boundaries are formed in the present invention can be selectively determined, and therefore it becomes possible to lay out an active layer so that as few grain boundaries as possible are contained in the active layer, preferably as few as possible in the channel formation region.

The formation of grain boundaries in the TFT channel formation region can be prevented with the present invention by effectively using the semiconductor film disposed on the depressions of the insulating film for TFT active layers. Conspicuous drops in TFT mobility, reductions in the ON current, and increases in the OFF current, all due to grain boundaries, can be prevented. Note that the designer can suitably determine a portion to be removed by patterning as being adjacent to the edges of the projections or the depressions.

In order to solve the aforementioned problems, according to the present invention, there is provided a method of manufacturing a semiconductor device, including:

forming an insulating film on a substrate that has an insulating surface, the insulating film having opening portions;

forming a non-single crystal semiconductor film on the insulating film and in the opening portions;

melting the non-single crystal semiconductor film, thus performing crystallization or recrystallization and forming crystalline semiconductor films filling the opening portions of the insulating film; and forming a gate insulating film and gate electrodes so that the crystalline semiconductor films filling the opening portions are superimposed with the gate electrodes through the gate insulating film.

The opening portion may be formed by etching the surface of the insulating substrate, and the opening portion may also be formed by using a silicon oxide film, silicon nitride film, silicon oxynitride film, or the like, and performing etching thereon. The opening portion should be disposed with the position of an island-like semiconductor region containing a thin film transistor channel formation region, and it is preferable to form the opening portion to conform at least with the channel formation region.

An amorphous semiconductor film of a polycrystalline semiconductor film formed by plasma CVD, sputtering, or low pressure CVD, a polycrystalline semiconductor film formed by solid state growth, or the like are applied to the non-single crystal semiconductor film. Note that the term amorphous semiconductor film as used in the present invention includes not only its strict definition of semiconductor films having a completely amorphous structure, but also includes semiconductor films in a state containing microcrystal grains, so-called microcrystalline semiconductor films, and semiconductor films containing a locally crystalline structure. An amorphous silicon film is typically applied. In addition, amorphous silicon germanium films, amorphous silicon carbide films, and the like can also be applied.

Pulse wave or continuous wave laser light generated from a gas laser oscillation apparatus or a solid state laser oscillation apparatus as a light source is applied as a means of melting the non-single crystal semiconductor film and performing crystallization. The laser light irradiated is condensed into a linear shape by using an optical system. The intensity distribution of the laser light has a uniform region in a longitudinal direction, and may also possess a distribution in a transverse direction. A solid state laser oscillation apparatus having a rectangular shape beam is applied as the laser oscillation apparatus used as the light source. In particular, it is preferable to apply a slab laser oscillation apparatus. Alternatively, a construction may be applied in which a solid state laser oscillation apparatus using a rod doped with Nd, Yb, Tm, and Ho, in particular a solid state laser oscillation apparatus using crystals of YAG, YVO$_4$, YLF, YAlO$_3$ or the like doped with Nd, Tm, and Ho, is combined with a slab structure amplifier. Crystals of Nd:YAG, Nd:GGG (gadolinium, gallium, garnet), Nd:GSGG (gadolinium, scandium, gallium, garnet), and the like can be used as the slab material. A zigzag light path is followed with a slab laser, while total reflection is repeated within the platy shape laser medium.

Further, strong light corresponding to the laser light may also be applied. For example, light having a high energy density condensed by using a reflective mirror, a lens, or the like from light emitted by a halogen lamp, a xenon lamp, a high pressure mercury lamp, a metal halide lamp, or an excimer lamp may also be used.

The expanded laser light condensed into a linear shape or the strong light is irradiated to the non-single crystal semiconductor film, and the laser light irradiation position and the substrate on which the non-single crystal semiconductor film is formed are moved relative to each other. The laser light is scanned over a portion of the substrate or the entire substrate, thus melting the non-single crystal semiconductor film and performing crystallization or recrystallization. It is preferable to perform laser scanning in a direction along the longitudinal direction of the opening portions or the longitudinal direction of the channel formation regions. Crystal thus grows along the laser light scanning direction, and crystal grain boundaries and crystal subboundaries can be prevented from intersecting the channel longitudinal direction. Note that, the present invention is not always limited to this.

A semiconductor device of the present invention manufactured as described above is characterized by including:

a substrate having an insulating surface;

an insulating film formed on the substrate and having an opening portion; and a crystalline semiconductor film formed on the substrate and having a region that fills the opening portion and a channel formation region in the filled region.

According to another structure of the present invention, a semiconductor device is characterized by including:

a substrate having an insulating surface;

an insulating film formed on the substrate and having an opening portion extending in a channel longitudinal direction; and a crystalline semiconductor film formed on the substrate and having a region that fills the opening portion and a channel formation region in the filled region, in which the opening portion has a depth equal to or greater than the depth of the crystalline semiconductor film.

According to another structure of the present invention, a semiconductor device is characterized by including:

an insulating surface having an opening portion extending in a rectangular shape or a stripe shape;

a crystalline semiconductor film formed in the opening portion;

a gate insulating film; and a gate electrode overlapped with the crystalline semiconductor film through the gate insulating film.

According to another structure of the present invention, a semiconductor device is characterized by including:

an insulating surface having an opening portion extending in a channel longitudinal direction;

a crystalline semiconductor film formed in the opening portion;

a gate insulating film; and a gate electrode overlapped with the crystalline semiconductor film through the gate insulating film.

By making the depth of the opening portion on the same order as, or greater than, the semiconductor film thickness, the semiconductor melted by the laser light or the strong light will aggregate and solidify in the opening portion (that is, depression portion) due to surface tension. As a result, the thickness of the semiconductor film in the opening portion (that is, projection) becomes thinner, and stress distortion can be made to concentrate there. Further, side surfaces of the opening portion have an effect to a certain extent for limiting the crystal orientation. The angles of the side surfaces of the opening portion are formed at 5 to 120° with respect to the substrate surface, preferably at 80 to 100°.

After the semiconductor film is melted by irradiation of the laser light or the strong light, solidification begins from a region at which the bottom surfaces and the side surfaces of the opening portion intersect, and crystal growth begins from here. For example, results of performing thermal analysis simulations at points A, B, C, and D in a system are shown in FIG. 17 wherein a step shape is formed by an insulating film (1) and an insulating film (2). Characteristics are obtained as shown in FIG. 18. Heat escapes from directly underneath the insulating film (2) and from the insulating film (1) existing on the side surfaces, and therefore the fastest temperature drop is at the point B. The points A, C, and D follow in that order. The simulation results are for a case in which a sidewall angle is 45°, but a qualitatively similar phenomenon can also be considered for a case in which the angle is 90°.

That is, the semiconductor film is once placed in a melted state, it aggregates in the opening portion formed in the insulating surface due to surface tension, and crystal growth occurs roughly from the intersection between the bottom portion and sidewalls of the opening portion. Distortions that develop accompanying crystallization can thus be concentrated in regions outside of the opening portion. In other words, the crystalline semiconductor film formed so as to fill the opening portion can be freed from distortions.

Note that the energy density in the vicinity of the edge of the laser beam of laser light is generally low compared to that near the center of the beam, and the crystallinity of the corresponding semiconductor film often inferior. It is therefore preferable that laser light scanning be performed such that portions which later become TFT channel formation regions and the edges of the trajectory are not overlapped with each other.

With the present invention, data (pattern information) obtained at the design stage on the shape of the insulating film or the semiconductor film as seen from above the substrate is first stored in a storing means. A scanning path for the laser light is then determined from the pattern information and from the width of the laser beam of laser light in the scanning direction, and in a direction orthogonal to the scanning direction, so that at least portions that become TFT channel formation regions are not overlapped with the edge of the laser light trajectory. The substrate position is then disposed using a marker as a reference, and laser light is irradiated to the semiconductor film on the substrate in accordance with the determined scanning path.

With the aforementioned structure, the laser light can be irradiated only to indispensable portions, not to the entire substrate. Time required to irradiate the laser light to unnecessary portions can therefore be omitted, the time needed for laser light irradiation can be reduced, and the substrate processing speed can be increased. Further, damage caused to the substrate by irradiating the laser light to unnecessary portions can be prevented.

Note that the marker may be formed by directly etching the substrate using laser light or the like, and that the marker may also be formed in a portion of the insulating film at the same time as the insulating film having depressions and projections is formed. Furthermore, position alignment of the substrate may also be performed by reading in the shape of the actually formed insulating film or the actually formed semiconductor film by using an image pickup element such as a CCD, storing the shape as data in a first storing means, storing the pattern information for the insulating film or the semiconductor film obtained at the design stage in a second storing means, and checking the data stored in the first storing means against the pattern information stored in the second storing means.

The number of masks used for the marker can be reduced by forming the marker in a portion of the insulating film or by using the shape of the insulating film as a marker. Moreover, the marker can be formed in a more accurate location and the precision of the position alignment can be increased more than by forming the marker in the substrate by using laser light.

Note that the energy density of the laser light is generally not completely uniform, but instead the energy changes by position within the laser beam. It is necessary with the present invention to irradiate laser light having a fixed energy density to, at least, portions that become channel formation regions, and preferably over all flat surfaces of the depressions or all flat surfaces of the projections. It is therefore necessary with the present invention to use a laser beam having an energy distribution such that a region having a uniform energy density completely is overlapped, at least, with portions that become channel formation regions, and preferably, all flat surfaces of the depressions or all flat surfaces of the projections. It is considered that the shape of the laser beam is preferably rectangular, linear, or the like in order to satisfy the aforementioned energy density conditions.

In addition, portions of the laser beam having a low energy density may be blocked through use of a slit. Laser light having a relatively uniform energy density can be irradiated to all flat surfaces of the depressions or all flat surfaces of the projections by using the slit, and crystallization can be performed uniformly. Further, the width of the laser beam can be partially changed in accordance with the insulating film or semiconductor film pattern information with the slit. The channel formation region, and in addition the layout of the TFT active layer, can be less limited. Note that the term laser beam width denotes the length of the laser beam in a direction that is orthogonal to the scanning direction.

Further, one laser beam obtained by combining laser lights emitted from a plurality of laser oscillation apparatuses may also be used in laser crystallization. Portions at which the energy density is low in each of the laser lights can be supplemented with each other by using the aforementioned structure.

Further, laser light irradiation may be performed without exposure to the outside atmosphere after forming the semiconductor film (for example, under a specific gas atmosphere of an inert gas, nitrogen, oxygen, or the like, or under a reduced pressure atmosphere), thus crystallizing the semiconductor film. Contaminant substances on a molecular level within a clean room, for example boron and the like contained within a filter for increasing the cleanliness of air, can be prevented from mixing into the semiconductor film when performing crystallization by laser light with the aforementioned structure.

Note that the conventional technique of crystallizing a semiconductor film referred to as graphoepitaxy is attempted for epitaxial growth of a semiconductor film induced by a surface relief grating on an artificially formed amorphous substrate. Techniques relating to graphoepitaxy can be found in the aforementioned Non-Patent Document 2 and the like. The graphoepitaxy is disclosed in the aforementioned document and the like as forming a step in the surface of an insulating film, and performing heating, laser light irradiation, or the like to a semiconductor film formed on the insulating film, thus causing crystals in the semiconductor film to grow epitaxially. However, the temperature necessary for epitaxial growth is, at least, on the order of 700° C. If epitaxial growth is performed on a glass substrate, then grain boundaries are formed in the semiconductor film in the vicinity of the edges of the depressions or the projections of the insulating film. With the present invention an island mask is laid out, and the shape of the depressions or the projections of the insulating film, and its edge locations, are designed to correspond to the island mask so as to increase crystallinity in portions that become islands. Specifically, the shape, the size, and the like for the depressions or the projections are determined so that the edges of the depressions or the projections, and the vicinity of the center between the edges of the depression and the projection, are not overlapped with the islands. The locations of the grain boundaries are therefore intentionally and selectively determined by using the insulating film designed corresponding to the island layout. Portions of the semiconductor film in which the grain boundaries are selectively formed may then be removed, and portions having relatively superior crystallinity may be used as islands. The technique disclosed in the present invention therefore is in agreement with conventional graphoepitaxy in the following points: a semiconductor film is formed on an insulating film in which a step has been formed; and the semiconductor film is crystallized by utilizing the step. However, the locations of the grain boundaries are not controlled by using the step in conventional graphoepitaxy, and the concept of reducing grain boundaries within the islands is not included in conventional graphoepitaxy. The conventional technique only resembles and differs from the present invention.

BRIEF DESCRIPTION OF THE DRAWINGS

In the accompanying drawings are as follows.

FIGS. 5A to 5E are longitudinal cross sectional diagrams for explaining details of the relationship between the shape of an opening portion during crystallization and the form of a crystalline semiconductor film.

FIGS. 6A and 6B are layout drawings showing an embodiment of a laser irradiation apparatus applied in the present invention.

FIGS. 7A to 7C are an upper surface diagram and longitudinal cross sectional diagrams, respectively, for explaining a process of manufacturing a TFT manufactured by the present invention.

FIGS. 8A to 8C are an upper surface diagram and longitudinal cross sectional diagrams, respectively, for explaining the process of manufacturing a TFT manufactured by the present invention.

FIGS. 9A to 9C are an upper surface diagram and longitudinal cross sectional diagrams, respectively, for explaining the process of manufacturing a TFT manufactured by the present invention.

FIGS. 10A to 10C are an upper surface diagram and longitudinal cross sectional diagrams, respectively, for explaining the process of manufacturing a TFT manufactured by the present invention.

FIGS. 11A to 11C are an upper surface diagram and longitudinal cross sectional diagrams, respectively, for explaining the process of manufacturing a TFT manufactured by the present invention.

FIGS. 12A to 12C are an upper surface diagram and longitudinal cross sectional diagrams, respectively, for explaining the process of manufacturing a TFT manufactured by the present invention.

FIGS. 13A to 13C are an upper surface diagram and longitudinal cross sectional diagrams, respectively, for explaining the process of manufacturing a TFT manufactured by the present invention.

FIGS. 14A to 14D are an upper surface diagram, longitudinal cross sectional diagrams and an enlarged view of a portion thereof, respectively, for explaining the process of manufacturing a TFT manufactured by the present invention.

FIGS. 15A to 15C are external views of a display panel.

FIGS. 19A and 19B are a TEM cross sectional image taken after crystallization by irradiating laser light to a semiconductor film formed on a base film having a projection, and a schematic diagram of the image, respectively.

FIGS. 20A to 20C are diagrams showing the flow of crystallization of a semiconductor film of the present invention.

FIGS. 28A to 28D are diagrams showing a process of manufacturing a TFT of the present invention.

FIGS. 29A to 29D are diagrams showing a process of manufacturing a TFT of the present invention.

FIGS. 31A to 31E are diagrams showing the flow of crystallization of a semiconductor film of the present invention when using a catalytic element.

FIGS. 36A to 36D are diagrams showing the energy density distribution of a laser beam.

FIGS. 37A and 37B are diagrams showing the energy density distribution of a laser beam.

FIGS. 51A to 51C are diagrams showing the frequency distribution of the mobility.

DETAILED DESCRIPTION OF THE PREFERRED EMBODIMENTS

Embodiment Mode 1

Figure 1:
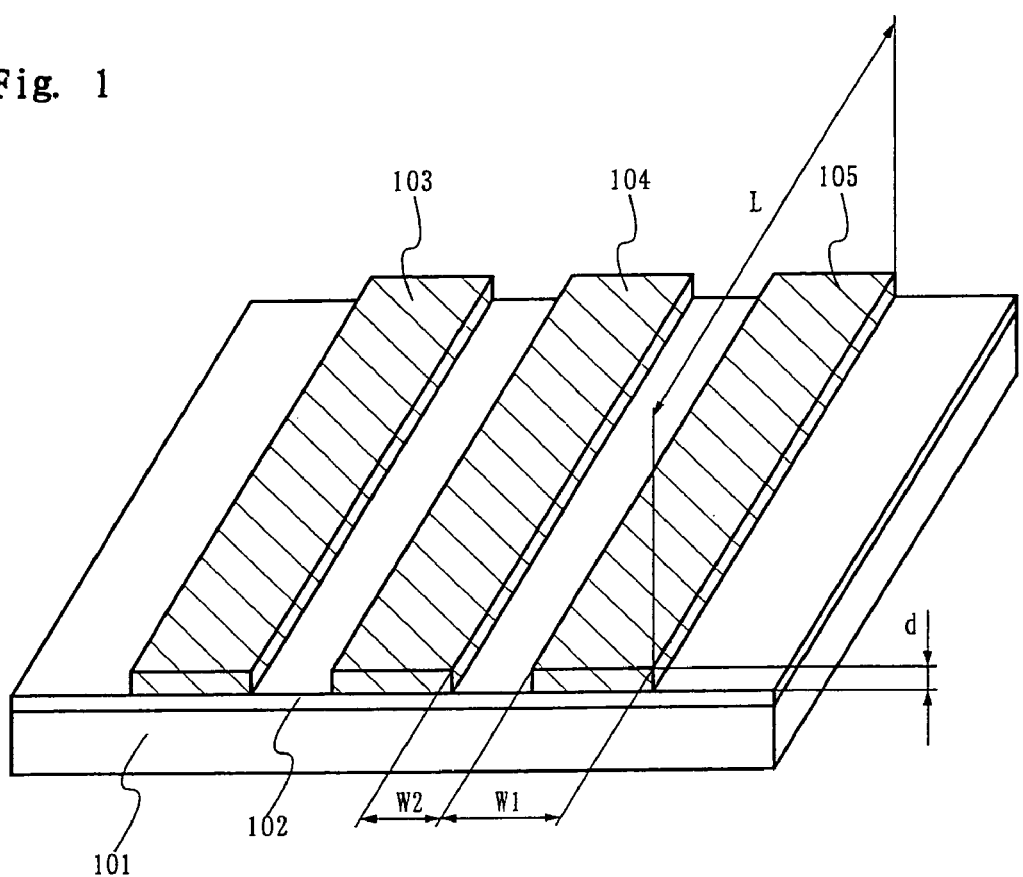
FIG. 1 is a perspective view for explaining a crystallization method of the present invention.

An embodiment mode of the present invention is explained below with reference to the figures. A perspective view shown in FIG. 1 shows an embodiment in which a first insulating film 102, and second insulating films 103 to 105 that are patterned into stripe shapes, are formed on a substrate 101. Three stripe shape patterns are shown here for the second insulating films, but of course there are not limitations placed on the number of stripe shape patterns. The substrate can apply a commercially available non-alkaline glass substrate, a quartz substrate, a sapphire substrate, a single crystal or a polycrystalline semiconductor substrate whose surface is covered by an insulating film, or a metal substrate whose surface is covered by an insulating film.

The A width W1 of the second insulating films formed in stripe shapes is set from 0.1 to 10 μm (preferably from 0.5 to 1 μm), a gap W2 between adjacent second insulating films is set from 0.1 to 5 μm (preferably from 0.5 to 1 μm), and a thickness d of the second insulating films is set to the same order as, or greater than, the thickness of a non-single crystal semiconductor film formed on the second insulating films. Further, step shapes need not have a regulated periodic pattern, and may be formed to align with the layout and shape of island-like regions containing TFT channel formation regions. A length L of the second insulating films is also not limited, and the length L may be on an order such that the TFT channel formation regions can be formed, for example.

The first insulating film is formed using silicon nitride or silicon oxynitride. Further, the second insulating films are formed using silicon oxide or silicon oxynitride. Silicon oxide can be formed by plasma CVD by mixing tetraethyl-ortho-silicate (TEOS) and $O_2$—Silicon oxynitride films can be formed by plasma CVD using $SiH_4$, $NH_3$, and $N_2O$, or $SiH_4$ and $N_2O$ as raw materials.

It is preferable to suitably regulate the materials and the film formation conditions so that the etching speed of the second insulating films becomes relatively fast in order to ensure selectivity during etching processing in the case where an uneven shape is formed by the first insulating film and the second insulating films with opening portions as a form of FIG. 1. The angle of sidewalls of the opening portions formed of the second insulating film may be suitably set in a range from 5 to 120°, preferably in a range from 80 to 100°.

Figure 2:
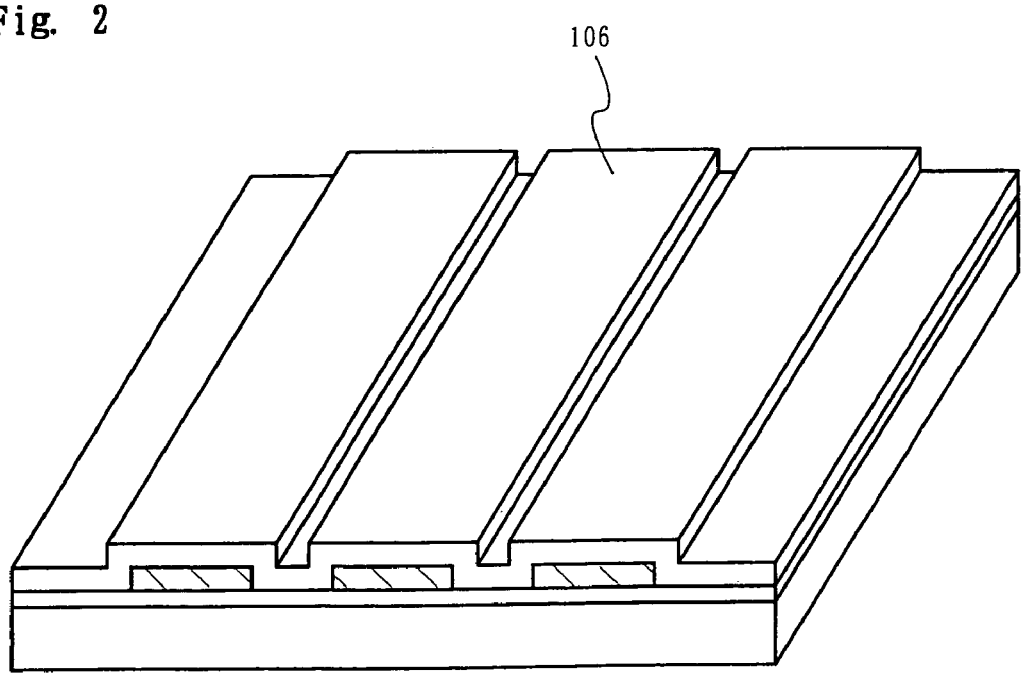
FIG. 2 is a perspective view for explaining the crystallization method of the present invention.

An amorphous semiconductor film 106 having a thickness of 50 to 200 nm is formed covering a surface composed of the first insulating film 102 and the second insulating films 103 to 105, and the opening portions, as shown in FIG. 2. The amorphous semiconductor film can apply silicon, a chemical compound or solid solution of silicon and germanium, or a chemical compound or solid solution of silicon and carbon.

Continuous wave laser light is then irradiated to the amorphous semiconductor film 106, performing crystallization. Applicable laser light is concentrated and expanded into a linear shape by an optical system. The intensity distribution of the laser light has a uniform region in the longitudinal direction, and may possess a distribution in the transverse direction. A rectangular shape beam solid state laser oscillation apparatus is applied as a laser oscillation apparatus which is used as a light source, and in particular it is preferable to apply a slab laser oscillation apparatus. Alternatively, a solid state laser oscillation apparatus that uses a rod doped with Nd, Tm, and Ho, in particular a solid state laser oscillation apparatus that uses a crystal such as YAG, YVO$_4$, YLF, YalO$_3$, or the like doped with Nd, Tm, and Ho may also be combined with a slap structure amplifier. The scanning is then performed as shown by an arrow in the figure in a direction that intersects with the linear shape longitudinal direction. It is most preferable at this point to scan in a direction parallel to the longitudinal direction of the stripe shape pattern formed in the base insulating film. Note that the term linear shape as used here denotes a shape in which the ratio of the length in the longitudinal direction, with respect to the length in the transverse direction, is equal to or greater than 10.

Crystals such as Nd:YAG, Nd:GGG (gadolinium, gallium, garnet), Nd:GSGG (gadolinium, scandium, gallium, garnet) and the like can be used as the slab material. A zigzag light path is followed with the slab laser, while total reflection is repeated within the planer shape laser medium.

Further, considering the light absorption coefficient of the amorphous semiconductor film, it is preferable that the wavelength of the continuous wave laser light be from 400 to 700 nm. Light in this wavelength range is obtained by extracting the second harmonic or the third harmonic of the fundamental wave using a wavelength converter element. ADP (ammonium dihydrogen phosphate), Ba$_2$NaNb$_5$O$_{15}$ (barium sodium niobate), CdSe (selenium cadmium), KDP (potassium dihydrogen phosphate), LiNbO$_3$ (lithium niobate), Se, Te, LBO, BBO, KB5, and the like can be applied as the wavelength converter element. In particular, it is preferable to use LBO. A typical example is to use the second harmonic (532 nm) of an Nd:YVO$_4$ laser oscillation apparatus (fundamental wave 1064 nm). Further, the laser oscillation mode uses a single mode, which is a TEM$_{00}$ mode.

For a case in which silicon is selected as the most suitable material, its absorption coefficient is in a region from $10^3$ to $10^4$ cm$^{-1}$, which is near to the visible light region. If a substrate having a high transmittivity of visible light is used, such as glass, and an amorphous semiconductor film is formed of silicon having a thickness from 30 to 200 nm, then crystallization can be performed without causing damage to the base insulating film by irradiating visible light with a wavelength of 400 to 700 nm, thus selectively heating the semiconductor region. Specifically, the penetration distance of 532 nm wavelength light is nearly 100 to 1000 nm with respect to an amorphous silicon film, and inside portions of the amorphous semiconductor film 106 formed at a film thickness of 30 to 200 nm can be sufficiently reached. That is, it is possible to heat from the inside of the semiconductor film, and almost the entire semiconductor film can be heated uniformly in the laser light irradiation region.

Figure 3:
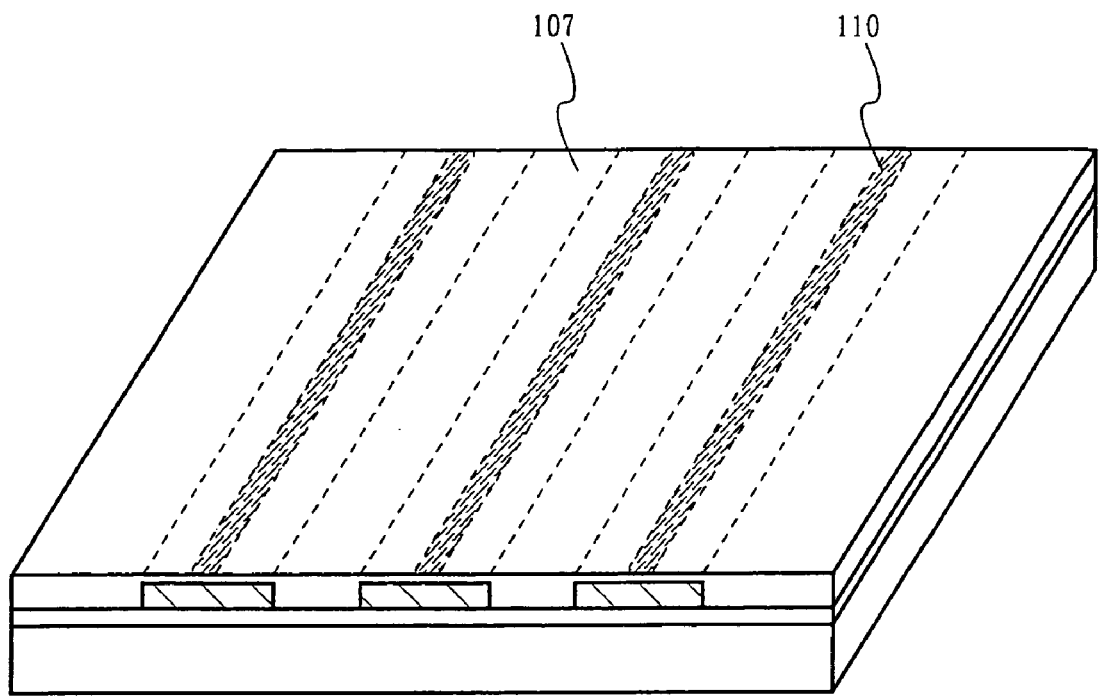
FIG. 3 is a perspective view for explaining the crystallization method of the present invention.

The semiconductor film that has been melted by the laser light irradiation aggregates in the opening portions (depressions) due to the effect of surface tension. The surface is nearly flat in a state thus solidified, as shown by FIG. 3. In addition, crystal growth ends, crystal grain boundaries, and crystal subboundaries are formed on the second insulating films (projections, regions 110 denoted by hatch marks in the figure). A crystalline semiconductor film 107 is thus formed.

Figure 4:
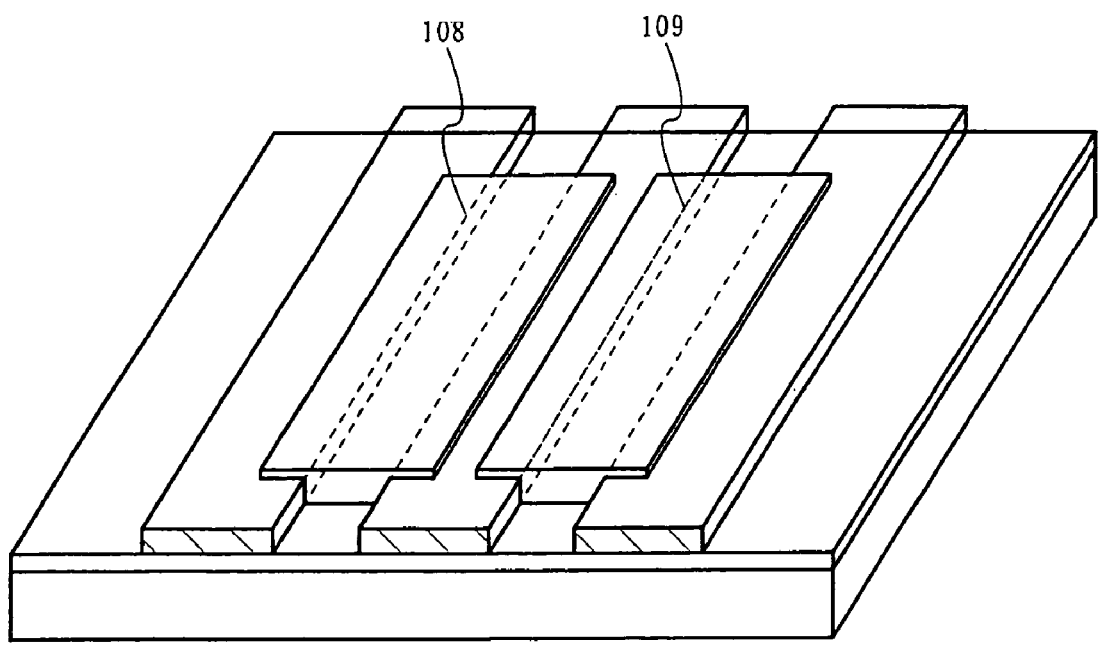
FIG. 4 is a perspective view for explaining the crystallization method of the present invention.

The crystalline semiconductor film 107 is then etched, forming island-like semiconductor regions 108 and 109 as shown in FIG. 4. Only good quality semiconductor regions can remain in accordance with etching and removing the regions 110 in which the growth ends, crystal grain boundaries, and crystal subboundaries are concentrated. A gate insulating film and gate electrodes are then formed so that channel formation regions can be positioned by using the crystalline semiconductor film filling the opening portions (depressions). TFTs can thus be completed through each stage.

FIGS. 5A to 5E are diagrams for schematically explaining the relationship between the depth of, and gap between, opening portion grooves (steps) formed by the first insulating film 102 and the second insulating films 103 to 105, and crystal growth. Note that reference symbols relating to lengths shown in FIGS. 5A to 5E are as follows: t01 denotes the thickness of the amorphous semiconductor film on the second insulating films (projections); t02 denotes the thickness of the amorphous semiconductor film of the opening portions (depressions); t11 denotes the thickness of the crystalline semiconductor film on the second insulating films (projections); t12 denotes the thickness of the crystalline semiconductor film of the opening portions (depressions); d denotes the thickness of the second insulating films (depth of the opening portions); W1 denotes the width of the second insulating films; and W2 denotes the width of the opening portions.

FIG. 5A is for a case in which d<t02, and W1, W2≦1 μm. If the depth of the opening portion grooves is less than the thickness of the amorphous semiconductor film 106, the semiconductor does not fill the opening portions even if it passes through a melting and crystallization process, and the surface of the crystalline semiconductor film does not become planarized. That is, the shape with depressions and projections of the base of the crystalline semiconductor film remains nearly preserved.

FIG. 5B is for a case in which d≧t02, and W1, W2≦1 μm. If the depth of the opening portion grooves is nearly equal to, or greater than, the thickness of the amorphous semiconductor film 106, surface tension effects and the amorphous semiconductor aggregates in the opening portions (depressions). The surface becomes nearly flat as shown in FIG. 5B with a state thus solidified. In this case t11 becomes less than t12, stress concentrates in portions 120 having a thin film thickness, distortions concentrate, and further, crystal growth ends are formed there.

FIG. 5C is for a case in which d>>t02, and W1, W2≦1 μm. In this case the crystalline semiconductor film 107 is formed so as to fill the opening portions, and almost none of the crystalline semiconductor film remains on the second insulating films.

FIG. 5D is for a case in which d≧t02, and W1, W2>1 μm. If the width of the opening portions is expanded, then although the crystalline semiconductor film fills the opening portions and there is a planarizing effect, crystal grain boundaries and crystal subboundaries develop near the center of the opening portions. Further, stress similarly concentrates on the second insulating films, distortions aggregate, and further, crystal growth ends are formed there. It is conjectured that this is due to the stress relief effect being reduced by the wide gaps.

FIG. 5E is for a case in which d≧t02, and W1, W2>>1 μm, and the state of FIG. 5D is further realized.

As explained above using FIGS. 5A to 5E, the conditions of FIG. 5B can be considered the most suitable when forming a semiconductor element, particularly when forming a TFT.

One example is shown in the above explanation for the depression and projection shape of the base for forming the crystalline semiconductor film, formed by the first insulating film and the second insulating films, but the embodiment mode shown here is not limited to this shape. Bases having similar shapes may also be used. For example, opening portions may be formed directly in the surface of a quartz substrate, thus forming an uneven shape.

FIGS. 6A and 6B show an example of a structure of a laser processing apparatus capable of being applied to crystallization. FIGS. 6A and 6B are a diagram showing a front view and a side view of the structure of a laser processing apparatus made from a laser oscillation apparatus 301, a shutter 302, high conversion mirrors 303 to 306, a slit 307, cylindrical lenses 308 and 309, a holding platform 311, driving means 312 and 313 for displacing the holding platform 311 in the x-direction and the y-direction, a controlling means 314 for controlling the driving means, an information processing means 315 for sending signals to the laser oscillation apparatus 301 and the controlling means 314 based on a program stored in advance, and the like.

Laser light concentrated into a linear shape in the cross sectional shape of an irradiation surface by the cylindrical lenses 308 and 309 is made incident at an incline to a surface of a substrate 320 on the holding platform 311. This is done so that a linear shape focused light surface can be formed in the irradiation surface or its vicinity when the focal point position shifts due to aberrations such as astigmatisms. A high transmittivity is obtained if the cylindrical lenses 308 and 309 are manufactured from synthetic quartz, and a coating implemented to the surfaces of the lenses is applied in order to achieve a transmittivity equal to or greater than 99% with respect to the wavelength of the laser light. The cross sectional shape of the irradiation surface is of course not limited to a linear shape, and arbitrary shapes such as a rectangular shape, an elliptical shape, and an oval shape may also be used. Whichever shape is used, shapes having a ratio between the minor axis and the major axis contained in a range from 1 to 10, to 1 to 100, are indicated. Further, the wavelength converter element 310 is prepared in order to obtain a harmonic with respect to a fundamental wave.

As stated above, a rectangular beam solid state laser oscillation apparatus is applied to the laser oscillation apparatus, and in particular, it is preferable to apply a slab laser oscillation apparatus. Alternatively, a solid state laser oscillation apparatus that uses a crystal such as YAG, $YVO_4$, YLF, $YAlO_3$, or the like doped with Nd, Tm, and Ho may also be combined with a slab structure amplifier. Crystals such as Nd:YAG, Nd:GGG (gadolinium, gallium, garnet), Nd:GSGG (gadolinium, scandium, gallium, garnet) and the like can be used as the slab material. In addition, a gas laser oscillation apparatus, or a solid state laser oscillation apparatus, capable of continuous oscillation can also be applied. Laser oscillation apparatuses using crystals such as YAG, $YVO_4$, YLF, $YAlO_3$, or the like doped with Cr, Nd, Er, Ho, Ce, Co, Ti, or Tm are applied as continuous wave solid state laser oscillation apparatuses. Although differing by the dopant material, the fundamental wave is emitted at a wavelength from 1 μm to 2 μm. A diode excited solid state laser oscillation apparatus may be applied in order to obtain very high output, and a cascade connection may also be used.

Further, laser processing of the substrate 320 is possible by moving the holding platform 311 in two axial directions by using the driving means 312 and 313. For movement in one direction, it is possible to continuously move the holding platform 311 at a constant velocity from 1 to 200 cm/sec, preferably from 5 to 50 cm/sec, over a distance longer than the length of one side of the substrate 320. It becomes possible to perform non-continuous stepwise movement in the other direction over a distance on the same order as that of the longitudinal direction of the linear shape beam. Emission of the laser oscillation apparatus 301, and the holding platform 311 are operated synchronously by the information processing means 315 in which a microprocessor is mounted.

It is possible to process the entire surface of the substrate by laser light irradiated from a fixed optical system by linear motion of the holding platform 311 in the x-direction shown in the figure. A position detecting means 316 detects that the substrate 320 is in a position for irradiating laser light, and transfers this signal to the information processing means 315. Emission operations of the laser oscillator and their timing are synchronized by the information processing means 315. That is, the laser oscillation is stopped when the substrate 320 is not in a position for the irradiation of laser light, and its lifetime is extended.

Laser light emitted to the substrate 320 by a laser irradiation apparatus having this type of structure can process desired regions, or the entire surface, of the semiconductor film by relative motion in the x-direction and the y-direction shown in the figure.

By forming the step shapes in the base insulating film, distortions and stress that accompany crystallization of those portions can be concentrated during crystallizing in which continuous wave laser light is irradiated to an amorphous semiconductor film, as stated above. The distortions and stress can be prevented from occurring in the crystalline semiconductor film that is made into an active layer. By forming TFTs so that channel formation regions are disposed in the crystalline semiconductor film which is free of distortions and stress, it becomes possible to increase current driving performance at high speed, and it also becomes possible to increase element reliability.

Further, a method of irradiating laser light used by the present invention is explained using FIGS. 20A to 20C.

First, a first base film 9101 made from an insulating film is formed on a substrate as shown in FIG. 20A. Second base films 9102 made from rectangular shape insulating films are then formed on the first base film 9101, and a third base film 9103 is formed so as to cover the first base film 9101 and the second base films 9102. Silicon nitride is used as the first base film 9101 in this embodiment mode, silicon oxide is used as the second base film 9102, and a silicon oxide film is used as the third insulating film 9103. Note that the materials used in the first insulating film 9101, the second insulating films 9102, and the third insulating film 9103 are not limited to the aforementioned materials. Other materials may also be used provided that: they are insulating films capable of withstanding heat treatment performed in later process steps; they can prevent the contamination of alkaline metals, which can cause adverse influence to TFT characteristics, to a semiconductor film formed later; and depressions and projections can be formed on them. Note that a method for forming this depressions and projections is explained in detail later. Further, insulating films other than these may also be used, and a laminated structure of two or more films may also be used.

Although the first insulating film, the second insulating films, and the third insulating film are shown separately in FIGS. 20A to 20C, the three base films are all taken together and referred to as a base film 9104. Note that, although the base film 9104 having depressions and projections is formed by using the three base films in this embodiment mode, the structure of the base film used by the present invention is not limited to this structure.

A marker may also be formed at the same time as the base film 9104 by utilizing a portion of the base film.

The substrate may be the one capable of withstanding the processing temperatures of later process steps. For example, quartz substrates, silicon substrates, glass substrates such as barium borosilicate glass and aluminum borosilicate glass, and metal substrates and stainless steel substrates on whose surface an insulating film is formed can be sued. Further, plastic substrates having thermal resistance characteristics to an extent capable of withstanding the processing temperatures may also be used.

A semiconductor film 9105 is formed next so as to cover the base film 9104. The semiconductor film 9105 can be formed by a known method (such as sputtering, LPCVD, or plasma CVD). Note that the semiconductor film may be an amorphous semiconductor film, and may also be a microcrystalline semiconductor film or a crystalline semiconductor film. Further, not only silicon, but also germanium may also be used. Furthermore, impurities can be prevented from contamination between the semiconductor film and the base film by forming the semiconductor film in succession, without exposure to the atmosphere, after forming the third base film 9103.

Note that a designer can suitably determine the shape and the size of projections of the base film 9104. It is necessary, however, to set the thickness of the projections on an order such that the semiconductor film formed later is not cut off in the vicinity of the edges of the projections.

Laser light is irradiated to the semiconductor film 9105 next as shown in FIG. 20B. The semiconductor film 9105 melts once due to the laser light irradiation, and its volume moves from upper portions of the projections toward the depressions, as shown by the arrows having a white center. A semiconductor film (after LC) 9106 having a planarized surface and increased crystallinity is formed. The energy density of the laser light becomes lower in the vicinity of the edges of the laser beam, and therefore the crystal grains become smaller in the vicinity of the edges, and protruding portions (ridges) appear along the crystal grain boundaries. Irradiation is therefore performed such that the edges of the laser light beam path is not overlapped with portions that become channel formation regions and portions located on the depressions of the semiconductor film 9105.

Note that the scanning direction for the laser light is set so that it becomes parallel to the longitudinal direction of the projections of the base film 9104.

Known lasers can be used by the present invention. it is preferable that the laser light be continuous wave, but it can be considered that a certain level of the effect of the present invention can be obtained even if a pulse wave type is used. The laser can use a gas laser or a solid state laser. Excimer lasers, Ar lasers, Kr lasers and the like exist as gas lasers, and YAG lasers, $YVO_4$ lasers, YLF lasers, $YAlO_3$ lasers, glass lasers, ruby lasers, Alexandrite lasers, Ti:sapphire lasers, $Y_2O_3$ lasers and the like can be given as solid state lasers. Lasers using crystals such as YAG, $YVO_4$, YLF, $YAlO_3$, or the like doped with Cr, Nd, Er, Ho, Ce, Co, Ti, Yb or Tm are applied as the solid state laser. Although differing by the material used in doping, laser light having a fundamental wave of approximately 1 μm is obtained. Harmonics with respect to the fundamental wave can be obtained by using a non-linear optical element.

In addition, after converting infrared laser light emitted from a solid state laser to green laser light by using a non-linear optical element, ultraviolet laser light then obtained by using another non-linear optical element can also be used.

As for the semiconductor film (after LC) 9106, its film thickness becomes thicker on the depressions of the base film 9104, and conversely its film thickness becomes thinner on the projections of the base film 9104, by volumetric movement due to the laser light irradiation. Grain boundaries 9149 therefore easily generate on the projections due to stress, and conversely a state with nearly good crystallinity is obtained on the depressions. Note that it is not always true that the semiconductor film (after LC) contains no grain boundaries on the depressions. However, even if grain boundaries do exist, the crystal grains are large, and therefore the crystallinity becomes relatively superior.

The surface of the semiconductor film (after LC) 9106 is then etched, thus exposing upper surfaces of the projections of the base film 9104. Note that the semiconductor film (after LC) 9106 is etched so as to expose the upper surfaces of the projections of the base film 9104 in this embodiment mode. Crystalline semiconductor films (islands) 9107 are then formed in the depressions of the base film 9104 as shown in FIG. 20C.

By using the islands obtained in accordance with the above series of process steps as TFT active layers, more preferably as TFT channel formation regions, the formation of grain boundaries in the TFT channel formation regions can be prevented, and conspicuous drops in the TFT mobility, reductions in the ON current, and increases in the OFF current, all due to grain boundaries, can be prevented. Note that a designer can suitably determine a portion to be removed as being in the vicinity of the edges of the depressions, or the edges of the projections, by patterning.

EXAMPLES

Examples of the present invention are explained below.

Example 1

This Example shows an example of manufacturing a TFT in which a crystalline silicon film is formed on a base insulating film having an opening portion, and a channel formation region is disposed in a filled region filling the opening portion.

A first insulating film 602 is formed by silicon nitride film with a thickness of a 100 nm on a glass substrate 601 in FIGS. 7A to 7C. A silicon oxide film is formed on the first insulating film 602, and second insulating films 603 having a rectangular shape pattern are formed by photoetching. The silicon oxide film is deposited to a thickness of 150 nm by using plasma CVD with a mixture of TEOS and $O_2$, and by discharging at a high frequency (13.56 MHz) electric power density of 0.6 W/cm² with a reaction pressure of 40 Pa and a substrate temperature of 400° C. Opening portions 604a and 604b are then formed by etching.

Note that FIG. 7A is an upper surface diagram, FIG. 7B is a longitudinal cross sectional diagram corresponding to a line segment A-A' in FIG. 7A, and FIG. 7C is a longitudinal cross sectional diagram corresponding to a line segment B-B' in FIG. 7A. FIGS. 8A to 8C, 9A to 9C, 10A to 10C, 11A to 11C, and 12A to 12C are similarly handled.

An amorphous silicon film 605 covering the first insulating film 602 and the second insulating films 603 is then formed at a thickness of 150 nm as shown in FIGS. 8A to 8C. The amorphous silicon film 605 is formed by using plasma CVD with $SiH_4$ as a raw material gas.

The continuous wave laser light is then irradiated, thus performing crystallization as shown in FIGS. 9A to 9C. The crystallization conditions are as follows: a continuous wave mode of a $YVO_4$ laser oscillator is used; a second harmonic (wavelength 532 nm) output of 5.5 W is condensed by an optical system so as to have a uniform energy distribution in a longitudinal direction, with a size of 400 μm in the longitudinal direction and from 50 to 100 μm in a transverse direction; and this is scanned at a velocity of 50 cm/sec, thus causing crystallization. The term uniform energy density distribution does not imply excluding energy density distribution that is not completely uniform, but denotes one with a permissible range for the energy density distribution of ±20%. The laser processing apparatus structure as shown in FIGS. 6A and 6B can be applied to this type of laser light irradiation. The laser light condensed by the optical system may have a range in the longitudinal direction wherein the intensity distribution is uniform, and may possess a distribution in the transverse direction. Crystallization is performed such that the intensity distribution forms a uniform region in the longitudinal direction, and the effectiveness for crystal growth in a direction parallel to the laser light scanning direction can be increased.

The amorphous silicon film is melted instantaneously by irradiating the laser light under these conditions, and crystallization proceeds as the melted stripe moves. Surface tensions effects on the melted silicon, and the melted silicon aggregates in the opening portions (depressions) and solidifies. A crystalline semiconductor film 606 is thus formed in a state wherein it fills the opening portions 604a and 604b.

A mask pattern is then formed and an etching process is implemented so that at least the crystalline semiconductor film remains in the opening portions 604a and 604b, thus forming island-like regions 607 and 608 that contain channel formation regions as shown in FIGS. 10A to 10C.

FIGS. 11A to 11C show a state in which a gate insulating film 609, and gate electrodes 610 and 611 are formed on an upper layer side of the semiconductor regions 607 and 608. The gate insulating film 609 may be formed from a silicon oxide film with a film thickness of 80 nm by using plasma CVD. The gate electrodes 610 and 611 are formed by using tungsten or an alloy containing tungsten. Channel formation regions can be formed in the island-like semiconductor regions that fill the opening portions 604a and 604b by employing this type of structure.

TFTs can then be completed, provided that source and drain regions, low concentration drain regions, and the like are suitably formed.

Example 2

Example 2 shows a structure formed by processes that are similar to those of Example 1, but as shown by FIGS. 12A to 12C, the opening portions formed in the second insulating films 603 are formed in long, thin strip regions and regions that are connected to the long, thin strip regions. As island-like semiconductor region 620 is formed by a crystalline silicon film in alignment with the opening portion 604c, and a single gate, multi-channel TFT can be completed by forming a gate insulating film 621 and a gate electrode 622.

Example 3

By forming the thickness of the second insulating films thicker than the amorphous semiconductor film in Example 2, for example by forming the second insulating films at 350 nm, the island-like region 620 formed by the crystalline semiconductor film can be completely buried in an opening portion 604d as shown in FIGS. 13A to 13C. A single gate, multi-channel TFT can then be formed provided that the gate insulating film 621 and the gate electrode 622 are similarly formed.

Example 4

FIGS. 14A to 14D show another example of a single gate, multi-channel TFT. The first insulating film 602, the second insulating films 603, an island-like semiconductor region 630, a gate insulating film 631, and a gate electrode 632 are formed on the substrate 601 similar to those formed in Examples 1 to 3. A portion that differ in FIGS. 14A to 14C is an opening portion 604e formed by the second insulating films 603, and in addition, the second insulating films are removed from the periphery of the semiconductor regions, wherein channel formation regions are formed, after forming the island-like semiconductor regions 630, thus forming second opening portions 625.

An enlarged view of an Example of the vicinity of the channel formation region is shown in FIG. 14D. The gate electrode 631 is formed contacting a side surface and an upper surface of the island-like semiconductor region 630, and the gate electrode 632 is formed covering the gate insulating film 631. In this case the channel formation region is formed on an upper portion 634 and a side surface portion 635 of the semiconductor region 630. Depleted regions can thus be increased, and the TFT current driving performance can be improved.

Example 5

The present invention can be applied to various types of semiconductor devices, and an Example of a display panel manufactured based on Examples 1 to 4 is explained.

A pixel portion 902, gate signal line driver circuits 901a and 901b, a source signal line driver circuit 901c, input terminals 935, and wirings or a wiring group 917 are prepared on a substrate 900 in FIGS. 15A to 15C. A seal pattern 940 may be overlapped with a portion of the gate signal line driver circuits 901a and 901b, the source signal line driver circuit 901c, and the wirings or wiring group 917 that connects driver circuit portion with the input terminals 935. The surface area of a frame region (peripheral region of the pixel portion) of the display panel can thus be reduced. An FPC 936 is fixed to the input terminals 935.

In addition, a chip 950 on which a microprocessor, memory, or media processor/DSP (digital signal processor) or the like is formed using TFTs of the present invention may also be mounted. These functional circuits are formed by using design rules different from those of the pixel portion 902, the gate signal line driver circuits 901a and 901b, and the source signal line driver circuit 901c. Specifically, a design rule of 1 μm or less is applied. There are no limitations placed on the mounting method, and a COG method or the like may be applied.

The TFTs shown by Examples 1 to 4 can be applied as switching elements of the pixel portion 902, and in addition, as functional elements that structure the gate signal line driver circuits 901a and 901b and the source signal line driver circuit 901c.

Figure 16:
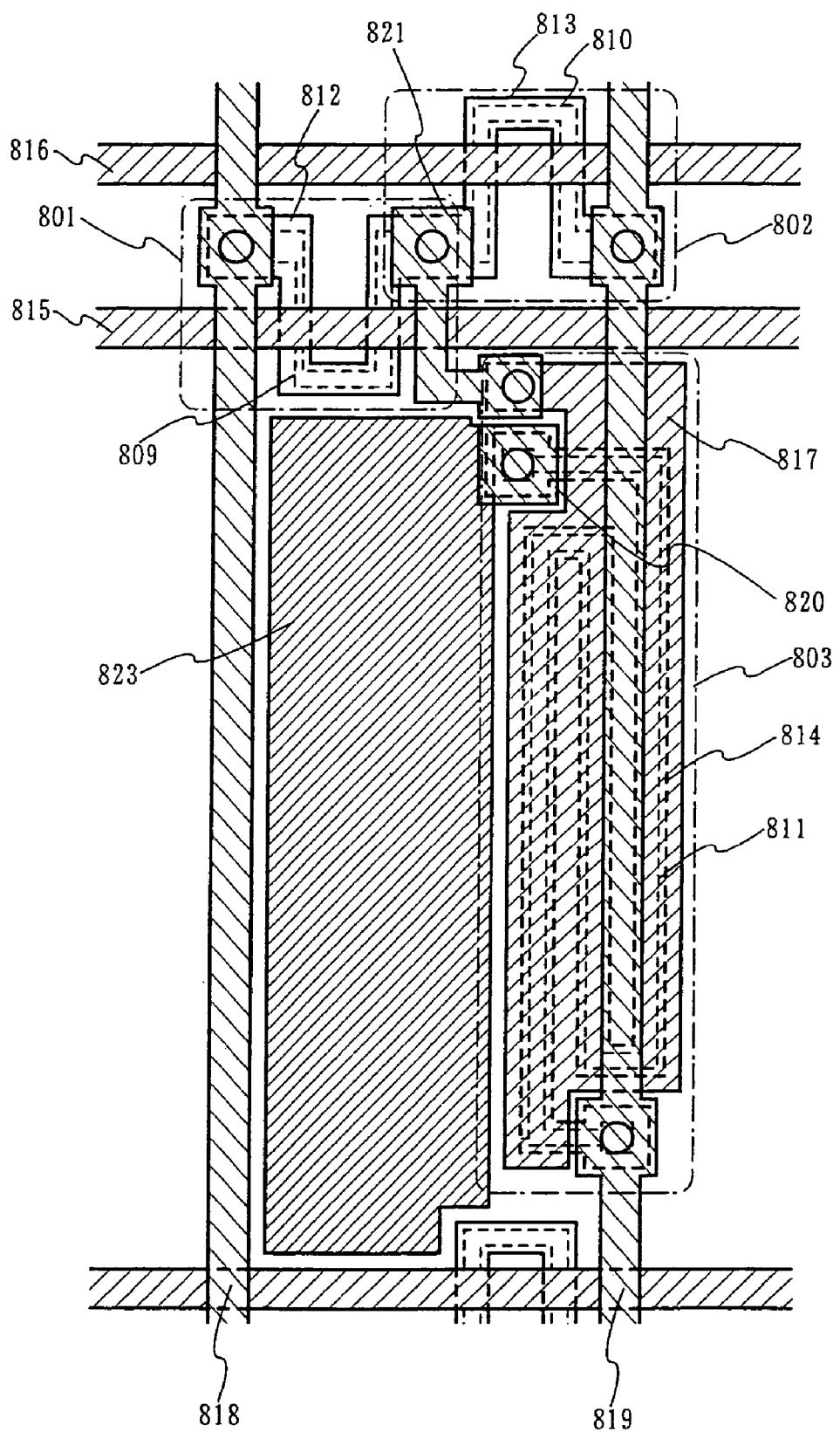
FIG. 16 is an upper surface diagram for explaining the structure of a pixel portion of a display panel manufactured by using the present invention.
Figure 17:
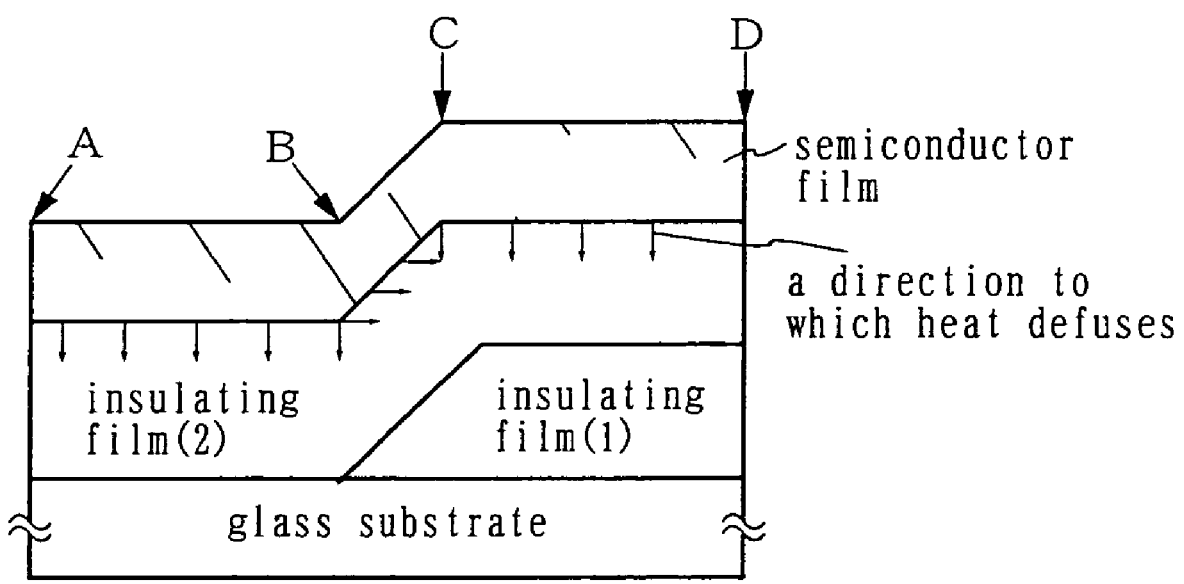
FIG. 17 is a cross sectional diagram showing the structure used in a thermal analysis simulation.
Figure 18:
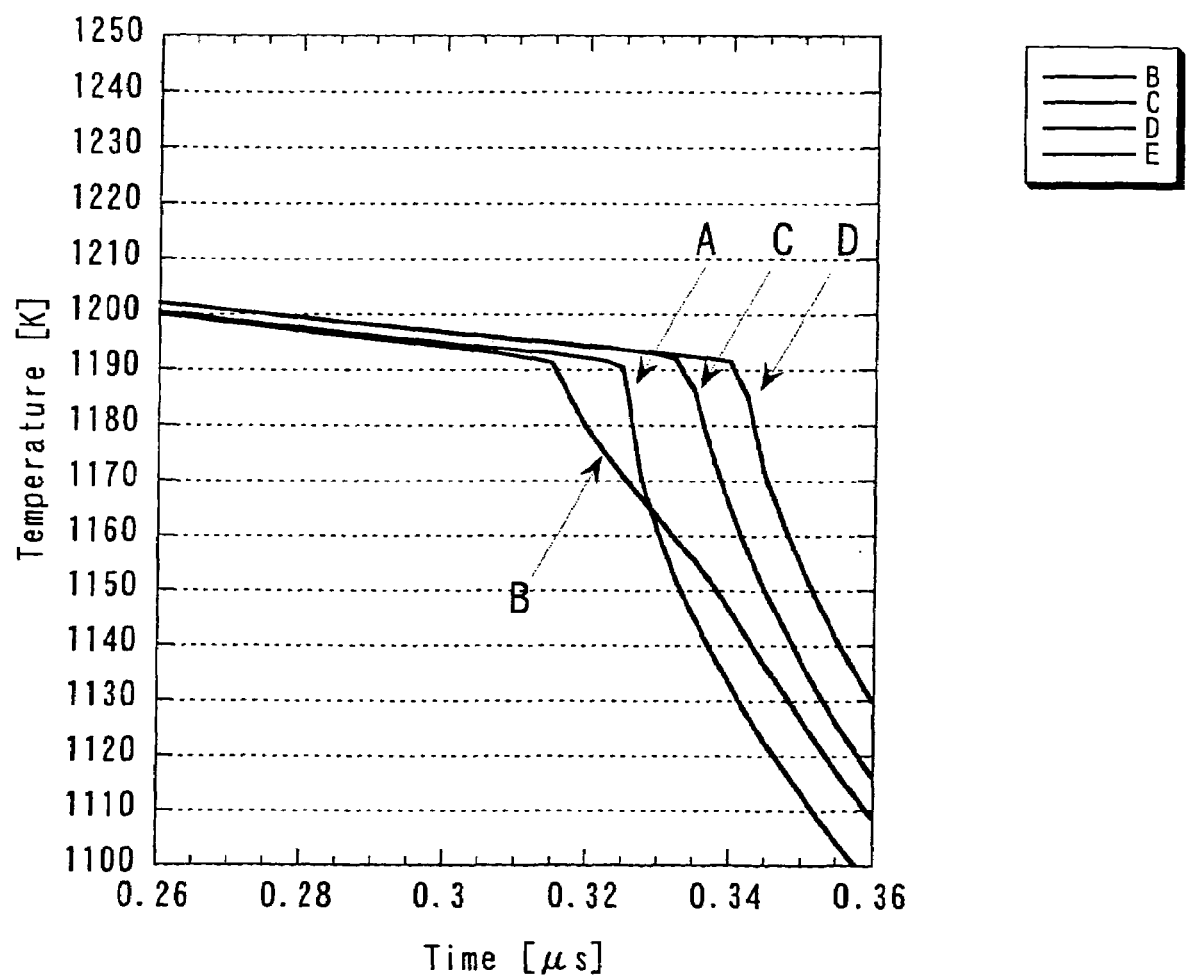
FIG. 18 is a graph showing the results of the thermal analysis simulation.

FIG. 16 is an example showing the structure of one pixel of the pixel portion 902, and TFTs 801 to 803 are prepared. These TFTs are switching TFTs, reset TFTs, and driver TFTs for controlling light emitting elements or liquid crystal elements prepared in the pixels.

Island-like semiconductor regions 812 to 814 containing channel formation regions of these TFTs are formed in alignment with openings 809 to 811 in a base insulating film formed in a layer below the semiconductor regions. The island-like semiconductor regions 812 to 814 can be formed based on Examples 1 to 5. Gate wirings 815 to 817 are formed over the island-like semiconductor regions 812 to 814, and a signal line 818, an electric power line 819, other types of wirings 820 and 821, and a pixel electrode 823 are formed through a passivation film and a planarizeing film.

The present invention can thus complete the display panel without causing any influence on the display panel.

Example 6

A process of manufacturing a so-called multi-channel TFT, which has a plurality of channel formation regions that are mutually separated from each other, by using the semiconductor device of the present invention, is discussed in Example 6.

Figure 21A:
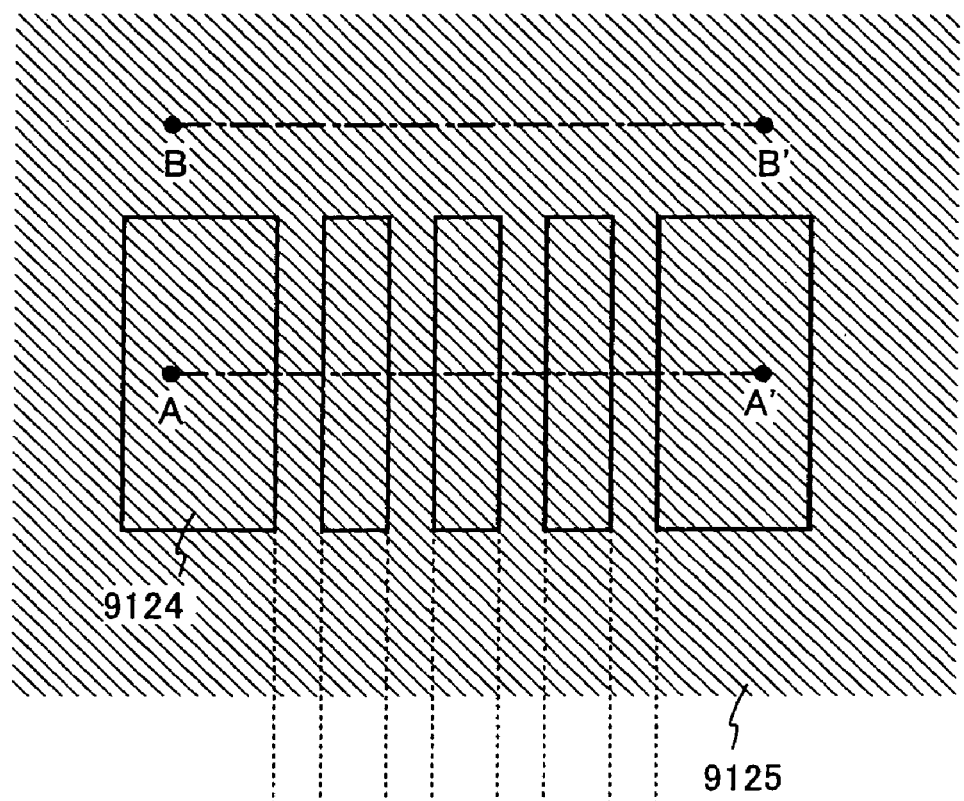
FIGS. 21A to 21C are diagrams showing a process of manufacturing a TFT of the present invention.
Figure 21B:
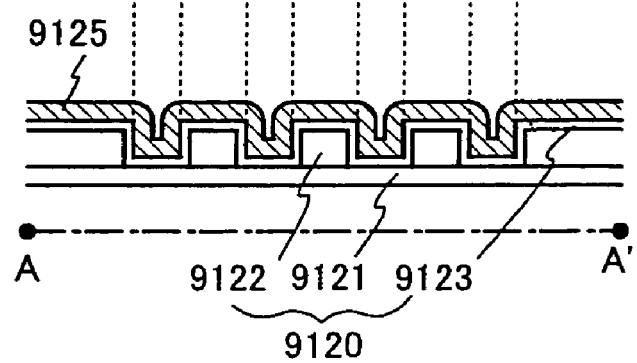
Figure 21C:
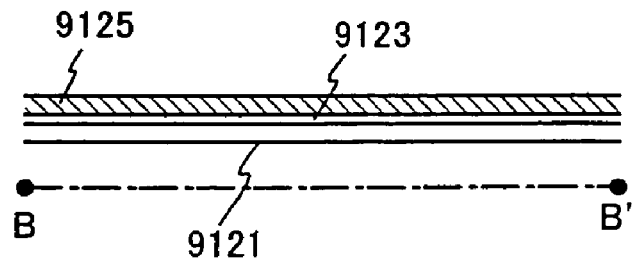

First, a base film 9120 having projections is formed on an insulating surface as shown in FIG. 21A. Note that a cross sectional diagram taken along a line segment A-A' of FIG. 21A is shown in FIG. 21B, and a cross sectional diagram taken along a line segment B-B' of FIG. 21A is shown in FIG. 21C.

The base film 9120 used in Example 6 has the same structure as that shown in the Embodiment Mode. The base film 9120 is composed of three base films. First, a second base film 9122 made from rectangular shape silicon oxide is formed on a first base film 9121 made from silicon nitride, and a third base film 9123 made from silicon oxide is formed so as to cover the first base film 9121 and the second base film 9122. The base film 9120 is formed by the first base film 9121, the second base film 9122, and the third base film 9123 in Example 6. Projections 9124 of the base film 9120 are structured by the rectangular shape second insulating film 9122 and by portions of the third insulating film 9123 that contact the second insulating film 9122 but do not contact the first insulating film 9121.

Note that, although a designer can suitably set the shapes and the sizes of the depressions 9124, it is necessary to set the thickness on an order such that cutoff of a later formed semiconductor film does not occur in the vicinity of edges of the projections 9124. The height of the depressions 9124 is set on the order of 0.1 to 1 μm in Example 6.

Note that distortions of the substrate cause influence to the shape of the base film later formed. Distortions of the base film become a cause of disturbances in the uniformity of the crystallinity of the semiconductor film formed later, and therefore the surface of the substrate may be polished using a chemical mechanical polishing method (CMP method) so that the distortion difference is suppressed to a level equal to or less than 10 nm, and the substrate may be heated in advance prior to forming the base film so that the substrate does not distort due to heat treatment processing in later process steps.

An amorphous semiconductor film 9125 is then formed covering the base film 9120. The non-single crystalline semiconductor film 9125 can be formed by using a known method (such as sputtering, LPCVD, or plasma CVD). The non-single crystalline semiconductor film 9125 is formed having a thickness of 300 nm by plasma CVD in Example 6.

Figure 22A:
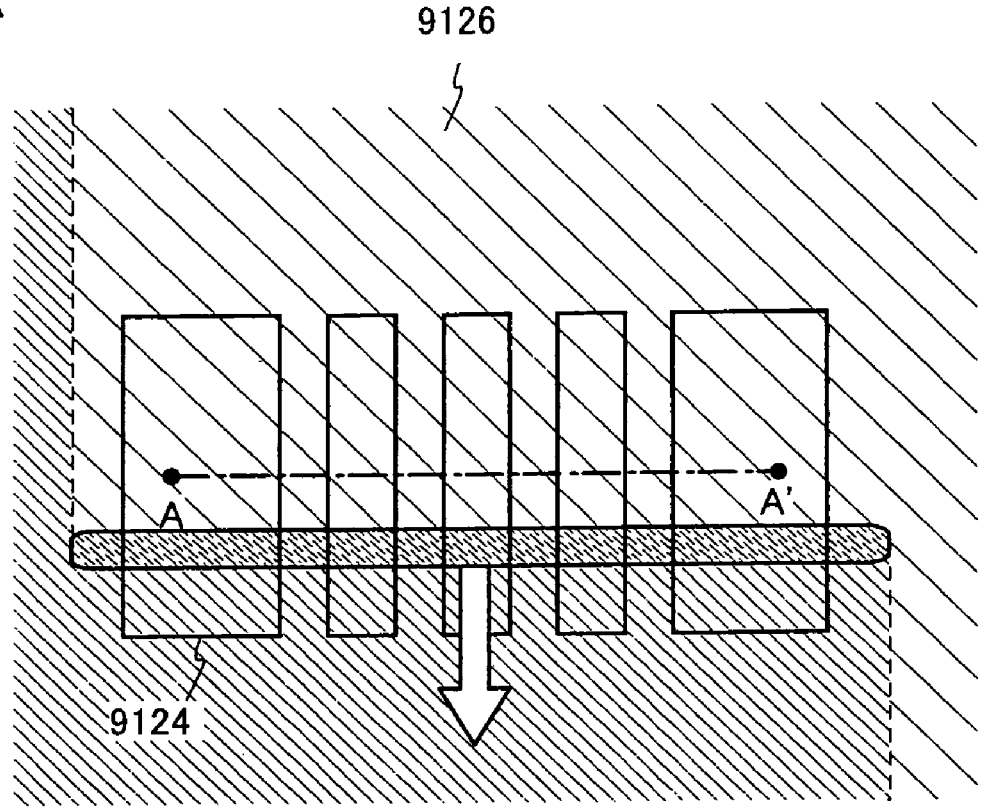
FIGS. 22A and 22B are diagrams showing the process of manufacturing a TFT of the present invention.
Figure 22B:
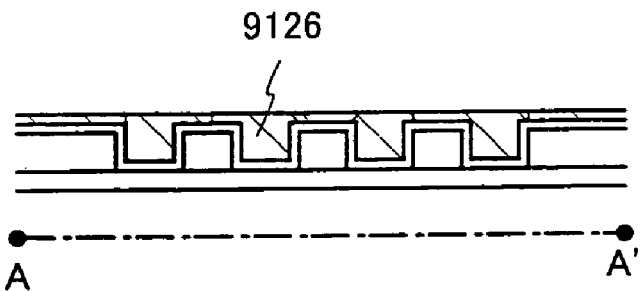

Laser light is next irradiated to the non-single crystal semiconductor film 9125 as shown in FIG. 22A, thus performing crystallization. Note that FIG. 22B corresponds to a cross sectional diagram taken along a dashed line segment A-A' of FIG. 22A. Irradiation is performed in Example 6 by using a continuous wave $YVO_4$ laser at a scanning speed of 50 cm/sec. The laser scanning direction at this point is such that it is aligned with the same direction as the carrier moves in channel formation regions formed later. Laser light is irradiated while the scanning direction is aligned with the longitudinal direction of the rectangular shape projections 9124 in Example 6, as shown by the arrow having a white center. The non-single crystal semiconductor film 9125 melts due to the irradiation of laser light, and its volume moves from the projections 9124 to the depressions, thus forming a crystalline semiconductor film 9126.

Figure 23A:
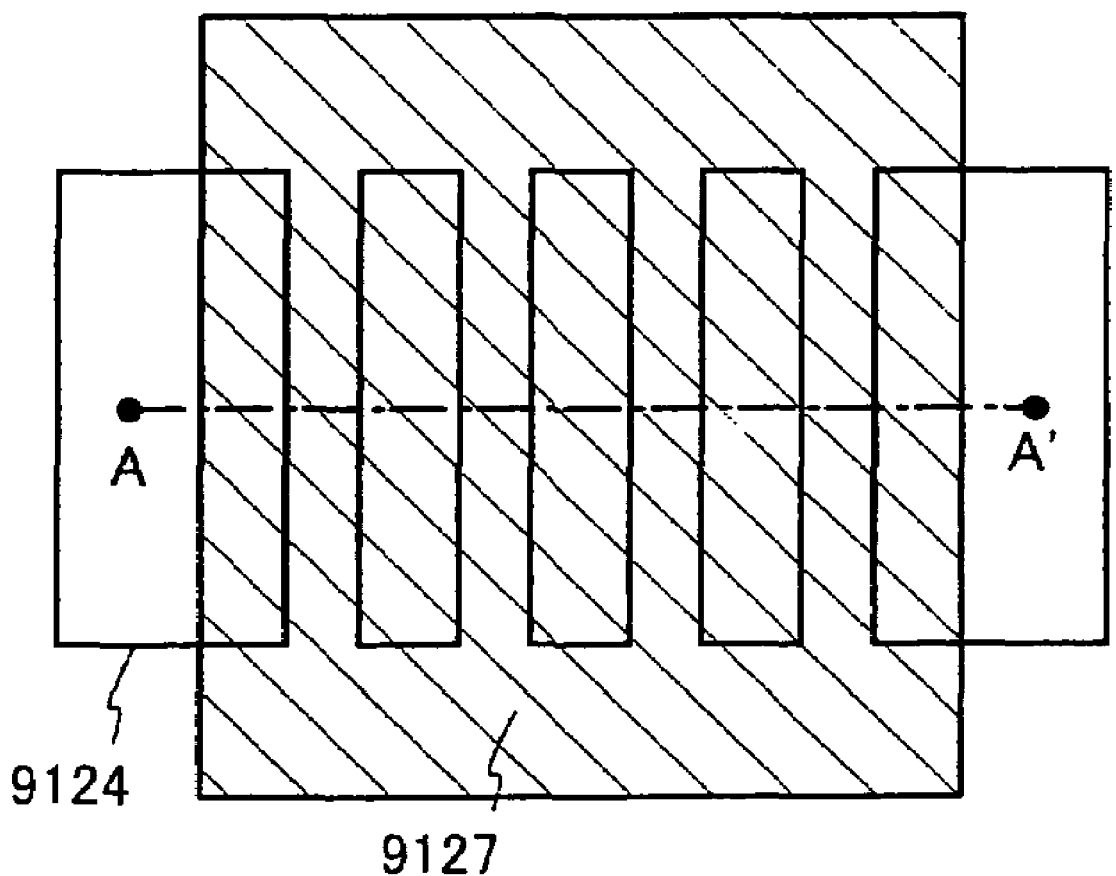
FIGS. 23A and 23B are diagrams showing the process of manufacturing a TFT of the present invention.
Figure 23B:
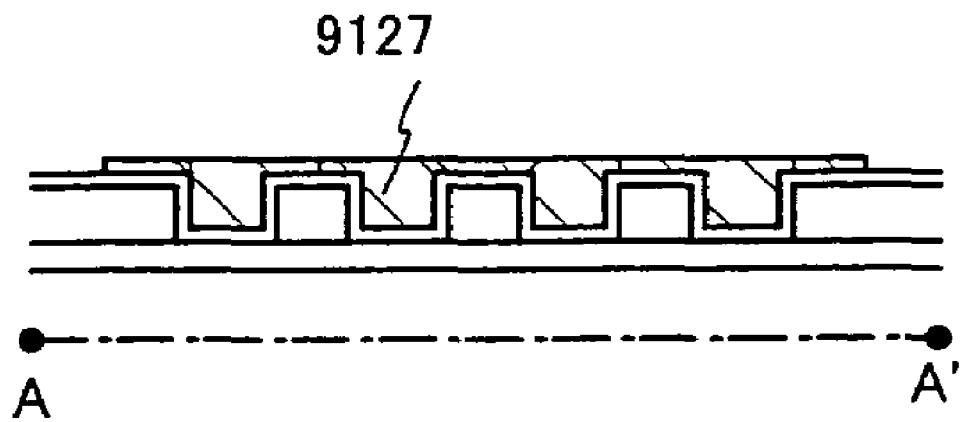

The crystalline semiconductor film 9126 is patterned next as shown in FIG. 23A, thus forming a sub-island 9127. Note that FIG. 23B corresponds to a cross sectional diagram of FIG. 23A along a dashed line segment A-A'. Portions of the sub-island 9127 exist on the projections formed between the depressions 9124. The channel formation regions of the objective multi-channel TFTs are formed using portions of the crystalline semiconductor film 9126 located on the depressions, and therefore it is essential that the positional relationship between the sub-island 9127 and the projections 9124 be determined by considering the number of channel formation regions, the channel length, and the channel width.

Figure 24A:
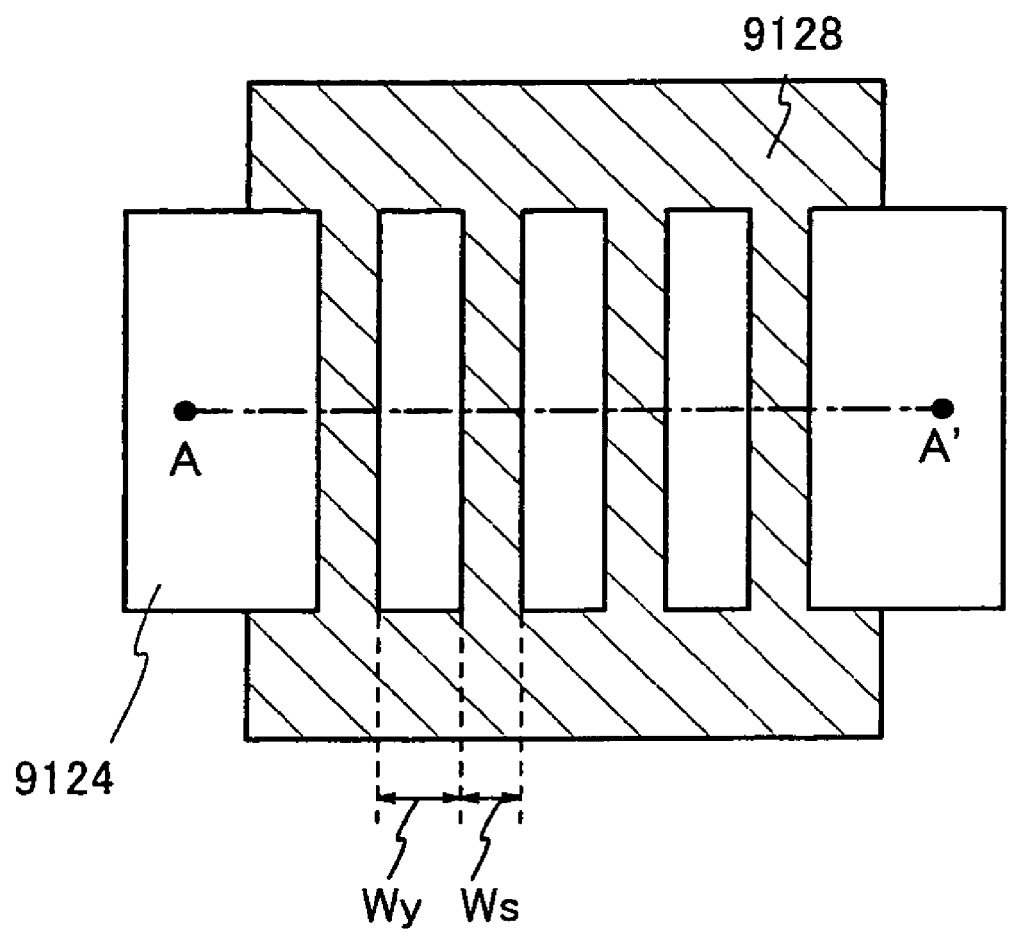
FIGS. 24A and 24B are diagrams showing the process of manufacturing a TFT of the present invention.

An island 9128 is formed next by removing the sub-island 9127 from an upper surface to an extent such that upper surfaces of the projections 9124 are exposed, as shown in FIG. 24A. Note that FIG. 24B corresponds to a cross sectional diagram taken along a dashed line segment A-A' of FIG. 24A. Removal of the sub-island 9127 from its upper surface may be performed by using any method, for example the removal may be performed by using etching, and may also be performed by using a CMP method.

Figure 24B:
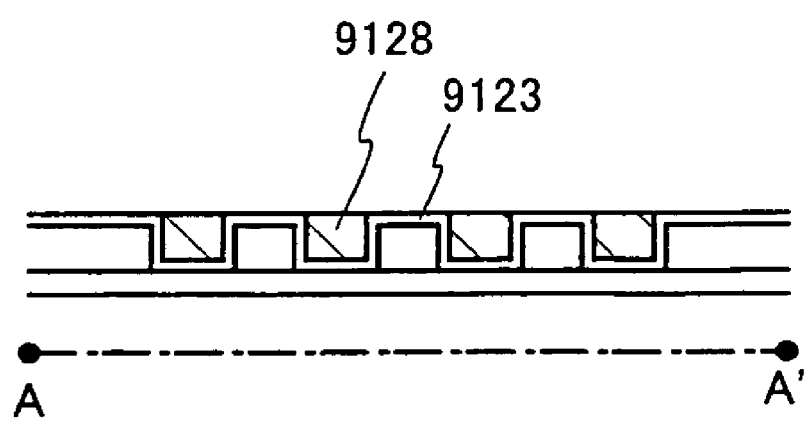

Portions in which grain boundaries exist on the projections 9124 are removed by performing removal from the upper surface of the sub-island 9127. Almost no grain boundaries exist on the depressions corresponding to spaces between the projections 9124, and crystalline semiconductor films having superior crystallinity remain in portions that later become channel formation regions. The slit shape island 9128 is in which only channel formation regions are separated is formed as shown in FIGS. 24A and 24B. Note that portions that become source regions or drain regions do not influence the TFT characteristics, due to the semiconductor film crystallinity, as much as the channel formation regions do. The portions that become source regions or drain regions therefore do not become much of a problem, even if their crystallinity is not good compared to the crystallinity of the portions that become the channel formation regions.

Figure 25A:
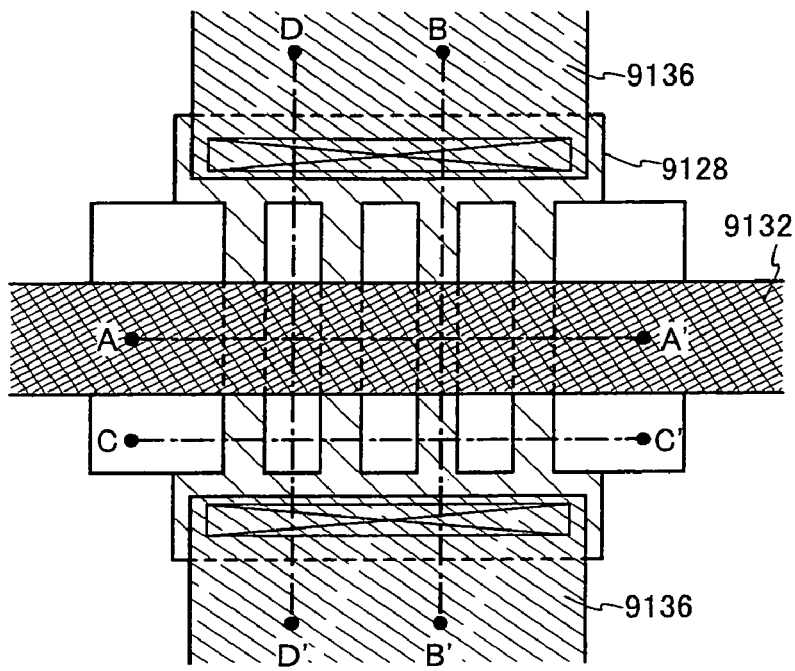
FIGS. 25A to 25C are diagrams showing the process of manufacturing a TFT of the present invention.
Figure 25B:
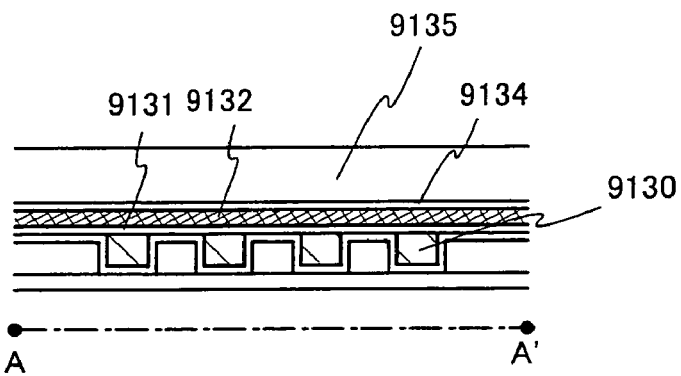

A TFT is manufactured next by using the island 9128, as shown in FIG. 25A. Note that there are various TFT structures and method of manufacturing TFTs. FIG. 25B corresponds to a cross sectional diagram taken along a dashed line segment A-A' of FIG. 25A, and FIG. 25C corresponds to a cross sectional diagram taken along a dashed line segment B-B' of FIG. 25A. FIG. 26A corresponds to a cross sectional diagram taken along a dashed line segment C-C' of FIG. 25A, and FIG. 26B corresponds to a cross sectional diagram taken along a dashed line segment D-D' of FIG. 25A.

A channel formation region 9130 in the island 9128 is overlapped with a gate electrode 9132, sandwiching a gate insulating film 9131 therebetween. Further, the channel formation region 9130 is similarly sandwiched by two impurity regions 9133 of the island 9128. Note that the two impurity regions 9133 function as a source region or a drain region.

A first interlayer insulating film 9134 is then formed covering the island 9128, the gate insulating film 9131, and the gate electrode 9132. A second interlayer insulating film 9135 is then formed covering the first interlayer insulating film 9134. Note that the first interlayer insulating film 9134 is an inorganic insulating film, and that impurities such as carbon in the second interlayer insulating film 9135 can be prevented from entering the island 9128. Further, the second interlayer insulating film 9135 is an organic resin film, and has an effect for planarizing the surface so that wirings formed later do not become cut.

A wiring 9136 that is connected to the impurity region 9133 through a contact hole formed in the gate electrode 9131, the first interlayer insulating film 9134, and the second interlayer insulating film 9135 is then formed on the second interlayer insulating film 9135.

A TFT having a plurality of mutually separated channel formation regions is thus completed by the above manufacturing processes. Heat generated by driving the TFT can be effectively dissipated by using this type of structure.

Figure 25C:
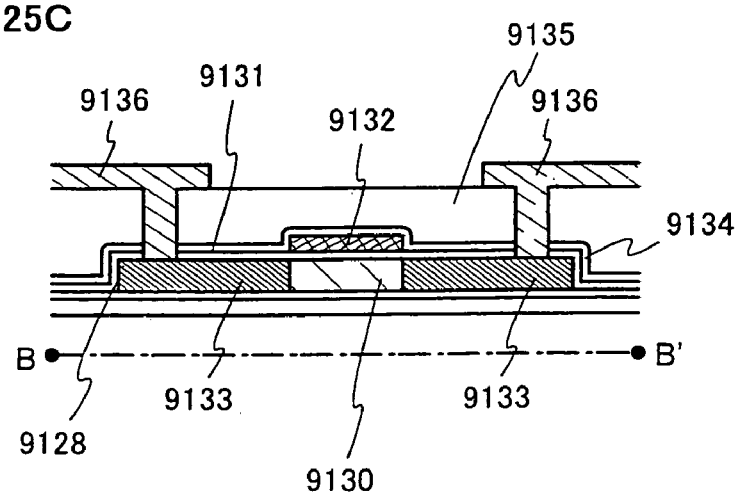
Figure 26A:
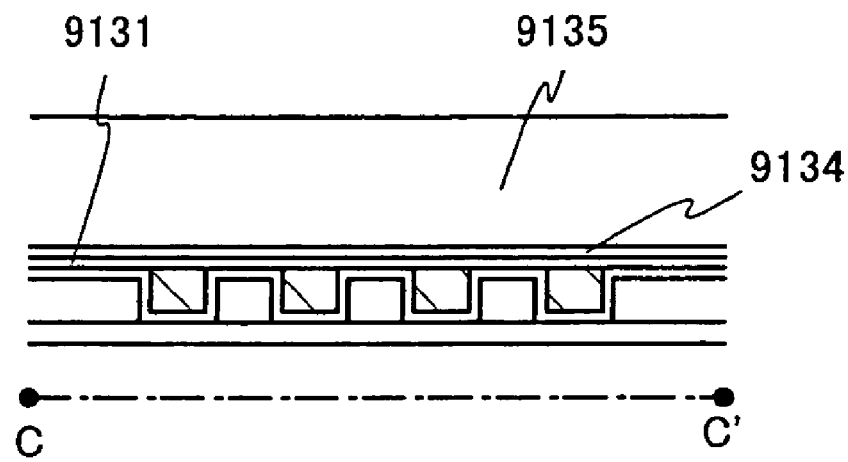
FIGS. 26A and 26B are cross sectional diagrams of a TFT.
Figure 26B:
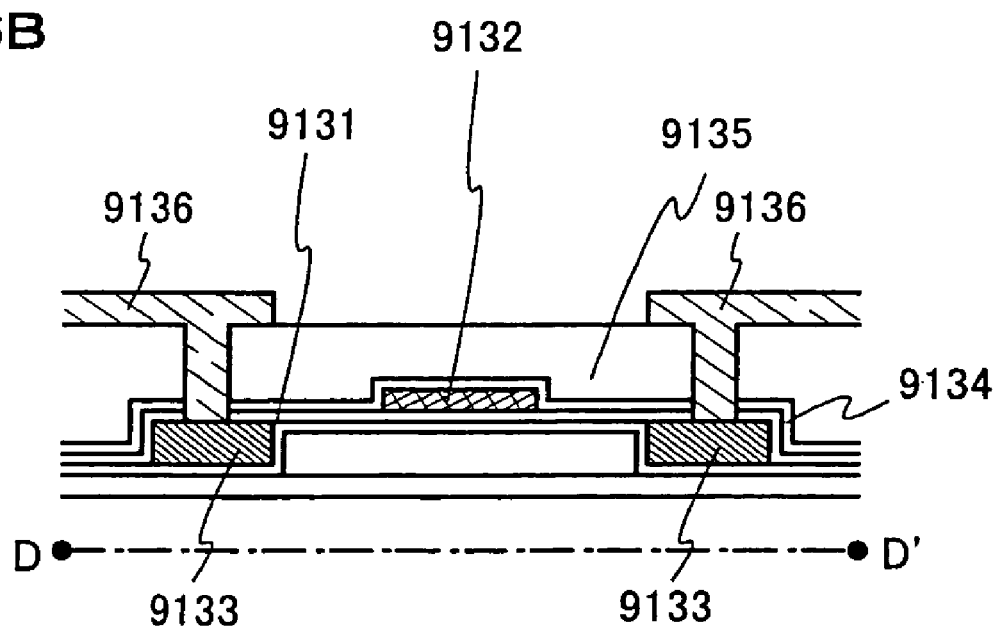

Note that the TFT structure is not limited to that shown in FIGS. 25A to 25C in the present invention. Further, the number of channel formation regions is not limited to four, and the number of channel formation regions present may be one, four, or other numbers than four.

Figure 27A:
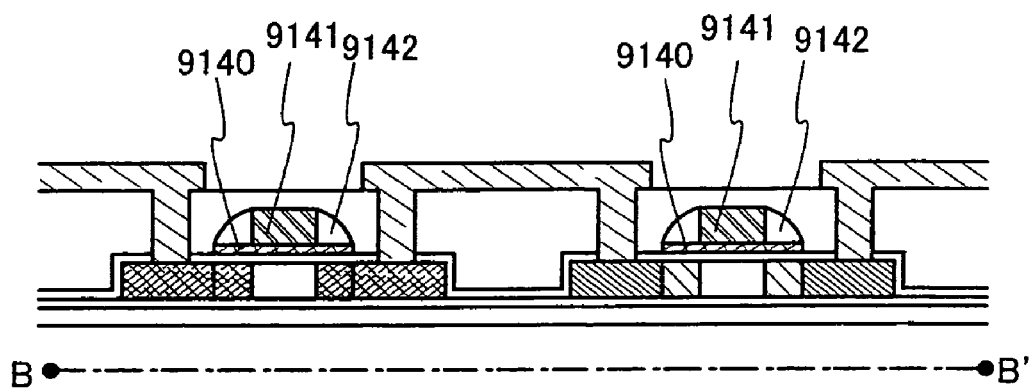
FIGS. 27A and 27B are cross sectional diagrams of a TFT.
Figure 27B:
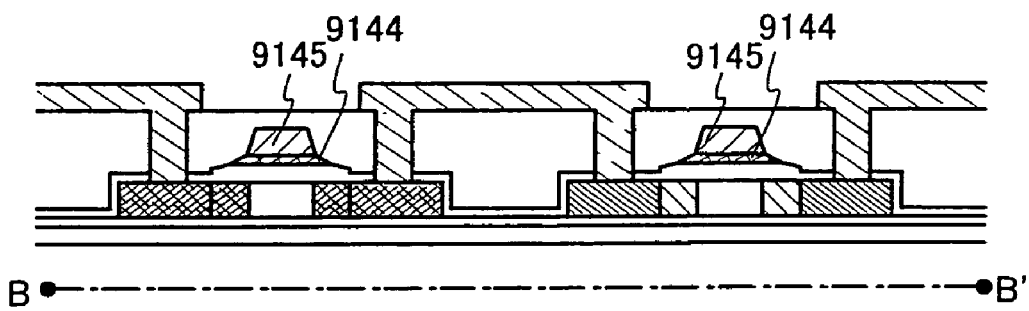

Further, the TFT structure is not limited to the aforementioned structure. For example, the TFT structure may have a structure like that shown in FIGS. 27A and 27B. The TFTs shown in FIG. 27A have gate electrodes composed of two layer conductive films 9140 and 9141. Sidewalls 9142 made from an insulating film are formed contacting upper surfaces of the conductive films 9140 and side surfaces of the conductive films 9141. For example, TaN can be used as the conductive films 9140, W can be used as the conductive films 9141, and $SiO_2$ or the like can be used as the sidewalls 9142. The TFTs shown in FIG. 28B have gate electrodes composed of two layer conductive films 9144 and 9145. The conductive films 9144 are overlapped with portions of impurity regions.

Note that stress which develops within the semiconductor film can be relieved by performing heat treatment at 500 to 600° C. for a period on the order of one minute to 60 minutes, after laser light irradiation or after etching the crystalline semiconductor film to an extent such that the projections 9124 of the base film are exposed.

The formation of grain boundaries in the TFT channel formation regions can be prevented by actively using the semiconductor films located on the depressions of the insulating film as TFT active layers, and conspicuous drops in the TFT mobility, reductions in the ON current, and increases in the OFF current, all due to grain boundaries, can all be prevented.

Example 7

A method of manufacturing an island in which the process order differs from that of Example 6 is explained in Example 7. Note that Example 6 may be referred to for detailed explanations of each process step.

First, a base film having rectangular shape projections 9301 is formed as shown in FIG. 28A, and a non-single crystal semiconductor film 9302 is formed on the base film. Laser light is next irradiated to the non-single crystal semiconductor film 9302, thus forming a crystalline semiconductor film 9303 (FIG. 28B).

Next, a portion of the crystalline semiconductor film 9303 is removed from its surface to an extent such that upper surfaces of the projections 9301 are exposed. Note that removal is performed using etching in Example 7, and the crystalline semiconductor film after removal becomes a crystalline semiconductor film (after etching) 9304 (FIG. 28C).

The crystalline semiconductor film (after etching) 9304 is patterned next, thus forming an island 9305 (FIG. 28D).

Note that stress which generates within the semiconductor film can be relieved by performing heat treatment at 500 to 600° C. for a period on the order of one minute to 60 minutes, after etching the crystalline semiconductor film to an extent such that the projections of the base film are exposed, or after forming the island.

Removal of edge portions and side portions of the island due to etching can be prevented in accordance with the above process steps by etching the crystalline semiconductor film to an extent such that the projections of the base film are exposed before forming the island.

Example 8

A method of manufacturing an island in which the process order differs from that of Example 6 and Example 7 is explained in Example 8. Note that Example 6 may be referred to for a detailed explanation of each process step.

First, a base film having projections with rectangular shape 9311 is formed as shown in FIG. 29A, and a non-single crystal semiconductor film 9312 is formed on the base film.

The non-single crystal semiconductor film 9312 is patterned next, thus forming a sub-island 9313 (FIG. 29B).

Laser light is irradiated to the sub-island 9313 next, thus causing crystallization. The sub-island after crystallization becomes a sub-island (after crystallization) 9314 in Example 8 (FIG. 29C).

Portions of the sub-island (after crystallization) 9314 are removed next from its surface, to an extent such that upper surfaces of the projections 9311 are exposed. Note that the removal is performed by etching in Example 8, thus forming an island 9315 (FIG. 29D).

Note that stress which develops within the semiconductor film can be relieved in accordance with the above process steps by performing heat treatment at 500 to 600° C. for a period on the order of one minute to 60 minutes, after laser light irradiation or after forming the island.

Example 9

An example of forming a multi-channel TFT and a single channel TFT having only one channel formation region by using a plurality of projections is explained in Example 9.

Figure 30A:
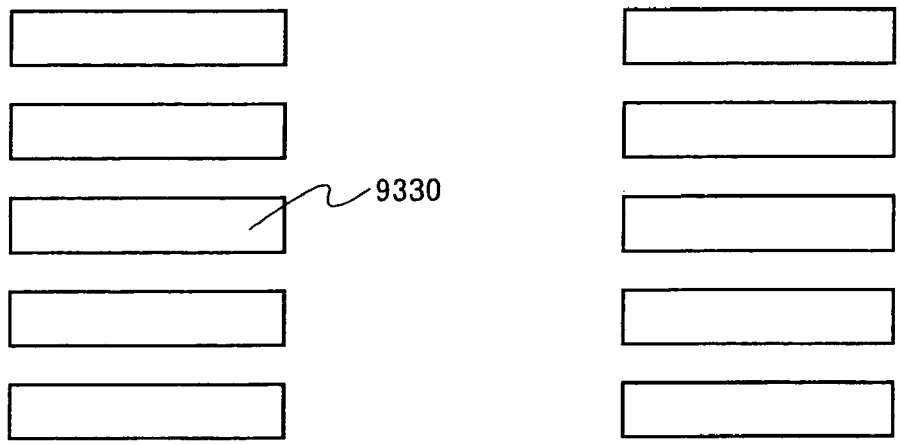
FIGS. 30A and 30B are upper surface diagrams of a plurality of TFTs formed on a base film.
Figure 30B:
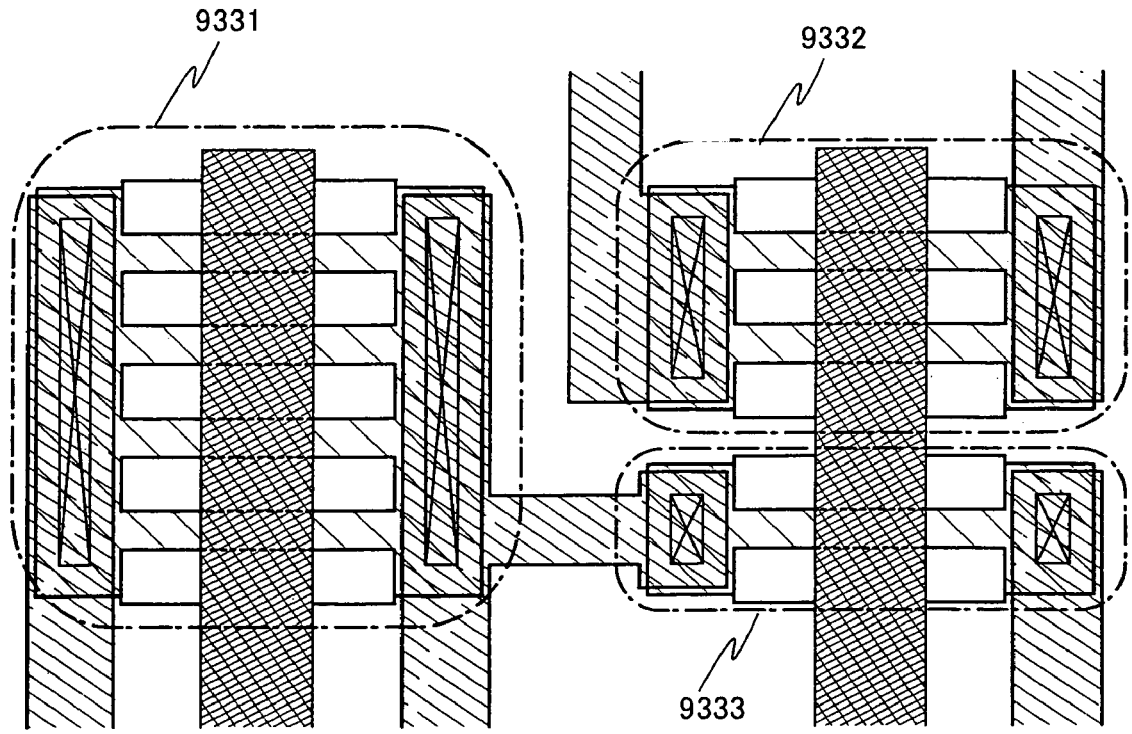

A base film having a plurality of rectangular shape projections 9330 is shown in FIG. 30A. TsFT that use islands formed on the base film are shown in FIG. 30B. FIG. 30B has a multi-channel TFT 9331 having four channel formation regions, a multi-channel TFT 9332 having two channel formation regions, and a single channel TFT 9333.

Each TFT is formed on a depressions located between the projections 9330. It is more preferable that the channel formation regions and LDD regions be formed on the depressions located between the projections 9330.

It is possible to implement Example 9 in combination with Examples 6 to 8.

Example 10

An example of combining a process of irradiating laser light with a process of crystallizing a semiconductor film using a catalyst when crystallizing the semiconductor film is explained in Example 10. It is preferable to use the techniques disclosed by JP 7-130652 A and JP 8-78329 A when using a catalyst element.

First, a non-single crystal semiconductor film 9352 is formed on a base film 9351 having projections 9350 as shown in FIG. 31A. Next, the non-single crystal semiconductor film 9352 is crystallized by using a catalytic element (FIG. 31B). For example, if the technique disclosed in JP 7-130652 A is used, then a nickel acetate solution containing nickel of 10 ppm is applied to the non-single crystal semiconductor film 9352, thus forming a nickel containing layer 9353. A dehydrogenation process is performed for one hour at 500° C., after which heat treatment is performed at 500 to 650° C. for 4 to 12 hours, for example at 550° C. for 8 hours, thus forming a crystalline semiconductor film 9354 having improved crystallinity. Note that, in addition to nickel (Ni), catalytic element capable of being used include the elements germanium (Ge), iron (Fe), palladium (Pd), tin (Sn), lead (Pb) cobalt (Co), platinum (Pt), copper (Cu), and gold (Au).

A crystalline semiconductor film (after LC) 9355 having additionally improved crystallinity is then formed by laser irradiation from the crystalline semiconductor film (after NiSPC) 9354 crystallized by NiSPC (FIG. 31C). The crystalline semiconductor film (after LC) 9355 melts once during laser light irradiation, and moves volumetrically from upper portions of the projections 9350 toward depressions, thus planarizing its surface. The film thickness on the projections 9350 becomes thin, and grain boundaries 9356 easily generate due to stress.

A process for gettering the catalytic element within the crystalline semiconductor film (after LC) 9355 is explained next. Note that, although gettering is performed after laser light irradiation in Example 10, it may also be performed after etching the crystalline semiconductor film (after LC) 9355.

A barrier layer 9357 having silicon as its main constituent is then formed on the crystalline semiconductor film (after LC) 9355 (FIG. 31D). Note that the barrier layer 9357 may be extremely thin, may be a film oxide naturally, and may be an oxide film oxidized by generating ozone by ultraviolet light irradiation under an atmosphere containing oxygen. Further, an oxide film oxidized by a liquid containing ozone and used during surface processing referred to as hydro-washing and performed in order to remove carbon, that is organics, may also be used. The barrier layer 9357 is mainly used as an etching stopper. Further, channel doping may be performed after forming the barrier layer 9357, after which activation may be performed by irradiating strong light.

A first semiconductor film 9358 used in gettering is next formed on the barrier layer 9357. The first semiconductor film 9358 used for gettering may be a semiconductor film having an amorphous structure, and may also be a semiconductor film having a crystalline structure. The film thickness of the first semiconductor film 9358 used for gettering is set from 5 to 50 nm, preferably from 10 to 20 nm. It is preferable to increase the gettering efficiency by including oxygen in the first semiconductor film 9358 used for gettering (at a SIMS analysis concentration equal to or greater than $5\times10^{18}$ atoms/cm$^3$, preferably equal to or greater than $1\times10^{19}$ atoms/cm$^3$).

A third semiconductor film (gettering site) 9359 containing an inert gas element is formed next to the first semiconductor film 9358 used for gettering. The second semiconductor film 9359 used for gettering may be a semiconductor film having an amorphous structure, or a semiconductor film having a crystal structure, and may be formed by using plasma CVD, low pressure thermal CVD, or sputtering. The second semiconductor film may be a semiconductor film containing an inert gas element at the film formation stage, and an inert gas element may also be added after film formation of a semiconductor film that does not contain a inert gas element. The example shown in Example 10 is one in which the second semiconductor film 9359 used for gettering and containing an inert gas element at the film formation stage is formed, after which an additional inert gas element is selectively added, thus forming the second semiconductor film 9359 used for gettering. Further, the first semiconductor film and the second semiconductor film used for gettering may be formed in succession without exposure to the outside atmosphere. Furthermore, the sum of the film thickness of the first semiconductor film and the film thickness of the second semiconductor film may be set from 30 to 200 nm, for example 50 nm.

A gap is prepared between the crystalline semiconductor film (after LC) 9355 and the second semiconductor film 9359 by the first semiconductor film 9358 used for gettering. Impurity elements such as metals existing within the crystalline semiconductor film (after LC) 9355 tend to easily aggregate in the vicinity of gettering site boundaries during gettering, and therefore it is preferable to increase efficiency by placing the gettering boundaries far from the crystalline semiconductor film (after LC) 9355 by employing the first semiconductor film 9358 used for gettering as in Example 10. In addition, the first semiconductor film 9358 used for gettering also has a blocking effect so that the impurity elements contained in the gettering site do not diffuse and reach the interface with the first semiconductor film. Further, the first semiconductor film 9358 used in gettering also has a protective effect so that damage is not caused to the crystalline semiconductor film (after LC) 9355 in the case where an inert gas element is added.

Gettering is performed next. Heat treatment may be performed within a nitrogen atmosphere at a temperature of 450 to 800° C. for one to 24 hours, for example at 550° C. for 14 hours, as a process for performing gettering. Further, intense light may also be irradiated instead of heat treatment. Furthermore, a heated gas may be injected so as to heat the substrate. In this case heating may be performed for 1 to 60 minutes at a temperature from 600° C. to 800° C., more preferably from 650° C. to 750° C., thus reducing the processing time. Impurity elements thus move in the second semiconductor film 9359 as shown by the arrows in FIG. 31D by this gettering. Removal of the impurity elements, or a reduction in concentration of the impurity elements, contained in the crystalline semiconductor film (after LC) 9355 that is covered by the barrier layer 9357 is thus performed. A crystalline semiconductor film (after gettering) 9360 that contains almost no impurity elements, wherein the impurity element concentration is equal to or less than $1\times10^{18}$ atoms/cm$^3$, preferably equal to or less than $1\times10^{17}$ atoms/cm$^3$, is formed by gettering.

Next, the first semiconductor film 9358 used for gettering and the second semiconductor film 9359 are selectively removed with the barrier layer 9357 used as an etching stopper.

After then changing the etching conditions and removing the barrier layer 9357, as shown in FIG. 31E, the crystalline semiconductor film (after gettering) 9360 is etched to an extent such that upper surfaces of the projections 9350 are exposed, thus forming crystalline semiconductor films 9361 in the depressions.

Note that crystal growth may also be performed by irradiating laser light, not SPC, after applying a solution containing a catalytic element to the semiconductor film before crystallization. Further, gettering may also use the techniques recorded in JP 10-135468, JP 10-135469, or the like.

Note that although gettering is performed after laser light irradiation in Example 10, the present invention is not limited to this structure. Gettering may also be done after performing the etching of FIG. 31E.

It is possible to implement Example 10 in combination with Examples 6 to 9.

Example 11

The structure of a laser irradiation apparatus used in the present invention is explained next using FIG. 32. Reference numeral 9151 denotes laser oscillation apparatuses. Four laser oscillation apparatuses are used in FIG. 32, but the laser oscillation apparatuses of laser irradiation apparatus is not limited to this number.

Note that the laser oscillation apparatuses 9151 may be kept at a constant temperature by using a chiller 9152. It is not always necessary to use the chiller 9152, but dispersions in the energy of the output laser light due to temperature can be suppressed by maintaining the laser oscillation apparatuses 9151 at a constant temperature.

Further, reference numeral 9154 denotes an optical system, and laser light can be condensed by changing the path of the light output from the laser oscillation apparatuses 9151 and by processing the shape of the laser beam. In addition, the optical system 9154 in the laser irradiation apparatus of FIG. 32 can also synthesize the laser beams of laser light output from the plurality of laser oscillation apparatuses 9151 by making portions of the laser beams overlapped with each other.

Note that an AO modulator 9153 which changes the direction of advance of the laser light in an extremely short period of time may also be formed in the light path between a substrate 9156 to be processed and the laser oscillation apparatuses 9151. Further, an attenuator (filter for regulating the amount of light) may be formed as a substitute for the AO modulator 9153, and the energy density of the laser light may be regulated.

Further, a measuring means (energy density measuring means) 9165 for measuring the laser light energy density output from the laser oscillation apparatuses 9151 may be placed in the light path between the substrate 9156 to be processed and the laser oscillation apparatuses 9151. Variations over time of the measured energy density may be observed in a computer 9160. In this case, the output from the laser oscillation apparatuses 9151 may also be increased so as to compensate for attenuation in the energy density of the laser light.

The synthesized laser beam is irradiated to the substrate 9156 to be processed through a slit 9155. It is preferable that the slit 9155 be capable of blocking laser light, and that it be formed by a substance that is not changed or damaged by the laser light. The slit width of the slit 9155 is variable, and the width of the laser beam can be changed by the slit width.

Note that the shape of the laser beam of laser light emitted from the laser oscillation apparatuses 9151 not through the slit 9155 on the substrate 9156 differs by the laser type, and further, can be formed by the optical system.

The substrate 9156 is placed on a stage 9157. Position controlling means 9158 and 9159 correspond to means for controlling the position of the laser beam on the piece to be processed, and the position of the stage 9157 is controlled by the position controlling means 9158 and 9159 in FIG. 32.

Figure 32:
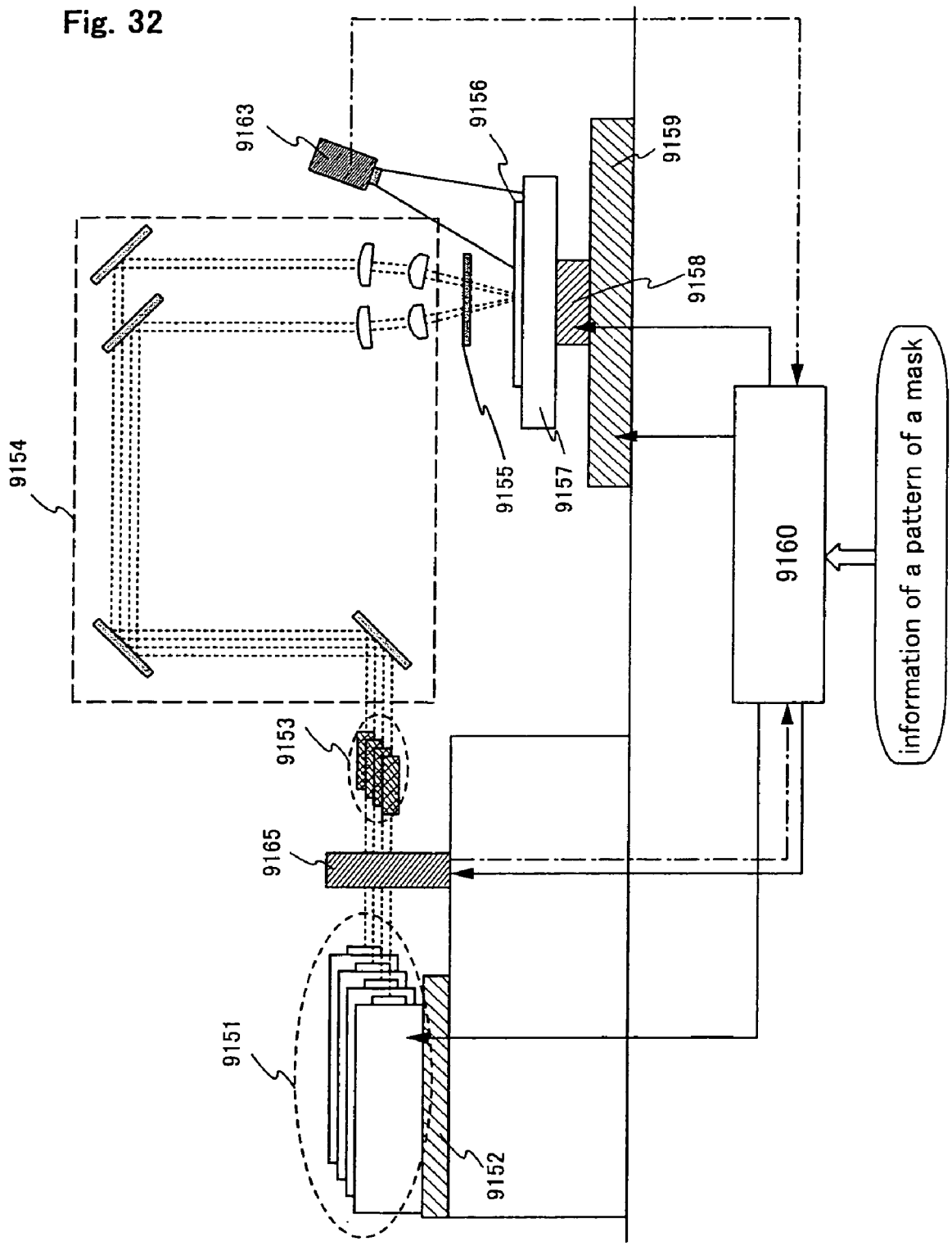
FIG. 32 is a diagram of a laser irradiation apparatus.

The position controlling means 9158 performs control of the position of the stage 9157 in the x-direction in FIG. 32, and the position controlling means 9159 performs position control of the stage 9157 in the y-direction.

Further, the laser irradiation apparatus of FIG. 32 has the computer 9160 prepared with both a storing means, such as memory, and a central operational processing apparatus. The computer 9160 controls the emission of the laser oscillation apparatuses 9151, determines the scanning path of the laser light, and moreover can control the position controlling means 9158 and 9159 so that the laser beam of laser light is scanned along a determined path to move the substrate to the predetermined position.

Note that, although the position of the laser beam in FIG. 32 is controlled by moving the substrate, it may also be moved by using an optical system such as a galvano mirror, and both methods may also be used.

In addition, the width of the slit 9155 is controlled by the computer 9160 in FIG. 32, but the width of the laser beam may also be changed in accordance with mask pattern information. Note that it is not always necessary to form the slit.

In addition, the laser irradiation apparatus may also be provided with a means for regulating the temperature of the piece to be processed. Further, the laser light is light having directivity and a high energy density, and therefore a damper may be formed so that reflected light is prevented from being irradiated to inappropriate locations. It is preferable that the damper have reflected light absorbing qualities, and chilled water may be circulated within the damper in order to prevent the barrier temperature from rising due to absorption of reflected light. Further, a means for heating the substrate (substrate heating means) may also be formed on the stage 9157.

Note that a marker laser oscillation apparatus may also be provided in the case where a marker is formed by laser. In this case, the emission of the marker laser oscillation apparatus may be controlled by the computer 9160. In addition, an optical system for condensing the laser light output from the marker laser oscillation apparatus may also be specially provided in the case where the marker laser oscillation apparatus is used. Note that YAG lasers, $CO_2$ lasers, and the like can be given as typical lasers used when forming the marker, and naturally it is possible to form the marker by using other lasers.

Further, one CCD camera 9163, or a plurality of the CCD cameras 9163 depending upon the circumstances, may also be formed for position alignment using the marker. Note that the term CCD camera denotes a camera that uses a CCD (charge coupled element) as a photographic element.

Note that an insulating film pattern or a semiconductor film pattern may also be recognized by the CCD camera 9163, and position alignment for the substrate may be performed, without forming the marker. In this case, insulating film or semiconductor film pattern information due to a mask and input to the computer 9160 is compared to actual insulating film or semiconductor film pattern information collected by the CCD camera 9163, and information on the position of the substrate can be ascertained. It is not necessary to specially form the marker in this case.

Further, laser light incident on the substrate is reflected by the surface of the substrate, and returned along the same path as when being incident. Thus so-called returned light exerts adverse influences such as changing the laser output and its frequency, and destroying rods. An isolator may therefore be disposed in order to remove the returned light and stabilize the laser emission.

Figure 33:
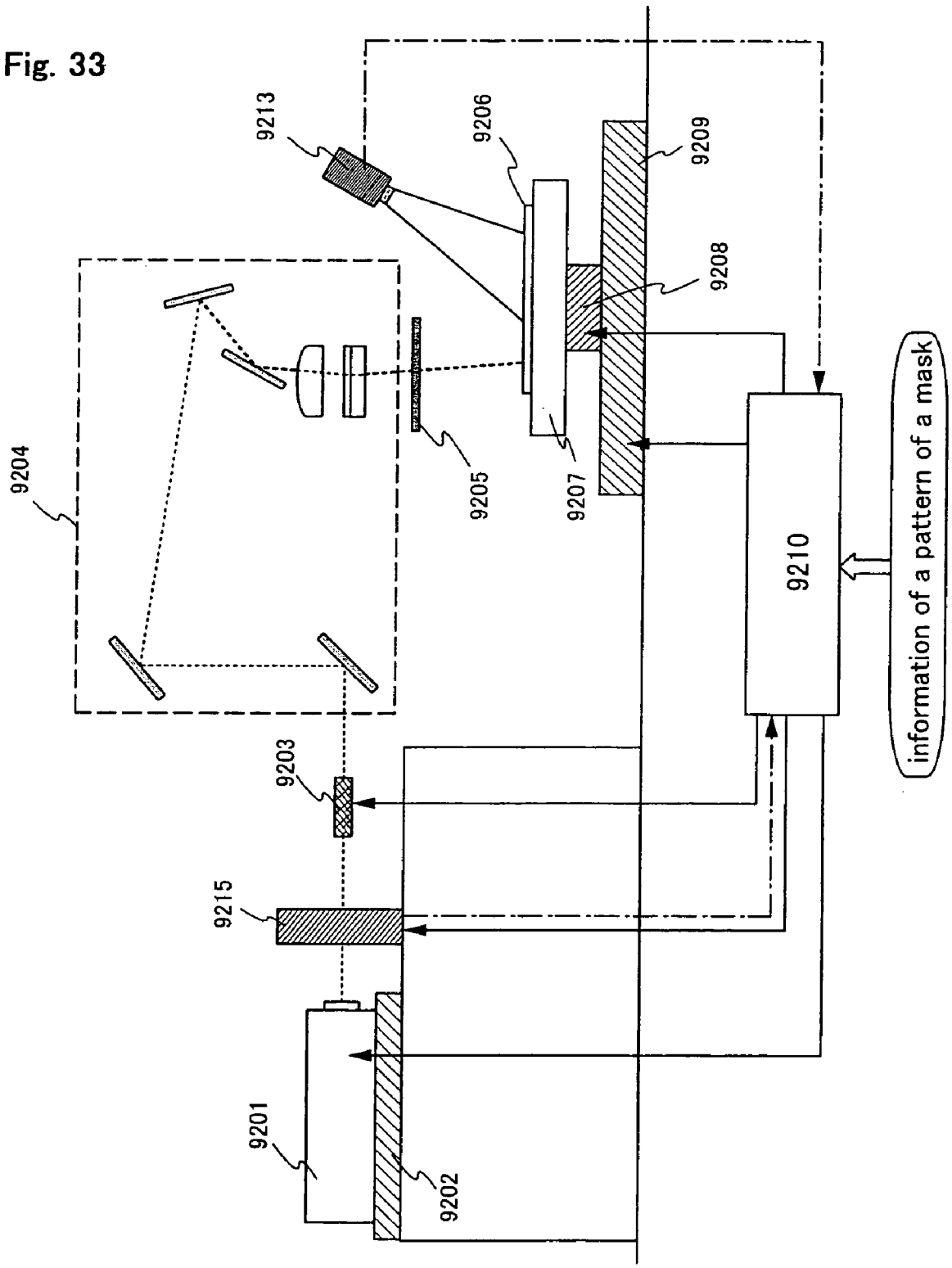
FIG. 33 is a diagram of a laser irradiation apparatus.

Note that although a structure in which a plurality of laser oscillation apparatuses are provided is shown in FIG. 32, one laser oscillation apparatus may also be used. The structure of a laser irradiation apparatus having one laser oscillation apparatus is shown in FIG. 33. Reference numeral 9201 in FIG. 33 denotes a laser oscillation apparatus, and reference numeral 9202 denotes a chiller. Further, reference numeral 9215 denotes an energy density measuring means, reference numeral 9203 denotes an AO modulator, reference numeral 9204 denotes an optical system, reference numeral 9205 denotes a slit, and reference numeral 9213 denotes a CCD camera. A substrate 9206 is disposed on a stage 9207, and the position of the stage is controlled by an x-direction position controlling means 9208 and a y-direction position controlling means 9209. Operation of each means of the laser irradiation apparatus is then controlled by a computer 9210, similarly to the structure shown in FIG. 32. Differing from FIG. 32 is that there is one laser oscillation apparatus. Further, the optical system 9204 may have a function of condensing the one laser light, differing from the case of FIG. 32.

Note that the laser light is not scanned and irradiated over the entire semiconductor film, but the laser light is scanned so that the minimum amount of crystallization of, at minimum, indispensable portions is performed. Time for irradiating the laser light to portions that are removed by patterning after crystallizing the semiconductor film can be omitted, and the amount of processing time per single substrates can be greatly reduced.

It is possible to implement Example 11 in combination with Examples 6 to 10.

Example 12

A method of forming a base film having depressions and projections is explained in Example 12.

Figure 34A:
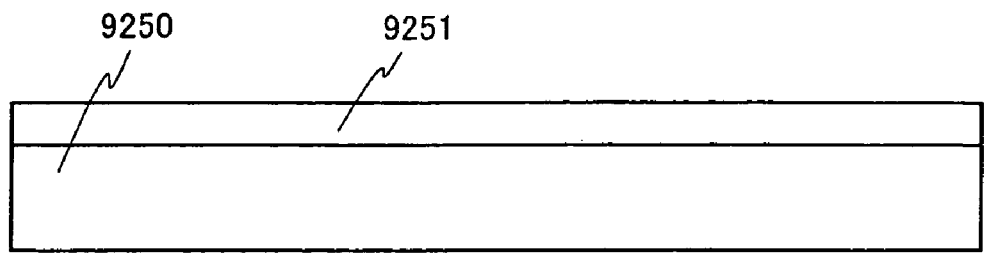
FIGS. 34A to 34D are diagrams showing a process of manufacturing a base film having a projection.

At first, a first base film 9251 is formed from an insulating film on a substrate 9250 as shown in FIG. 34A. The first base film 9251 uses silicon oxynitride in Example 12 but is not limited to this material, and insulating films having a large selectivity in etching with a second base film may be used. The first base film 9251 is formed by a CVD apparatus using $SiH_4$ and $N_2O$ so that its thickness is from 50 to 200 nm. Note that the first base film may be a single layer, and may also be a laminated structure of a plurality of insulating films.

Figure 34B:
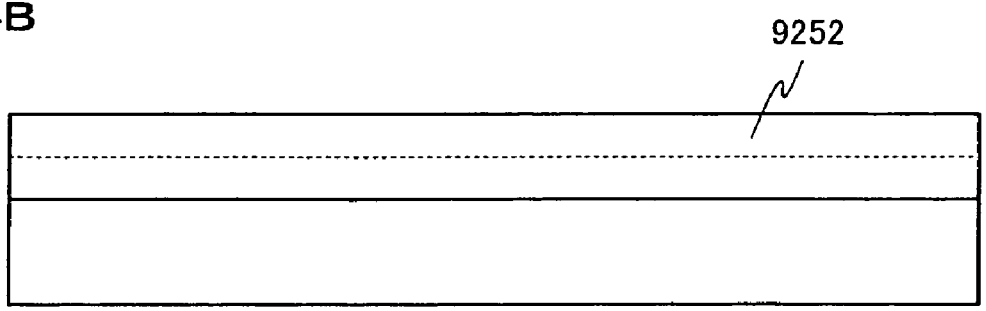

A second base film 9252 is formed next from an insulating material in contact with the first base film 9251, as shown in FIG. 34B. It is necessary that the film thickness of the second base film 9252 be of an order such that depressions and projections appear in the surface of a semiconductor film formed subsequently when patterning is performed in a later step, forming depressions and projections. A 30 nm to 300 nm silicon oxide film is formed as the second base film 9252 by using plasma CVD in Example 12.

Figure 34C:
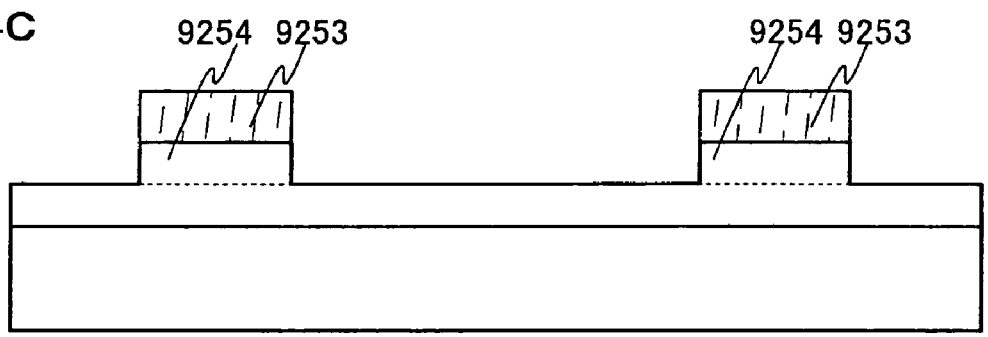
Figure 34D:
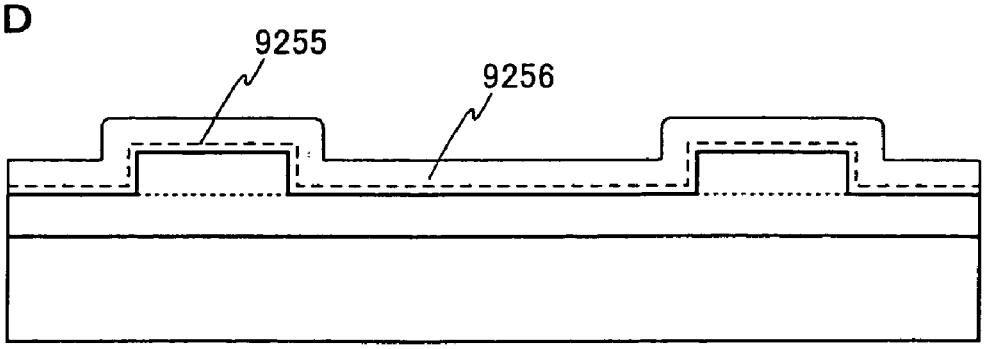

A mask 9253 is formed next as shown in FIG. 34C, and the second base film 9252 is etched. Note that wet etching is performed at 20° C. in Example 12, using a mixed solution containing 7.13% ammonium hydrogen fluoride ($NH_4HF_2$) and 15.4% ammonium fluoride ($NH_4F$) (Stella Chemifa Corporation, product name LAL500) as an etchant. Projections with rectangular shape 9254 are formed by this etching. The first base film 9251 and the projections 9254 are taken as one base film in this specification.

Note that it is preferable to pattern the second base film 9252 by using RF sputtering in the case where aluminum nitride, aluminum oxynitride, or silicon nitride is used as the first base film 9251 and a silicon oxide film is used as the second base film 9252. The thermal conductivity of aluminum nitride, aluminum oxynitride, and silicon nitride as the first base film 9251 is high, and therefore generated heat can quickly diffuse, and TFT deterioration can be prevented.

A semiconductor film is formed next so as to cover the first base film 9251 and the projections 9254. The thickness of the projections is from 30 nm to 300 nm in Example 12, and therefore it is preferable to set the film thickness of the semiconductor film from 50 to 200 nm, and it is set to 60 nm here. Note that adverse influences are caused to the semiconductor film crystallinity if impurities are contaminated between the semiconductor film and the base film. There is a possibility that variations in the characteristics of the manufactured TFTs, and that variations in the threshold voltages may increase, and therefore it is preferable to form the base film and the semiconductor film in succession. A silicon oxide film 9255 is formed thinly on the base film in Example 12 after forming the first base film 9251 and the projections 9254, and the semiconductor film 9256 is then formed without exposure to the outside atmosphere. The thickness of the silicon oxide film can be suitably set by a designer, and is set on the order of 5 nm to 30 nm in Example 12.

Figure 35A:
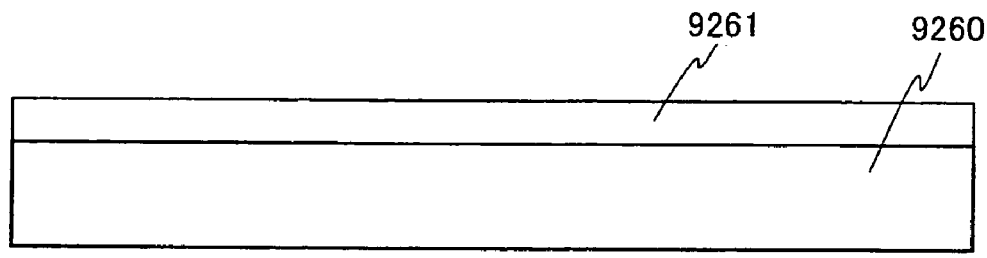
FIGS. 35A to 35C are diagrams showing a process of manufacturing a base film having a projection.

A method of forming a base film that differs from that of FIG. 34 is explained next. A first insulating film 9261 made from an insulating film is first formed on a substrate 9260 as shown in FIG. 35A. The first base film is formed by a silicon oxide film, a silicon nitride film, a silicon oxynitride film, or the like.

If a silicon oxide film is used, it can be formed by plasma CVD by mixing tetraethyl orthosilicate (TEOS) and $O_2$, at a reaction pressure of 40 Pa, at a substrate temperature of 300 to 400° C., and by discharging at a high frequency (13.56 MHz) electric power density of 0.5 to 0.8 W/cm². If a silicon oxynitride film is used, it may be formed by a silicon oxynitride film manufactured by plasma CVD from $SiH_4$, $N_2O$, and $NH_3$, or by a silicon oxynitride film manufactured by plasma CVD from $SiH_4$ and $N_2O$. The manufacturing conditions in this case are that formation can occur at a reaction pressure of 20 to 200 Pa, a substrate temperature of 300 to 400° C., and a high frequency (60 MHz) electric power density of 0.1 to 1.0 W/cm². Further, a hydrogen silicon oxynitride film manufactured from $SiH_4$, $N_2O$, and $H_2$ may also be applied. It is possible to manufacture silicon nitride films similarly by plasma CVD using $SiH_4$ and $NH_3$.

Figure 35B:
Figure 35C:
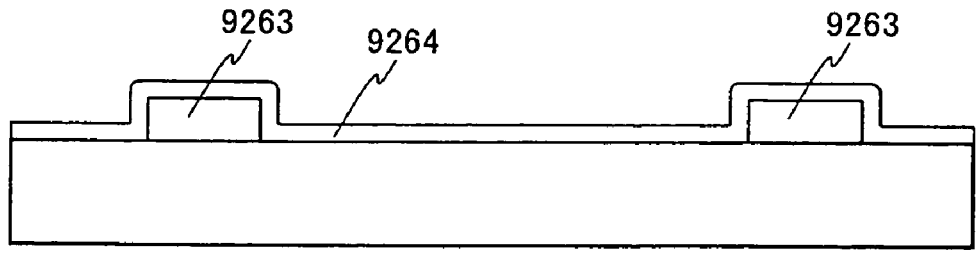

After forming the first base film over the entire substrate to have a thickness of 20 to 200 nm (preferably between 30 and 60 nm), a mask 9262 is then formed as shown in FIG. 35B by using a photolithography technique. Unnecessary portions are then removed by etching, thus forming rectangular shape projections 9263. A dry etching method that uses a fluoride gas with respect to the first base film 9261 may be used, and a wet etching method that uses an aqueous solution of a fluoride may be used. In the case where the latter method is selected, etching may be performed by a mixed solution (Stella Chemifa Corporation, product name LAL500) containing 7.13% ammonium hydrogen fluoride ($NH_4HF_2$) and 15.4% ammonium fluoride ($NH_4F$).

A second base film 9264 made from an insulating film is formed next so as to cover the projections 9263 and the substrate 9260. This film is formed by using a silicon oxide film, a silicon nitride film, a silicon oxynitride film, or the like at a thickness from 50 to 300 nm (preferably from 100 to 200 nm), similar to the first base film 9261.

A base film composed of the projections 9263 and the second base film 9264 is formed in accordance with the above manufacturing processes. Note that impurities can be prevented from contamination between the semiconductor film and the base film by forming the semiconductor film in succession, without exposure to the atmosphere, after forming the second base film 9264.

It is possible to implement Example 12 by being freely combined with Examples 6 to 11.

Example 13

The shape of a laser beam synthesized by mutual overlap of varying laser beams is explained in Example 13.

Figure 36A:
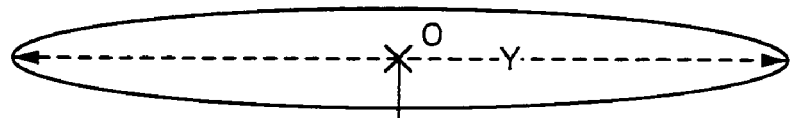

An example of the shape of a laser beam on a processing piece, for a case in which laser light emitted from a plurality of laser oscillation apparatuses does not pass through a slit, is shown in FIG. 36A. The laser beams shown in FIG. 36A have elliptical shapes. Note that the shape of the laser beam of laser light emitted from a laser oscillation apparatus in the present invention is not limited to an elliptical shape. The shape of the laser beam differs depending on the type of laser used, and further, can be shaped by an optical system. For example, the shape of laser light emitted from a Lambda Corporation XeCl excimer laser (wavelength 308 nm, pulse width 30 ns) L3308 is a 10 mm×30 mm (half-value widths in the beam profile)

rectangular shape. Further, the shape of laser light emitted from a YAG laser becomes circular if the rod shape is cylindrical, and becomes rectangular if a slab is used. Laser light having a desired size can be made by performing additional shaping of this type of laser light with an optical system.

Figure 36B:
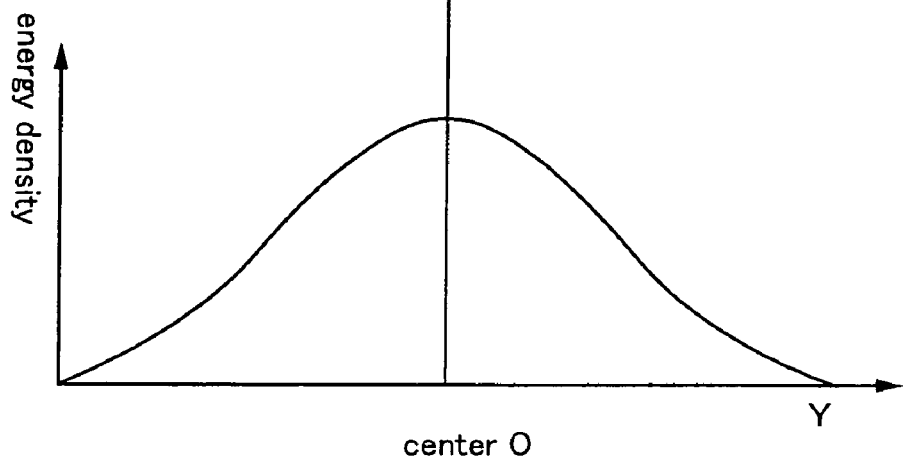

FIG. 36B shows the distribution of the energy density of laser light in the longitudinal axis Y direction of the laser beam shown in FIG. 36A. The laser beam shown in FIG. 36A corresponds to a region satisfying an energy density of $1/e^2$ of the peak value of the energy density in FIG. 36B. The distribution of the energy density of laser light in the case where the laser beam is elliptical in shape becomes higher as the center O of the ellipse is approached. The laser beam shown in FIG. 36A thus has an energy distribution that follows a Gaussian distribution in the central axis direction, and a region capable of being judged as having a uniform energy density becomes smaller.

Figure 36C:
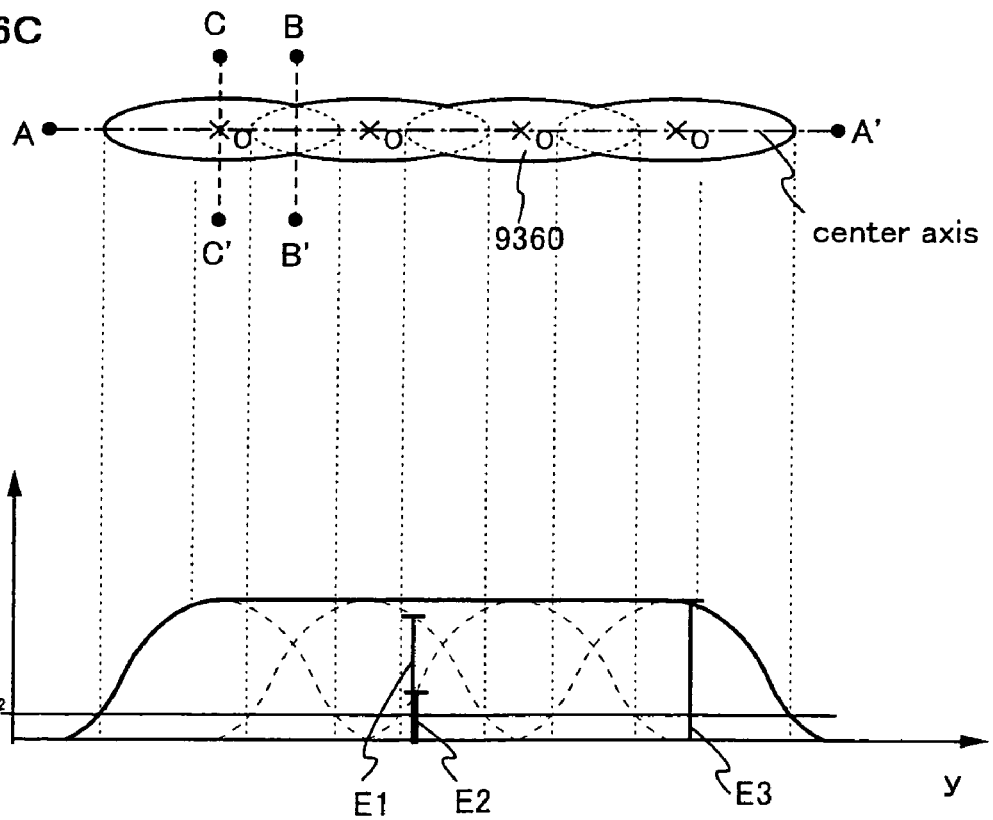

The shape of a laser beam in which laser light having the laser beam shape shown in FIG. 36A is synthesized is shown in FIG. 36C. Note that FIG. 36C shows a case in which laser beams of four laser lights are overlapped, thus forming one linear shape laser beam, but the number of laser beams overlapped is not limited to four.

Synthesis is done by making the longitudinal axis of the ellipse for each laser beam of laser light coincide, and portions of the laser beams mutually overlapped, thus forming one laser beam 9360. Note that a straight line obtained by connecting the centers O of respective ellipses is taken as a center axis of the laser beam 9360.

A distribution of the energy density of laser light in the center axis y direction for the laser beam after synthesis shown in FIG. 36D is shown in FIG. 36D. Note that the laser beam shown in FIG. 36C corresponds to a region satisfying an energy density of $1/e^2$ of the peak value of the energy density in FIG. 36B. The energy densities are added in the portions in which the respective laser beams before synthesis are overlapped. For example, if energy densities E1 and E2 of the overlapped beams shown in the figures are added, then the calculated value become nearly equal to the peak value E3 for the beam energy densities, and the energy densities between the centers O of respective ellipses are leveled.

Note that if E1 and E2 are added, the result ideally becomes equal to E3, but in practice, does not always equal E3. It is possible for a designer to suitably set a permissible range for the difference between the value of E1 and E2 added, and the value of E3.

If an independent laser beam is used, the energy density follows a Gaussian distribution, and therefore it is difficult to irradiate laser light having a uniform energy density to entire portions in which a semiconductor film is in contact with planarized portions of an insulating film or portions that become islands. However, by making a plurality of laser lights overlapped such that portions having low energy densities mutually complement each other, the uniform energy density region can be expanded, and the crystallinity of a semiconductor film can be increased with good efficiency compared to using an independent laser light in which a plurality of laser lights are not overlapped, as can be understood from FIG. 36D.

Note that energy density distributions found by computation in line segments B-B' and C-C' of FIG. 36C are shown in FIGS. 37A and 37B, respectively. Note that, in FIGS. 37A and 37B, regions satisfying an energy density of $1/e^2$ of the peak value of the laser beams before synthesis are taken as a reference. The energy densities in B-B' and C-C' when the length of the transverse axis of the laser beams before synthesis is 37 µm, the length in the longitudinal direction is 410 µm, and the distance from the center is 192 µm have energy distributions as shown in FIGS. 37A and 37B, respectively. The energy distribution along B-B' becomes slightly smaller than that along C-C', but the two can be seen as being nearly equal. The shape of the synthesized laser beam in the regions that satisfy an energy density of $1/e^2$ of the peak value of the laser beams before synthesis can be expressed as a linear shape.

Figure 38:
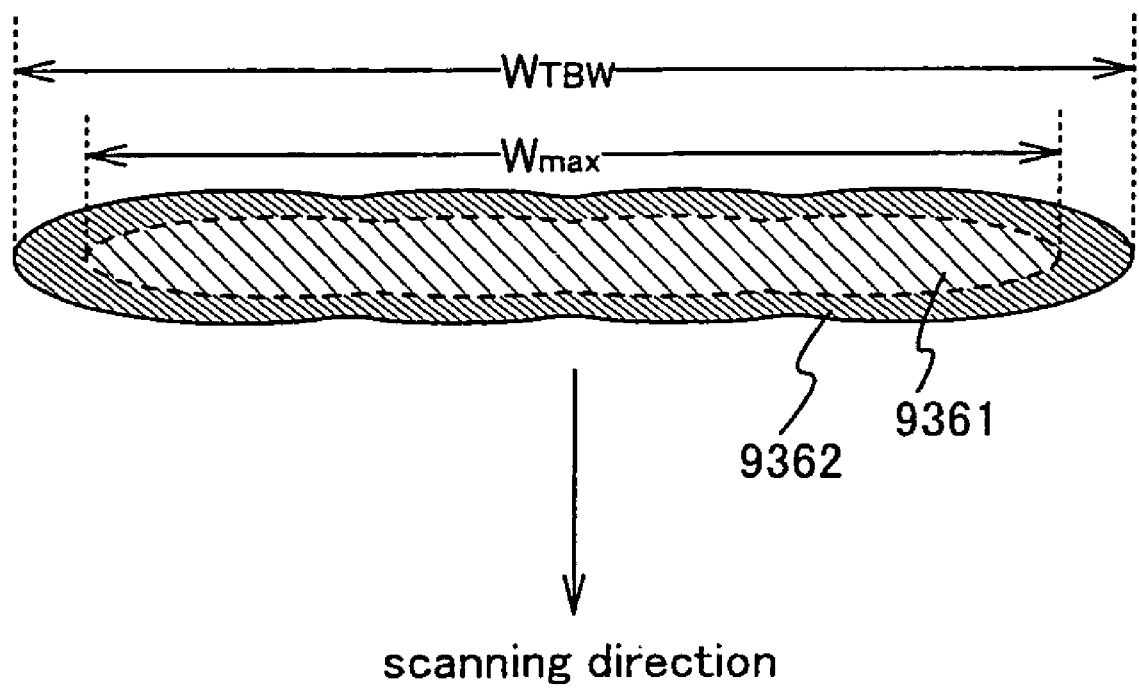
FIG. 38 is a diagram showing the energy density distribution of a laser beam.

FIG. 38A is a diagram showing the energy distribution of the synthesized laser beam. A region denoted by reference numeral 9361 is a region of uniform energy density, and a region denoted by reference numeral 9362 is a region of low energy density. In FIG. 38, the length of the laser beam in the central axis direction is taken as $W_{TBW}$, and the length in the central axis direction in the region 9361 having uniform energy density is taken as $W_{max}$. The ratio of the region 9362, which does not have uniform energy density and cannot be used in crystallizing the semiconductor film, to the region 9361, which has uniform energy density and is capable of being used in crystallization, becomes larger as $W_{TBW}$ becomes large compared to $W_{max}$. Micro-crystals develop and the crystallinity is poor in the semiconductor film that is irradiated with only the non-uniform energy density region 9362. It therefore becomes necessary to set the layout of the scanning path and the concave and convex in the insulating film so that regions of the semiconductor film that become islands are not overlapped with only the region 9362. This restriction becomes larger if the ratio of the region 9362 to the region 9361 becomes large. Preventing only the non-uniform energy density region 9362 from being irradiated to the semiconductor film formed on depressions or projections of the insulating film by using a slit is therefore effective in making the restriction, which develops when laying out the scanning path and the concave and convex in the insulating film, smaller.

It is possible to implement Example 13 in combination with Examples 6 to 12.

Example 14

An optical system of a laser irradiation apparatus used in the present invention, and the positional relationship between the optical system and a slit are explained in Example 14.

Laser light having an elliptical shape laser beam follows a Gaussian distribution for its energy density in a direction that is orthogonal to a scanning direction, and therefore the proportion occupied by regions having a low energy density is high compared to laser light having a rectangular shape or linear shape laser beam. It is therefore preferable in the present invention that the laser beam of laser light be a rectangular shape, or a linear shape, having a relatively uniform energy distribution.

Figure 39:
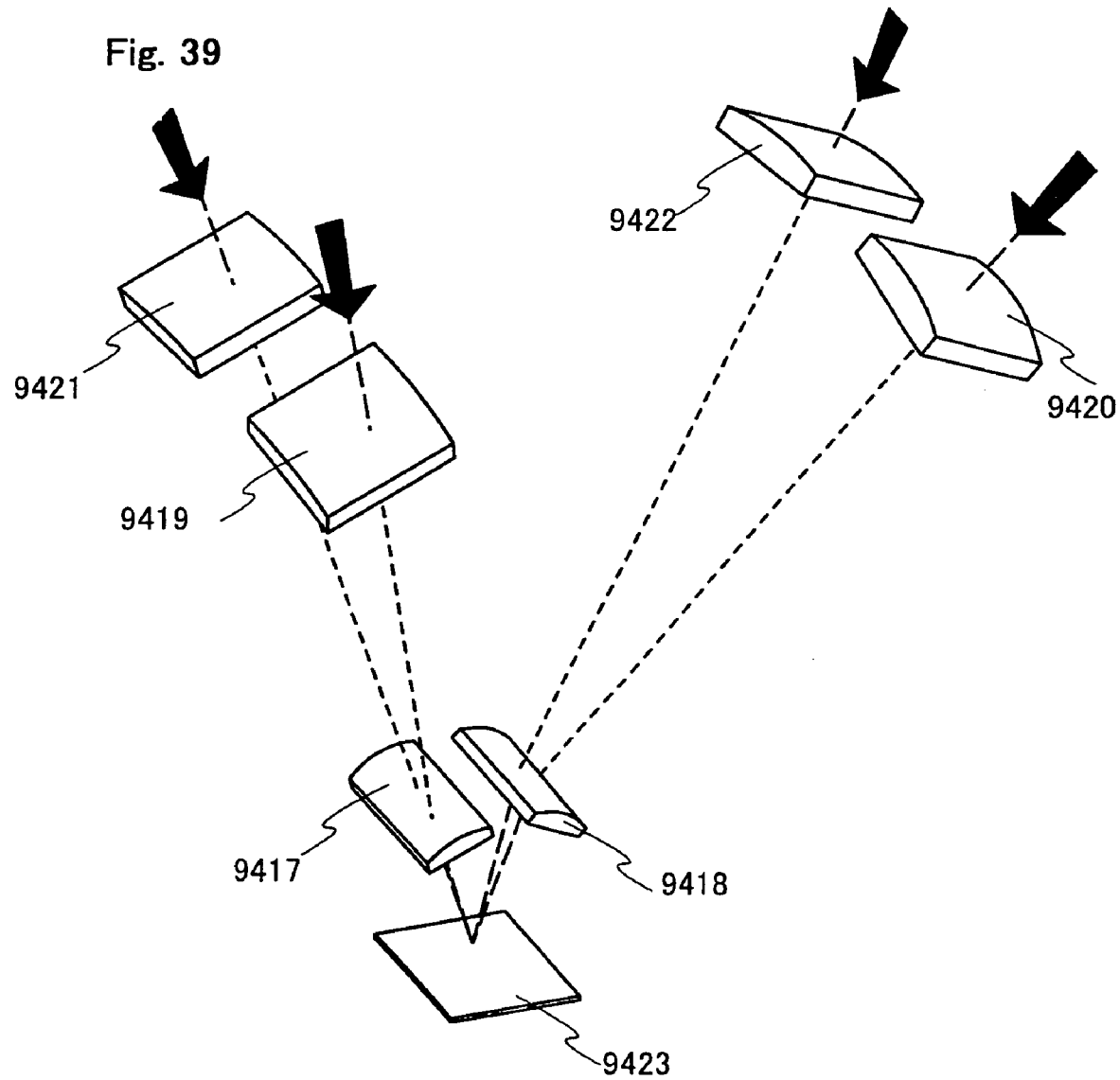
FIG. 39 is a diagram of an optical system.

FIG. 39 shows an optical system for a case in which four laser beams are synthesized to form one laser beam. The optical system shown in FIG. 39 has six cylindrical lenses 9417 to 9422. The four laser lights made incident from the direction of the arrows are made incident to the four cylindrical lenses 9419 to 9422, respectively. Two laser lights shaped in the cylindrical lenses 9419 and 9421 again have their laser beams shaped in the cylindrical lens 9417, and are then irradiated to a processing piece 9423. On the other hand, two laser lights shaped in the cylindrical lenses 9420 and 9422 again have their laser beams shaped in the cylindrical lens 9418, and are then irradiated to the processing piece 9423.

Portions of the respective laser beams of laser light are mutually overlapped, thus forming one synthesized laser beam in the processing piece 9423.

It is possible for a designer to suitably set the focal length and angle of incidence for each lens, but the focal lengths of the cylindrical lenses 9417 and 9418 that are closest to the processing piece 9423 are made smaller than the focal lengths of the cylindrical lenses 9419 to 9422. For example, the focal lengths of the cylindrical lenses 9417 and 9418 that are closest to the processing piece 9423 are set to 20 mm, and the focal lengths of the cylindrical lenses 9419 to 9422 are set to 150 mm. Each of the lenses is disposed so that the angle of incidence of laser light from the cylindrical lenses 9417 and 9418 to the processing piece 9423 is set to 25° in Example 14, and the angle of incidence of laser light from the cylindrical lenses 9419 to 9422 to the cylindrical lenses 9417 and 9418 is set to 10°. Note that it is preferable that the angle of incidence of the laser light to a substrate be larger than 0° C., preferably from 5 to 30°, in order to exclude returned light and perform uniform irradiation.

An example of synthesis using four laser beams is shown in FIG. 39, and in this case there are four cylindrical lenses corresponding to four laser oscillation apparatuses, and two cylindrical lenses corresponding to the four cylindrical lenses. The number of laser beams for synthesis is not limited to this number, and the number of laser beams for synthesis may be equal to or greater than 2, and equal to or less than 8. For cases of synthesis using n laser beams (where n=2, 4, 6, 8), there are n cylindrical lenses corresponding to n laser oscillation apparatus and n/2 cylindrical lenses corresponding to the n cylindrical lenses. For cases of synthesis using n laser beams (where n=3, 5, 7), there are n cylindrical lenses corresponding to n laser oscillation apparatuses, and (n+1)/2 cylindrical lenses corresponding to the n cylindrical lenses.

If the locations for placing optical systems, interference, and the like are considered when five or more laser beams overlapped with each other, it is preferable that a fifth and subsequent laser lights be irradiated from the opposite side of the substrate, and it is also necessary to form a slit on the opposite side of the substrate in this case. Further, it is necessary that the substrate have transparency.

Note that it is preferable that the angle of incidence with respect to the substrate be maintained to be greater than 0°, and less than 90°, in order to prevent returned light from returning along the light path initially followed.

Further, a surface containing a short edge, or a surface containing a long edge, is defined as an incident surface when the surface is a vertical flat surface of the irradiation surface and the shape of each beam before synthesis is chosen as a rectangular shape. In order to achieve uniform laser light irradiation, it is preferable that an angle of incidence $\theta$ of laser light satisfy $\theta \geq \arctan(W/2d)$ when the length of the short side or the long side contained in the incident surface is W, and the thickness of the substrate having transparency with respect to the laser light and disposed in the irradiation surface is d. This argument is necessary for each of the laser lights before synthesis. Note that, when the laser light path is not on the incident surface, the angle of incidence of the laser light path projected onto the incident surface is set to $\theta$. Light reflected by the front surface of the substrate and light reflected from the back surface of the substrate do not interfere provided that the laser light is made incident at the incident angle $\theta$, and uniform laser light irradiation can be performed. The aforementioned argument was considered for a substrate index of refraction equal to 1. In practice, substrates often have an index of refraction of approximately 1.5, and when taking this value into account, a calculated value that is larger than the angle calculated by the aforementioned argument is obtained. However, the energy at both ends in the longitudinal direction of the beam spot is attenuated, and therefore the influence of interference in these portions is little, and a sufficient interference attenuation effect can be obtained by the aforementioned calculated value. The above inequality with respect to $\theta$ is applied to substrates that do not have transparency with respect to the laser beam.

Note that the optical system of the laser irradiation apparatus used in the present invention is not limited to the structure shown in Example 14.

Further, excimer lasers are typical as gas lasers, and slab lasers are typical as solid state lasers, which can provide a rectangular shape or linear shape laser beam without combination of a plurality of laser beams. These lasers may also be used in the present invention. Further, it is also possible to form a linear shape or rectangular shape laser beam having uniform energy density by using an optical fiber.

It is possible to implement Example 14 in combination with Examples 6 to 13.

Example 15

The relationship between the distance between the centers of each laser beam, and the energy density when the laser beams are overlapped is explained in Example 15.

Figure 40:
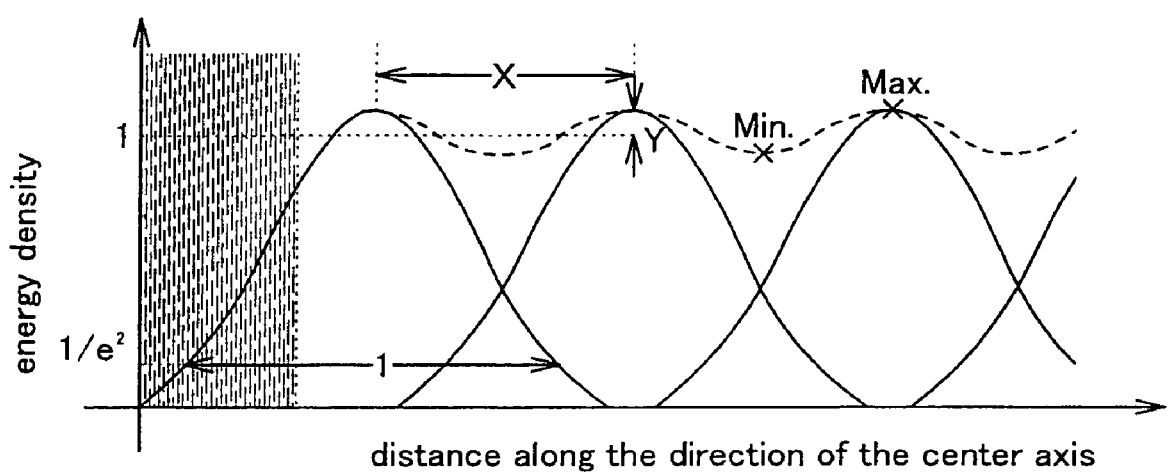
FIG. 40 is a diagram showing the energy density distribution in a central axial direction of laser beams overlapped with each other.

The energy densities in the central axis direction of each laser beam are shown by solid lines, and the energy density of a synthesized laser beam is shown by a dashed line in FIG. 40. The value of the energy density in the central axis direction of the laser beams generally follow a Gaussian distribution.

Figure 41:
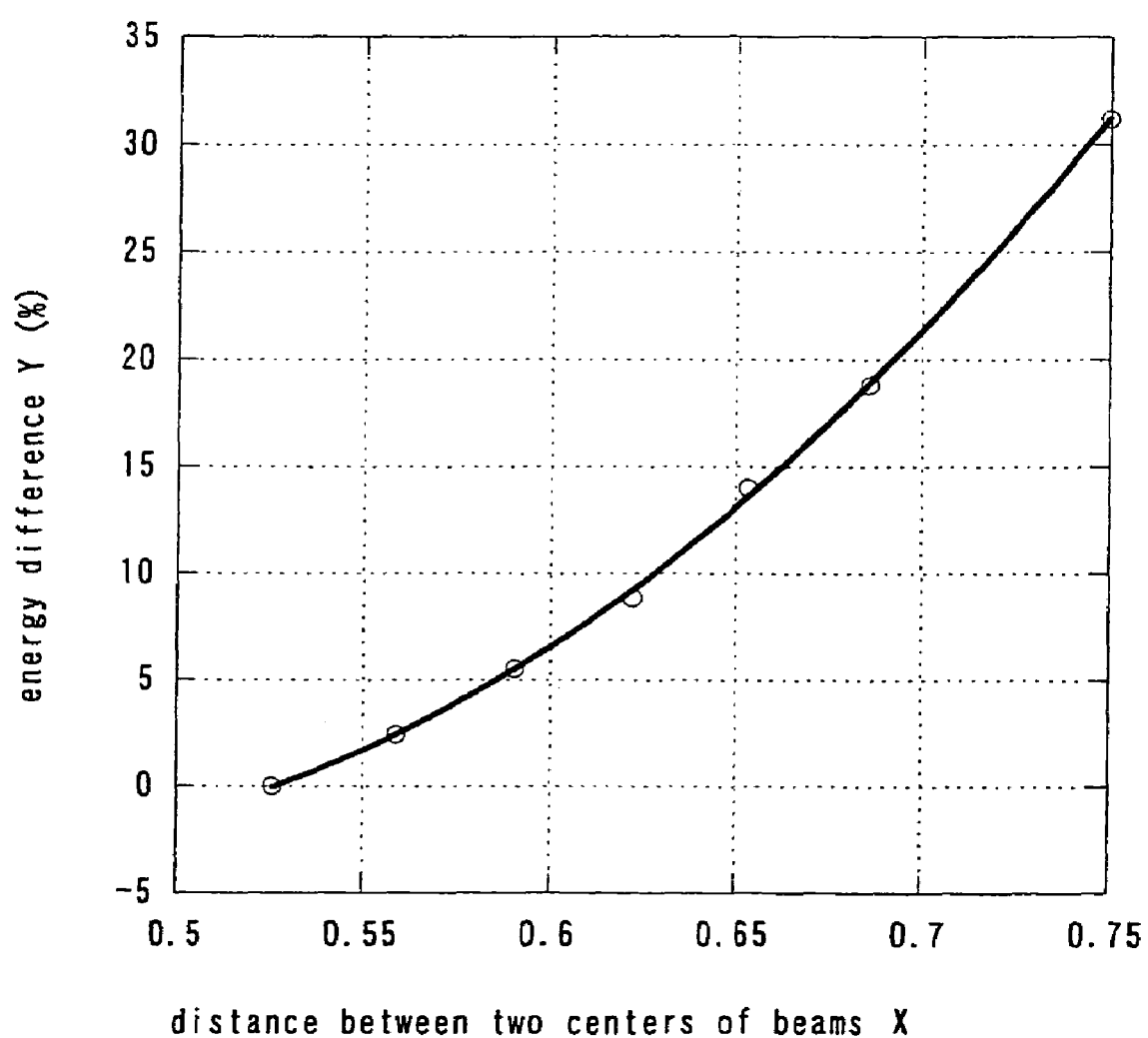
FIG. 41 is a diagram showing the relationship between the distance between laser beam centers and the energy difference.

The distance between each peak in the beam spots before synthesis is taken as X when the distance in the central axis direction satisfies an energy density equal to or greater than $1/e^2$ of the peak value. Further, an increase portion in the peak value in the synthesized beam spot with respect to the average value of the peak value and the valley value after synthesis is taken as Y. The relationship between X and Y found by simulation is shown in FIG. 41. Note that Y is expressed as a percentage in FIG. 41.

The energy difference Y is expressed in FIG. 41 by the approximate equation of Equation 1 below.

$$Y=60-293X+340X^2 \text{ (where X is the larger of the two solutions)} \quad \text{[Equation 1]}$$

In accordance with Equation 1, it is understood that X may be set such that $X \cong 0.584$ in the case where it is desired to set the energy difference on the order of 5%, for example. Ideally Y=0 becomes true, but the beam spot length becomes shorter, and therefore X may be determined in balance with the throughput.

Figure 42:
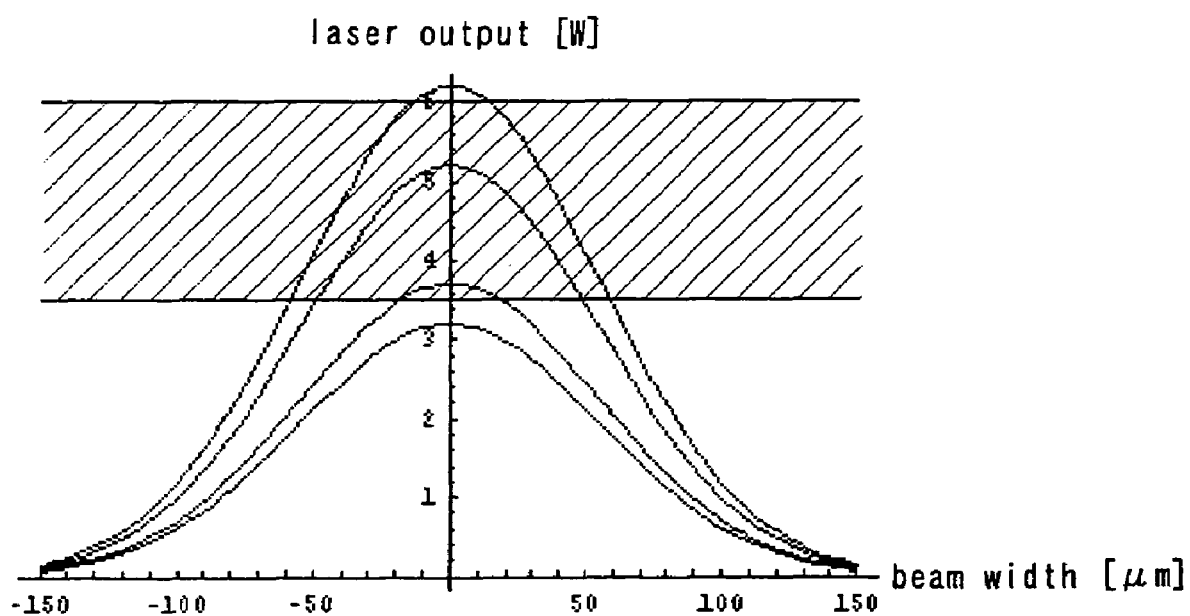
FIG. 42 is a diagram showing the output energy distribution in a center axial direction of a laser beam.

A permissible range for Y is explained next. A distribution of the output (W) of a $YVO_4$ laser with respect to beam width in the central axis direction for a case in which the laser beam has an elliptical shape is shown in FIG. 42. A region shown by inclined lines is a region having an output energy necessary in order to obtain satisfactory crystallinity, and it is understood that the output energy of the synthesized laser light may be kept within a range from 3.5 to 6 W.

The energy difference Y at which satisfactory crystallinity can be obtained becomes a maximum when the maximum and minimum values of the output energy of the beam spot after synthesis are very close to the output energy range necessary to obtain satisfactory crystallinity. Therefore, the energy difference Y becomes ±26.3% in the case of FIG. 42, and it is understood that good crystallinity can be obtained by holding the energy difference Y within the aforementioned range.

Note that the range of output energy necessary in order to obtain good crystallinity changes by the judgment of what constitutes good crystallinity, and further, the output energy distribution changes due to the laser beam shape, and therefore it is not always necessary that the permissible range of the energy difference Y be the above stated value. A designer may suitably set the output energy range necessary in order to obtain good crystallinity, and it is necessary to set the permissible range of the energy difference Y from the output energy distribution of the laser used.

It is possible to implement Example 15 in combination with Examples 6 to 14.

Example 16

Figure 43:
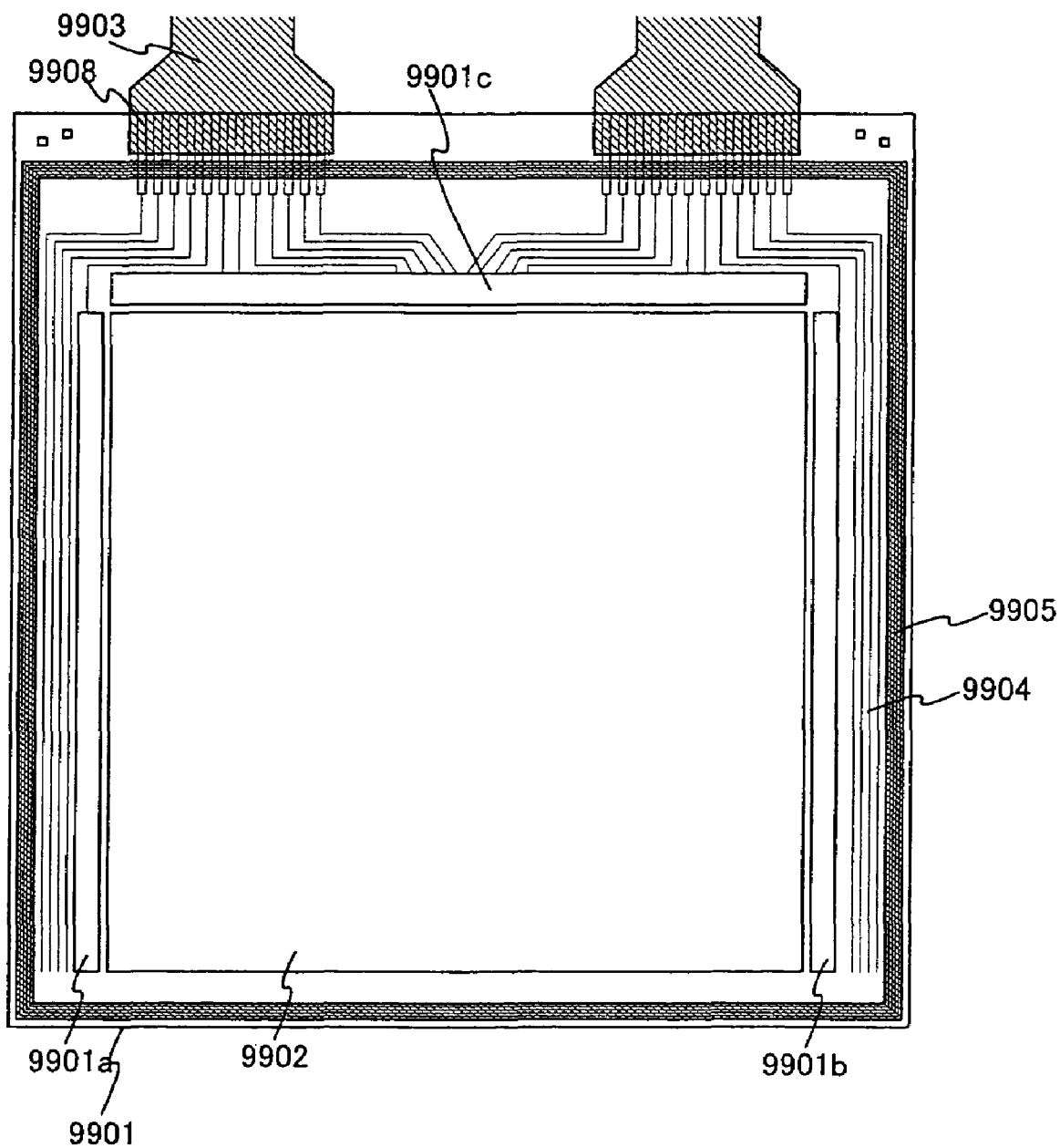
FIG. 43 is a diagram showing the structure of a light emitting device which is an example of a semiconductor device of the present invention.
Figure 44:
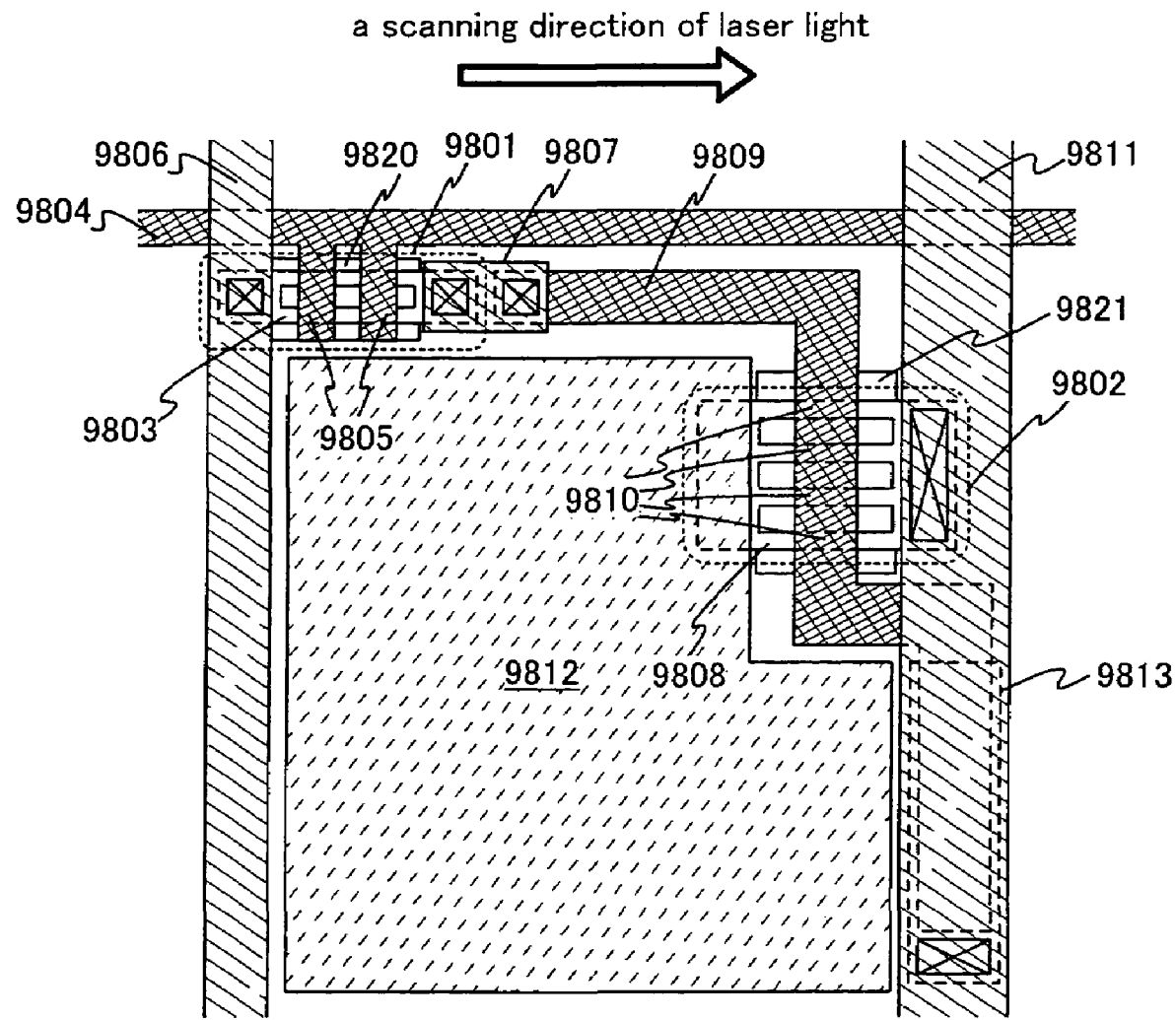
FIG. 44 is a diagram showing the structure of a pixel of the light emitting device which is an example of a semiconductor device of the present invention.

The present invention can be applied to various semiconductor devices, and an Example of a display panel manufactured based on Examples 6 to 10 is explained using FIGS. 43 and 44.

A pixel portion 9902, gate signal driver circuits 9901a and 9901b, a data signal driver circuit 9901c, an input-output terminal portion 9908, and a wiring or wiring group 9904 are prepared on a substrate 9901 in FIG. 43. A sealed pattern 9905 may be partially overlapped with the gate signal driver circuits 9901a and 9901b, the data signal driver circuit 9901c, and the wiring or wiring group 9904 that connects the driver circuit portion and the input terminals. The surface area of a frame region of the display panel (region in the periphery of the pixel portion) can thus be made smaller. An FPC 9903 is fixed to the input-output terminal portion 9908.

The present invention can be used in active elements constituting the pixel portion 9902, the gate signal driver circuits 9901a and 9901b, and the data signal driver circuit 9901c.

FIG. 44 is an example showing the structure of one pixel of the pixel portion 9902 shown by FIG. 43. A pixel of a light emitting device, one semiconductor device of the present invention, is explained in Example 16. Note that the term light emitting device is a general term for display panels in which light emitting elements formed on a substrate are enclosed between the substrate and a covering material, and for display modules in which TFTs and the like are mounted to a display panel. Note that the light emitting elements have: a layer (light emitting layer) containing an organic compound in which electroluminescence generated by the addition of an electric field can be obtained; an anode; and a cathode.

Note that the light emitting elements used in Example 16 can have forms in which hole injecting layers, electron injecting layers, hole transporting layers, electron transporting layers, and the like are independent inorganic compounds, or are formed by materials in which an inorganic compound is mixed into an organic compound. Further, portions of these layers may also be mutually mixed together.

Reference numeral 9801 denotes a TFT (switching TFT) used as a switching element for controlling the input of video signals input to the pixel, and reference numeral 9802 denotes a TFT (driver TFT) for supplying current to a pixel electrode based on information in the video signals.

The switching TFT 9801 has an active layer 9803 having a plurality of channel formation regions with channel widths on the order of 1 to 2 μm, a gate insulating film (not shown), and a gate electrode 9805 that is a portion of a gate line 9804. The switching TFT 9801 controls switching by selection signals input from the gate signal driver circuits 9901a and 9901b to the gate line 9804.

One region, either a source region or a drain region, of the active layer 9803 of the switching TFT 9801 is connected to a signal line 9806 to which the video signals are input by the data signal driver circuit 9901c, and the other region is connected to a wiring 9807 used for connecting to another element.

Reference numeral 9820 denotes a projection of a base film used during formation of the active layer 9803.

On the other hand, the driver TFT 9802 has an active layer 9808 having a plurality of channel formation regions with channel widths on the order of 1 to 2 μm, a gate insulating film (not shown) and a gate electrode 9810 that is a portion of a capacitor wiring 9809.

One region, either a source region or a drain region of the active layer 9808 of the driver TFT 9802 is connected to an power source line 9811, and the other region is connected to a pixel electrode 9812.

Reference numeral 9821 denotes a projection of the base film used in forming the active layer 9808.

Reference numeral 9813 denotes a semiconductor film used for a capacitor, overlapped with the capacitor wiring 9809, sandwiching a gate insulating film in between. The semiconductor film used for a capacitor 9813 is connected to the power source line 9811. A portion in which the semiconductor film used for a capacitor 9813, the gate insulating film, and the capacitor wiring 9809 are overlapped functions as a capacitor for storing the gate voltage of the driver TFT 9802. Further, the capacitor wiring 9809 and the power source line 9811 are overlapped, sandwiching an interlayer insulating film (not shown) in between. It is also possible for the portion in which the capacitor wiring 9809, the interlayer insulating film, and the power source line 9811 are overlapped to function as a capacitor for storing the gate voltage of the driver TFT 9802.

Note that the term connection as used in this specification denotes electrical connections unless otherwise specified.

The directions in which carriers move in the channel formation regions in the active layer 9803 of the switching TFT 9801 and the active layer 9808 of the driver TFT 9802 are each aligned with a laser light scanning direction as shown by the arrow.

It is preferable that the number of channel formation regions in the active layer 9808 of the driver TFT 9802 be more than the number of channel formation regions of the active layer 9803 of the switching TFT 9801. This is because the driver TFT 9802 needs a larger current capacity than the switching TFT 19801, and because the ON current can be made larger as the number of channel formation regions increases.

Note that although the structure of a TFT substrate used in a light emitting device is explained in Example 16, a liquid crystal display device can also be manufactured by using the manufacturing processes of Example 16.

It is possible to implement Example 16 by being freely combined with Examples 6 to 10.

Example 17

TFTs in a semiconductor device of the present invention have superior crystallinity in their channel formation regions, and therefore circuits formed by elements that normally use single crystal silicon, for example CPUs that use LSIs, all types of storage elements of logic circuits (for example SRAM), counter circuits, logical divider circuits, and the like can be formed.

The minimum dimensions for ultra LSI are approaching the sub-micron region, and partial element three-dimensionalization is necessary in order to aim for further high integration. The structure of a semiconductor device of the present invention having a stack structure is explained in Example 17.

FIG. 46 shows a cross sectional diagram of a semiconductor device of Example 17. A first insulating film 9701 is formed on a substrate 9700. A first TFT 9702 is formed on the first insulating film 9701. Note that the channel width of a channel formation region of the first TFT 9702 is on the order of 1 to 2 microns.

A first interlayer insulating film 9703 is formed so as to cover the first TFT 9702, and a first connection wiring 9705, and a wiring 9704 that is electrically connected to the first TFT 9702 are formed on the first interlayer insulating film 9703.

A second interlayer insulating film 9706 is then formed so as to cover the wiring 9704 and the first connection wiring 9705. The second interlayer insulating film 9706 is formed by using an inorganic insulating film, and a film in which a substance that absorbs laser light irradiated in a later step, for example a colored dye or carbon, is mixed into silicon oxide, silicon oxynitride, or the like is used.

If an upper surface of the second interlayer insulating film 9706 is then polished by using a chemical mechanical polishing method (CMP method), then a second insulating film formed later becomes more planarized, and the crystallinity of a semiconductor film formed on the second insulating film and crystallized by laser light can be improved.

A second insulating film 9707 is then formed on the second interlayer insulating film 9706. A second TFT 9708 is then formed on the second insulating film 9707. Note that the channel width of a channel formation region of the second TFT 9709 is on the order of 1 to 2 micron.

A third interlayer insulating film 9709 is formed so as to cover the second TFT 9708, and a second connection wiring 9711, and a wiring 9710 that is electrically connected to the second TFT 9708 are formed on the third interlayer insulating film 9709. Note that an embedded wiring (plug) 9712 is formed between the first connection wiring 9705 and the second connection wiring 9711 by using a damocene process or the like.

A fourth interlayer insulating film 9713 is then formed so as to cover the wiring 9710 and the second connection wiring 9711.

Figure 46A:
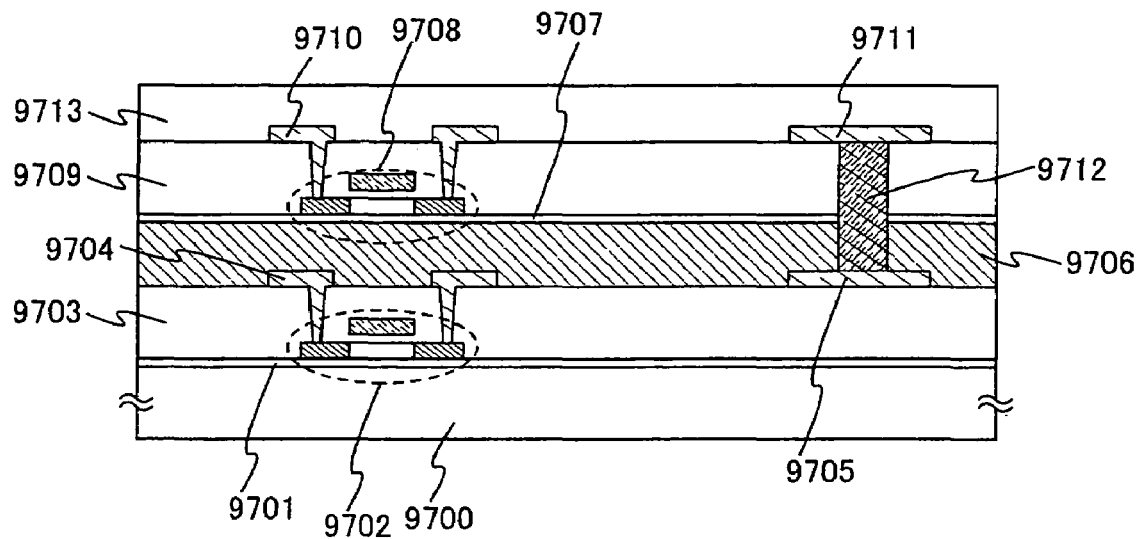
FIGS. 46A and 46B are a cross sectional diagram of a TFT having a stack structure, and an example of the structure of a semiconductor device using the TFT, respectively.

Example 17 has a so-called stack structure in which the first TFT 9702 and the second TFT 9708 can be overlapped through an interlayer insulating film. A semiconductor device having a two layer stack structure is shown in FIG. 46A, but it may also have a stack structure of three or more layers. In this case, an inorganic insulating film, like the second interlayer insulating film 9706, which absorbs laser light is formed between each layer in order to prevent laser light from being irradiated to elements formed in lower layers.

It is possible to have very high integration with a three dimensionalized semiconductor device, and further, wirings for electrically connecting between each element can be shortened, and therefore signal delays due to the wiring capacitance can be prevented, and very high speed operation becomes possible.

Figure 46B:
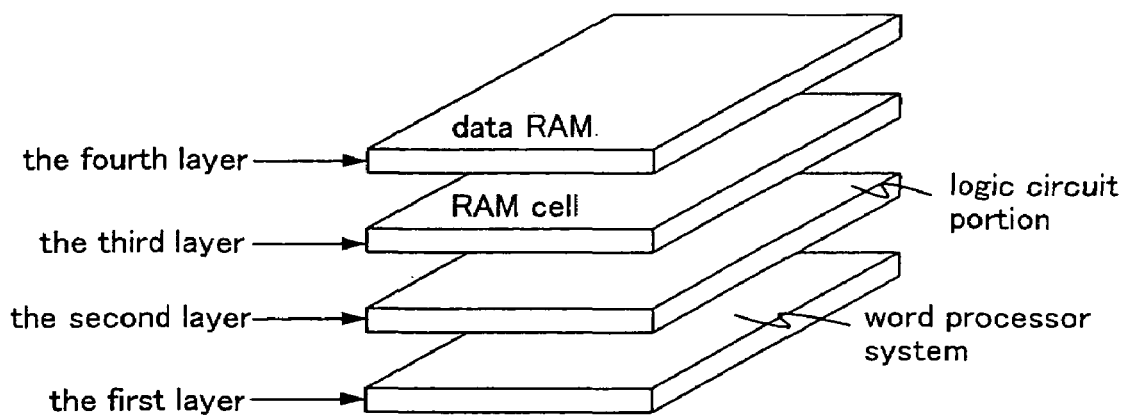

Note that TFTs which use the present invention can also be used in CAM and RAM coexistent chips as noted in "Fourth New Functional Element Technology Symposium Proceedings", July 1985, p. 205. FIG. 46B is a planned model for a RAM coexistence chip with content addressable memory (CAM) in which a processor corresponding to memory (RAM) is disposed. A first layer is a layer on which a word processor circuit is formed, a second layer is a layer on which a processor corresponding to RAM of a third layer is formed by using various types of logic circuits, and the third layer is a layer in which RAM cells are formed. A content addressable memory (CAM) is formed by the processor of the second layer and the RAM cells of the third layer. In addition, a fourth layer is a RAM for data (data RAM), and coexists with the content addressable memory formed in the second layer and the third layer.

It is thus possible for the present invention to be applied to various types of three-dimensionalized semiconductor devices.

It is possible to implement Example 17 by being freely combined with Examples 6 to 11.

Example 18

Application to various electronic equipment is possible using a semiconductor device having a TFT manufactured with the present invention. Examples of these include portable information terminals (electronic notebooks, mobile computers, mobile phones etc.), video cameras, digital cameras, personal computers, television receivers, mobile telephones, projection type display devices and the like. Specific examples of these electronic equipment are shown in FIGS. 45A to 45H.

Figure 45A:
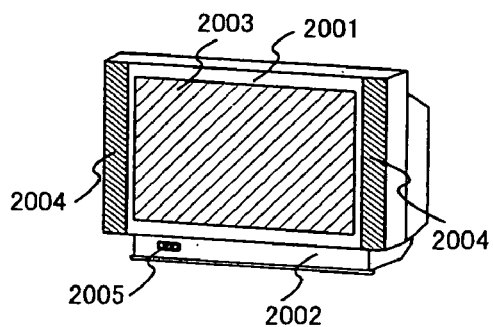
FIGS. 45A to 45H are diagrams of electronic equipment that use the semiconductor device of the present invention.

FIG. 45A shows a display device, which is composed of a frame 2001, a support stand 2002, a display portion 2003, a speaker portion 2004, a video input terminal 2005, and the like. The display device of the present invention is completed using the semiconductor device of the present invention in the display portion 2003. The semiconductor device is a self-luminous type and thus does not require a backlight. Therefore, a thinner display portion compared to a liquid crystal display can be obtained. Note that the display device includes all display devices for information display such as personal computer, TV broadcast receiver, and advertisement display.

Figure 45B:
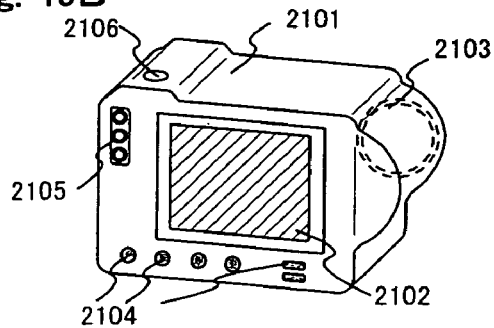

FIG. 45B shows a digital still camera, which is composed of a main body 2101, a display portion 2102, an image receiving portion 2103, operation keys 2104, an external connection port 2105, a shutter 2106, and the like. The digital still camera of the present invention is completed using the semiconductor device of the present invention in the display portion 2102.

Figure 45C:
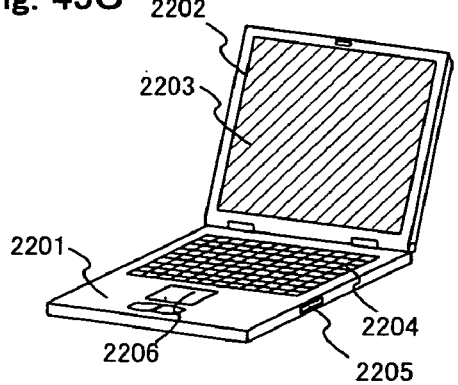

FIG. 45C shows a notebook personal computer, which is composed of a main body 2201, a frame 2202, a display device 2203, a keyboard 2204, an external connection port 2205, a pointing mouse 2206, and the like. The notebook personal computer of the present invention is completed using the semiconductor device of the present invention in the display portion 2203.

Figure 45D:
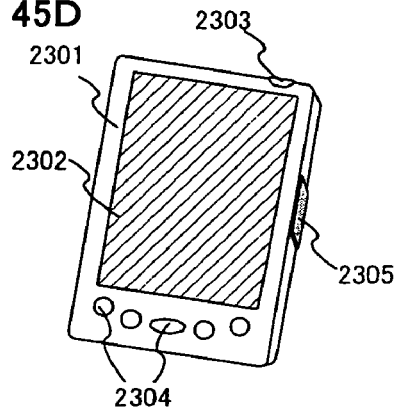

FIG. 45D shows a mobile computer, which is composed of a main body 2301, a display portion 2302, switches 2303, operation keys 2304, an infrared port 2305, and the like. The mobile computer of the present invention is completed using the semiconductor device of the present invention in the display portion 2302.

Figure 45E:
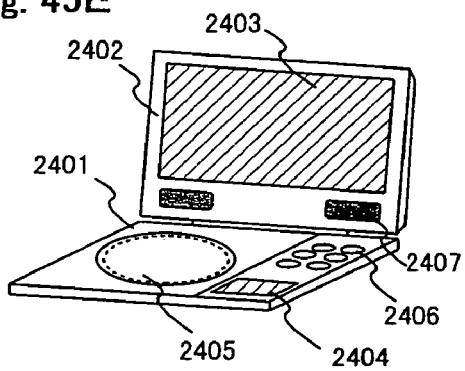

FIG. 45E shows an image reproducing device equipped with a recording medium (specifically, DVD playback device), which is composed of a main body 2401, a frame 2402, a display device A 2403, a display device B 2404, a recording medium (such as a DVD) read-in portion 2405, operation keys 2406, and a speaker portion 2407, and the like. The display portion A 2403 mainly displays image information, and the display portion B 2404 mainly displays character information. Note that household game machines and the like are included in the category of image reproducing devices equipped with a recording medium. The image reproducing device of the present invention is completed using the semiconductor device of the present invention in the display portion A 2403 and the display portion B 2404.

Figure 45F:
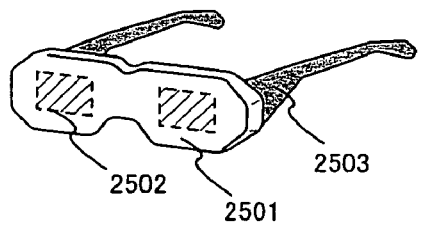

FIG. 45F shows a goggle type display (head mounted display) which is composed of a main body 2501, a display portion 2502, and an arm 2503. The goggle type display of the present invention is completed using the semiconductor device of the present invention in the display portion 2502.

Figure 45G:
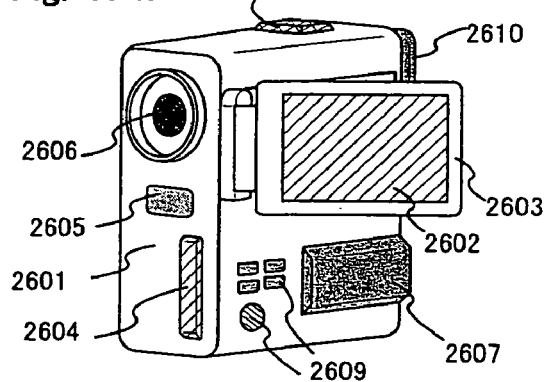

FIG. 45G shows a video camera, which is composed of a main body 2601, a display portion 2602, a frame 2603, an external connection port 2604, a remote control receiving portion 2605, an image receiving portion 2606, a battery 2607, an audio input portion 2608, operation keys 2609, an eyepiece portion 2610, and the like. The video camera of the present invention is completed using the semiconductor device of the present invention in the display portion 2602.

Figure 45H:
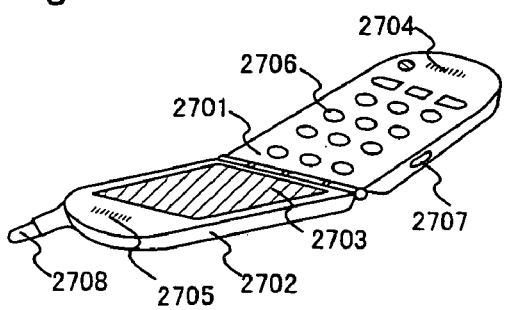

FIG. 45H shows a mobile telephone, which is composed of a main body 2701, a frame 2702, a display portion 2703, an audio input portion 2704, an audio output portion 2705, operation keys 2706, an external connection port 2707, an antenna 2708, and the like. Note that white characters are displayed on a black background in the display portion 3703, and thus, the power consumption of the mobile telephone can be suppressed. The mobile telephone of the present invention is completed using the semiconductor device of the present invention in the display portion 2703.

As mentioned above, the applicable range of this invention is very wide, and it is possible to apply it to electrical appliances of all fields. It is also possible to implement Example 18 in combination with any of the structures shown in Examples 6 to 12.

Example 19

Multi-channel TFTs of semiconductor devices of the present invention can control dispersions in the S value (sub-threshold value), mobility, threshold voltage, and the like more than single channel TFTs and multi-channel TFTs formed by using a semiconductor film which is crystallized on a flat insulating film.

Figure 47A:
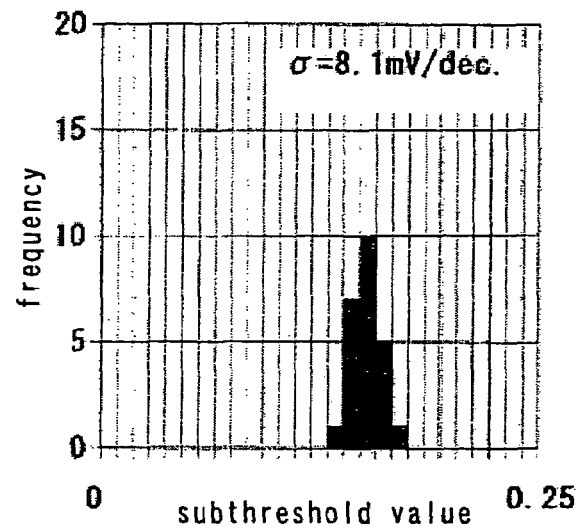
FIGS. 47A to 47C are diagrams showing the frequency distribution of the S value.

A frequency distribution of the S value of n-type multi-channel TFTs of the present invention is shown in FIG. 47A. The multi-channel TFTs of the present invention use semiconductor films that are crystallized by irradiating laser light on an insulating film having depressions and projections. The width of projections and depressions of the insulating film is 1.25 μm and 1.50 μm, respectively, the TFT channel length is 8 μm and the total channel width is 12 μm.

Figure 47B:
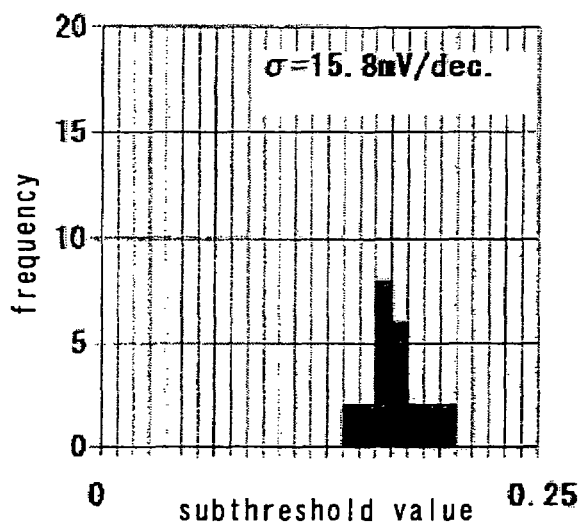
Figure 47C:
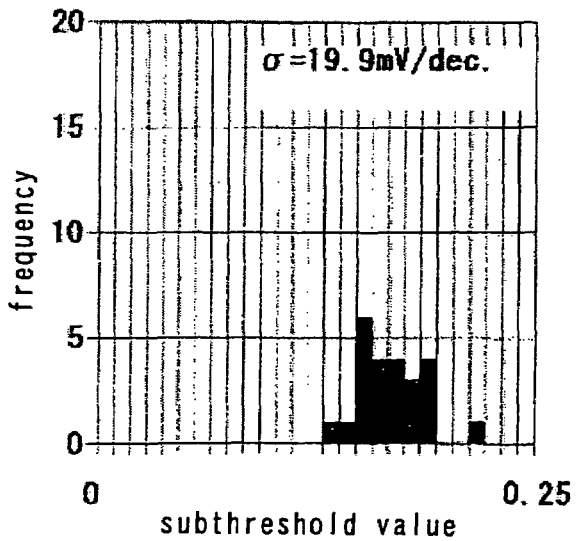

A frequency distribution of the S value of n-type single channel TFTs crystallized on a flat insulating film is shown in FIG. 47B for comparison. The TFT channel length is 8 μm, and the channel width is 8 μm. Further, a frequency distribution of the S value of n-type multi-channel TFTs crystallized on a flat insulating film is shown in FIG. 47C. The TFT channel length is 8 μm, the total channel width is 12 μm, each channel width is 2 μm, and the gap between channels is 2 μm.

The standard deviation σ=15.8 mV/dec in FIG. 47C, and the standard deviation σ=19.9 mV/dec in FIG. 47C, while the standard deviation σ=8.1 mV/dec in FIG. 47A, which is low compared to the other two. It is therefore understood that the n-type multi-channel TFTs of the present invention shown in FIG. 47A control dispersions in the S value.

Note that the channel width of the TFTs of FIG. 47B is shorter than the total channel width of the TFTs of FIG. 47A. Further, the TFTs of FIG. 47C have longer channel widths and longer spacing between channels than the TFTs of FIG. 47A. However, even when considering these conditions, the standard deviation of FIG. 47A can be considered to be remarkably smaller compared to the standard deviations of FIG. 47B and FIG. 47C, and therefore the n-channel TFTs of the present invention can be expected to have an effect that the S value is controlled.

Figure 48A:
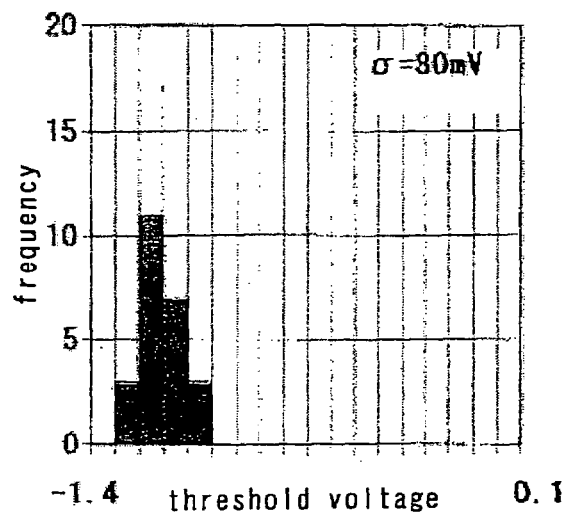
FIGS. 48A to 48C are diagrams showing the frequency distribution of the threshold voltage.
Figure 48B:
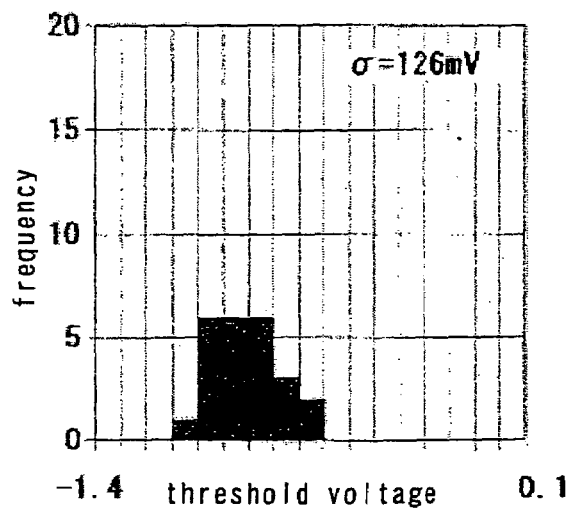
Figure 48C:
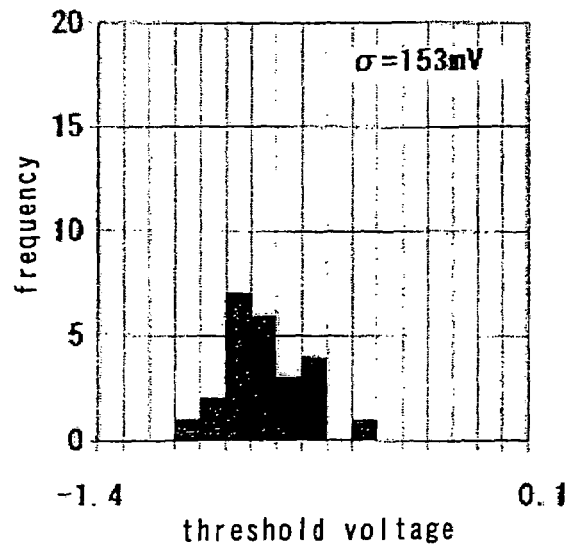

Next, a frequency distribution of the threshold voltage of n-type multi-channel TFTs of the present invention is shown in FIG. 48A. The structure of the TFTs of FIG. 48A is the same as the case of FIG. 47A. Further, a frequency distribution of the threshold voltage of n-type single channel TFTs crystallized on a flat insulating film is shown in FIG. 48B for comparison. The structure of the TFTs of FIG. 48B is the same as the case of FIG. 47B. Further, a frequency distribution of the threshold voltage of n-type multi-channel TFTs crystallized on a flat insulating film is shown in FIG. 48C. The structure of the TFTs of FIG. 48C is the same as the case of FIG. 47B.

The standard deviation σ=126 mV in FIG. 48B, and the standard deviation σ=153 mV in FIG. 48C, while the standard deviation σ=80 mV in FIG. 48A, which is low compared to the other two. It is therefore understood that the n-type multi-channel TFTs of the present invention shown in FIG. 48A control dispersions in the threshold voltage.

Note that the channel width of the TFTs of FIG. 48B is shorter than the total channel width of the TFTs of FIG. 48A. Further, the TFTs of FIG. 48C have longer channel widths and longer spacing between channels than the TFTs of FIG. 48A. However, even when considering these conditions, the standard deviation of FIG. 48A can be considered to be remarkably smaller compared to the standard deviations of FIG. 48B and FIG. 48C, and therefore the n-channel TFTs of the present invention can be expected to have an effect that the threshold voltage is controlled.

Figure 49A:
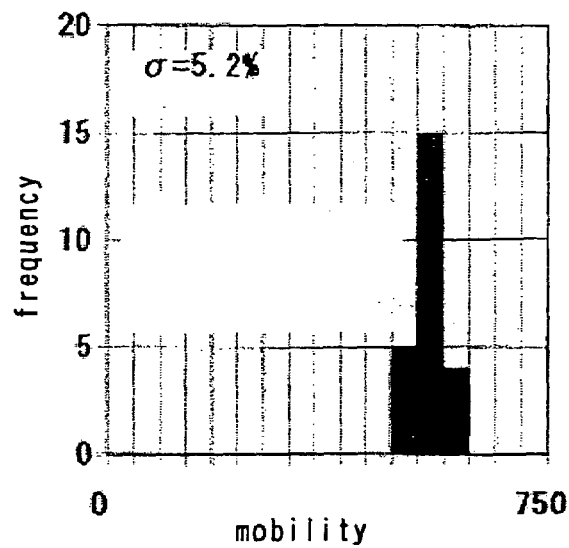
FIGS. 49A to 49C are diagrams showing the frequency distribution of the mobility.
Figure 49B:
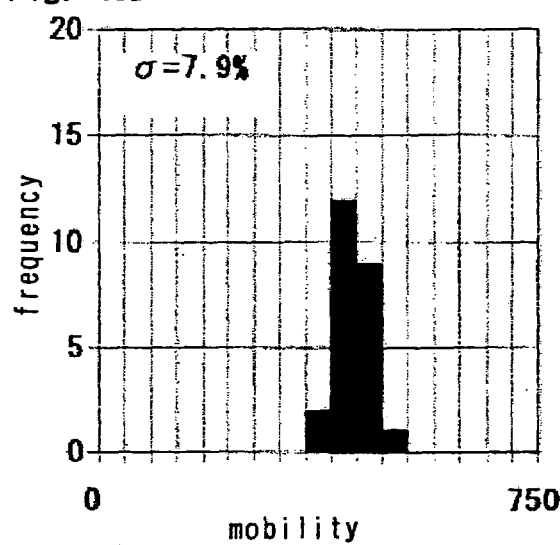
Figure 49C:
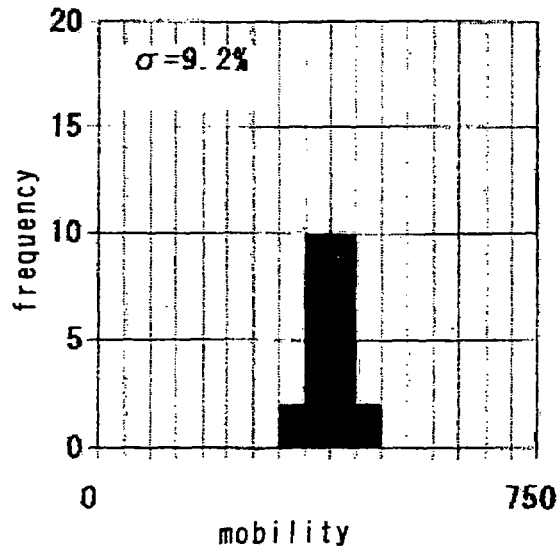

Next, a frequency distribution of the mobility of n-type multi-channel TFTs of the present invention is shown in FIG. 49A. The structure of the TFTs of FIG. 49A is the same as the case of FIG. 47A. Further, a frequency distribution of the mobility of n-type single channel TFTs crystallized on a flat insulating film is shown in FIG. 49B for comparison. The structure of the TFTs of FIG. 49B is the same as the case of FIG. 47B. Further, a frequency distribution of the mobility of n-type multi-channel TFTs crystallized on a flat insulating film is shown in FIG. 49C. The structure of the TFTs of FIG. 49C is the same as the case of FIG. 47C.

The standard deviation σ=7.9% in FIG. 49B, and the standard deviation σ=9.2% in FIG. 49C, while the standard deviation σ=5.2% in FIG. 49A, which is low compared to the other two. It is therefore understood that the n-type multi-channel TFTs of the present invention shown in FIG. 49A control dispersions in the mobility. Note that the design values for the channel width in FIG. 49A are used in calculating the mobility, and therefore the actual mobility can be considered to be lower on the order of 20%.

Note that the channel width of the TFTs of FIG. 49B is shorter than the total channel width of the TFTs of FIG. 49A. Further, the TFTs of FIG. 49C have longer channel widths and longer spacing between channels than the TFTs of FIG. 49A. However, even when considering these conditions, the standard deviation of FIG. 49A can be considered to be remarkably smaller compared to the standard deviations of FIG. 49B and FIG. 49C, and therefore the n-channel TFTs of the present invention can be expected to have an effect that the mobility is controlled.

Figure 50A:
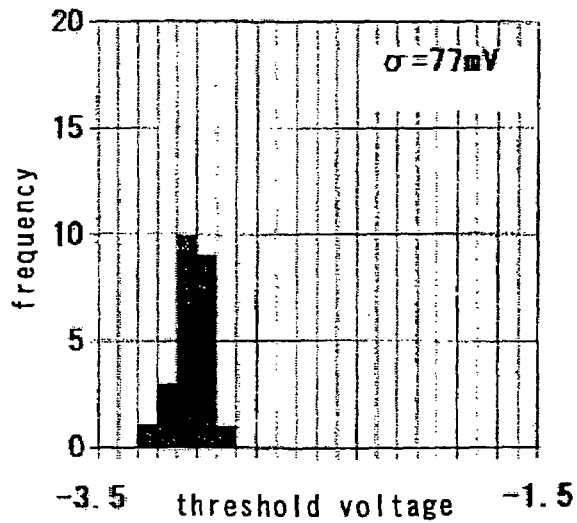
FIGS. 50A to 50C are diagrams showing the frequency distribution of the threshold voltage.
Figure 50B:
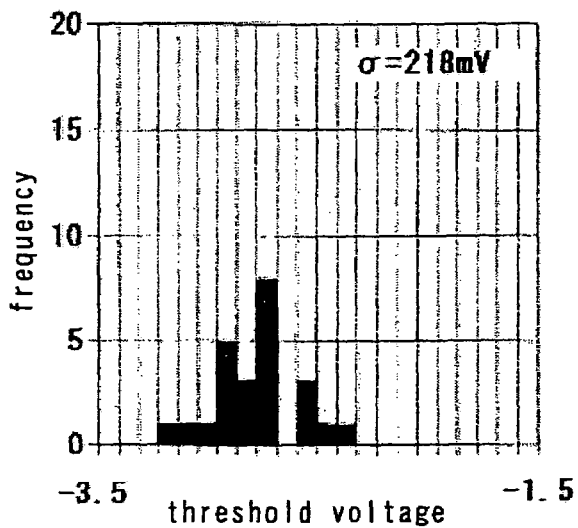
Figure 50C:
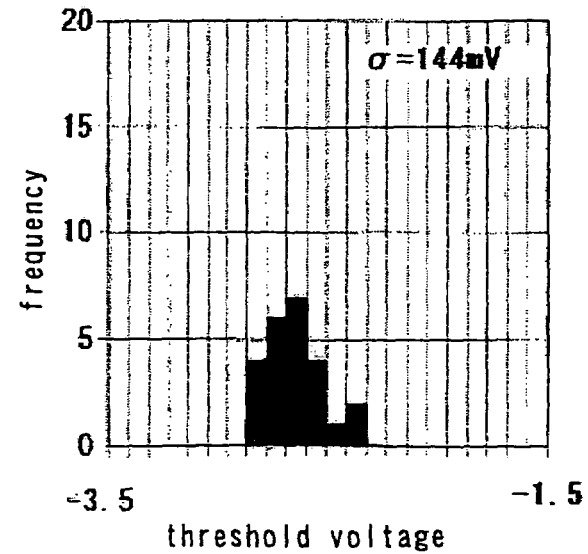

Next, a frequency distribution of the threshold voltage of p-type multi-channel TFTs of the present invention is shown in FIG. 50A. Except for the different polarity, the structure of the TFTs of FIG. 50A is the same as the case of FIG. 47A. Further, a frequency distribution of the threshold voltage of p-type single channel TFTs crystallized on a flat insulating film is shown in FIG. 50B for comparison. Except for the different polarity, the structure of the TFTs of FIG. 50B is the same as the case of FIG. 47B. Further, a frequency distribution of the threshold voltage of p-type multi-channel TFTs crystallized on a flat insulating film is shown in FIG. 50C. Except for the different polarity, the structure of the TFTs of FIG. 50C is the same as the case of FIG. 47C.

The standard deviation σ=218 mV in FIG. 50B, and the standard deviation σ=144 mV in FIG. 50C, while the standard deviation σ=77 mV in FIG. 50A, which is low compared to the other two. It is therefore understood that the p-type multi-channel TFTs of the present invention shown in FIG. 50A control dispersions in the threshold voltage.

Note that the channel width of the TFTs of FIG. 50B is shorter than the total channel width of the TFTs of FIG. 50A. Further, the TFTs of FIG. 50C have longer channel widths and longer spacing between channels than the TFTs of FIG. 50A. However, even when considering these conditions, the standard deviation of FIG. 50A can be considered to be remarkably smaller compared to the standard deviations of FIG. 50B and FIG. 50C, and therefore the p-channel TFTs of the present invention can be expected to have an effect that the threshold voltage is controlled.

Next, a frequency distribution of the mobility of p-type multi-channel TFTs of the present invention is shown in FIG. 51A. Except for the different polarity, the structure of the TFTs of FIG. 51A is the same as the case of FIG. 47A. Further, a frequency distribution of the mobility of p-type single channel TFTs crystallized on a flat insulating film is shown in FIG. 51B for comparison. Except for the different polarity, the structure of the TFTs of FIG. 51B is the same as the case of FIG. 47B. Further, a frequency distribution of the mobility of p-type multi-channel TFTs crystallized on a flat insulating film is shown in FIG. 51C. Except for the different polarity, the structure of the TFTs of FIG. 51C is the same as the case of FIG. 47C.

The standard deviation σ=7.6% in FIG. 51B, and the standard deviation σ=5.9% in FIG. 51C, while the standard deviation σ=4.6% in FIG. 51A, which is low compared to the other two. It is therefore understood that the p-type multi-channel TFTs of the present invention shown in FIG. 51A control dispersions in the mobility. Note that the design values for the channel width in FIG. 49A are used in calculating the mobility, and therefore the actual mobility can be considered to be lower on the order of 20%.

Note that the channel width of the TFTs of FIG. 51B is shorter than the total channel width of the TFTs of FIG. 51A. Further, the TFTs of FIG. 51C have longer channel widths and longer spacing between channels than the TFTs of FIG. 51A. However, even when considering these conditions, the standard deviation of FIG. 51A can be considered to be remarkably smaller compared to the standard deviations of FIG. 51B and FIG. 51C, and therefore the p-channel TFTs of the present invention can be expected to have an effect that the mobility is controlled.

As shown in FIGS. 47A to 51C, the multi-channel TFTs of the present invention have an effect that dispersions in TFT characteristics are suppressed. Compared to single channel TFTs and multi-channel TFTs in which crystallization is performed on a flat insulating film, the crystal orientation of each channel easily rotates with the multi-channel TFTs of the present invention, and therefore various crystal orientations are included. It can therefore be considered that dispersions in the characteristics caused by crystal orientation are easily flattened.

Distortions generated along with crystallization can be made to aggregate in regions outside an opening region by melting and crystallizing a semiconductor film so that it fills the opening region formed on an insulating surface. That is, a crystalline semiconductor film formed so as to fill the opening portion can be freed from distortions.

In other words, by forming an opening portion in a base insulating film and forming a semiconductor so that it fills the opening portion in a melting and crystallization process during crystallization of a non-single crystal semiconductor film by irradiating continuous wave laser light, distortions, crystal grain boundaries, and crystal sub-boundaries that accompany crystallization can be made to aggregate in regions other than the opening portion. It becomes possible to increase high speed current driver performance, and it becomes possible to increase element reliability, by then forming TFTs so that their channel formation regions are disposed in the crystalline semiconductor film of the opening portion.

With the present invention, the formation of grain boundaries in the TFT channel formation regions can be prevented by actively using semiconductor films located on depressions of a base film as TFT active layers, and conspicuous drops in TFT mobility, decreases in the ON current, and increases in the OFF current, all due to grain boundaries, can be prevented. Note that a designer can suitably determine just how much is to be removed by patterning adjacent to the edges of the projections and depressions.

Further, regions in which channel formation regions are overlapped with gate electrodes, sandwiching gate insulating films in between, can be widely taken by mutually separating a plurality of TFT channel formation regions, and therefore the channel width can be made larger. The ON current is secured by making the channel width larger, and heat generated by driving the TFT can be dissipated efficiently.

What is claimed is:

1. A semiconductor device comprising:
    a first insulating film formed over an insulating surface, the first insulating film having an opening portion;
    a second insulating film over the insulating surface and in the opening portion of the first insulating film;
    a crystalline semiconductor film formed over the insulating surface and in the opening portion of the first insulating film;
    a third insulating film over and in contact with the first insulating film, the second insulating film and the crystalline semiconductor film; and
    a gate electrode over the first insulating film, the second insulating film and the crystalline semiconductor film with the third insulating film therebetween wherein the gate electrode overlaps with the first insulating film, the second insulating film and the crystalline semiconductor film,
    wherein a part of the crystalline semiconductor film is located between the first and the second insulating films;
    wherein the crystalline semiconductor film comprises a first channel forming region extended to a first direction,
    wherein the gate electrode is located over the first channel forming region, and
    wherein the opening portion is extended in the first direction.

2. A semiconductor device according to claim 1,
    wherein the crystalline semiconductor film further comprises a second channel forming region extended to the first direction,
    wherein the first channel forming region is separated from the second channel forming region, and
    wherein the gate electrode is extended beyond the second channel forming region.

3. A semiconductor device according to claim 2,
wherein the second insulating film is located between the first channel forming region and the second channel forming region.

4. A semiconductor device according to claim 2,
wherein the crystalline semiconductor film further comprises a source region and a drain region, and
wherein the first channel forming region and the second channel forming region are connected to the source region and the drain region.

5. A semiconductor device according to claim 1, wherein the third insulating film is a gate insulating film.

6. A semiconductor device comprising:
a first insulating film formed over an insulating surface, the first insulating film having an opening portion;
a plurality of second insulating films over the insulating surface and in the opening portion of the first insulating film;
a crystalline semiconductor film formed over the insulating surface and in the opening portion of the first insulating film;
a third insulating film over and in contact with the first insulating film, the plurality of second insulating films and the crystalline semiconductor film; and
a gate electrode over the first insulating film, the plurality of second insulating films and the crystalline semiconductor film with the third insulating film therebetween wherein the gate electrode overlaps with the first insulating film, the plurality of second insulating films and the crystalline semiconductor film;
wherein a part of the crystalline semiconductor film is located between the first insulating film and one of the plurality of second insulating films;
wherein the crystalline semiconductor film comprises a first channel forming region extended to a first direction,
wherein the gate electrode is located over the first channel forming region, and
wherein the opening portion is extended in the first direction.

7. A semiconductor device according to claim 6,
wherein the crystalline semiconductor film further comprises a second channel forming region extended to the first direction,
wherein the first channel forming region is separated from the second channel forming region, and
wherein the gate electrode is extended beyond the second channel forming region.

8. A semiconductor device according to claim 7,
wherein the second insulating film is located between the first channel forming region and the second channel forming region.

9. A semiconductor device according to claim 7,
wherein the crystalline semiconductor film further comprises a source region and a drain region, and
wherein the first channel forming region and the second channel forming region are connected to the source region and the drain region.

10. A semiconductor device according to claim 6, wherein the third insulating film is a gate insulating film.

11. A semiconductor device comprising:
a first insulating film formed over an insulating surface, the first insulating film having an opening portion;
a plurality of second insulating films over the insulating surface and in the opening portion of the first insulating film;
a crystalline semiconductor film formed over the insulating surface and in the opening portion of the first insulating film;
a third insulating film over and in contact with the first insulating film, the plurality of second insulating films and the crystalline semiconductor film; and
a gate electrode over the first insulating film, the plurality of second insulating films and the crystalline semiconductor film with the third insulating film therebetween wherein the gate electrode overlaps with the first insulating film, the plurality of second insulating films and the crystalline semiconductor film,
wherein a part of the crystalline semiconductor film is located between the plurality of second insulating films;
wherein the crystalline semiconductor film comprises a first channel forming region extended to a first direction,
wherein the gate electrode is located over the first channel forming region, and
wherein the opening portion is extended in the first direction.

12. A semiconductor device according to claim 11,
wherein the crystalline semiconductor film further comprises a second channel forming region extended to the first direction,
wherein the first channel forming region is separated from the second channel forming region, and
wherein the gate electrode is extended beyond the second channel forming region.

13. A semiconductor device according to claim 12,
wherein one of the plurality of second insulating films is located between the first channel forming region and the second channel forming region.

14. A semiconductor device according to claim 12,
wherein the crystalline semiconductor film further comprises a source region and a drain region, and
wherein the first channel forming region and the second channel forming region are connected to the source region and the drain region.

15. A semiconductor device according to claim 11,
wherein the third insulating film is a gate insulating film.

* * * * *